US012065601B2

(12) United States Patent
Botti et al.

(10) Patent No.: US 12,065,601 B2
(45) Date of Patent: Aug. 20, 2024

(54) LIGHT-EMITTING OR LIGHT-ABSORBING COMPONENT

(71) Applicant: TECHNISCHE UNIVERSITEIT EINDHOVEN, Eindhoven (NL)

(72) Inventors: Silvana Botti, Eindhoven (NL); Friedhelm Bechstedt, Eindhoven (NL); Jozef Everardus Maria Haverkort, Eindhoven (NL); Erik Petrus Antonius Maria Bakkers, Eindhoven (NL); Elham Fadaly, Eindhoven (NL); Alain Dijkstra, Eindhoven (NL)

(73) Assignee: TECHNISCHE UNIVERSITEIT EINDHOVEN, Eindhoven (NL)

( * ) Notice: Subject to any disclaimer, the term of this patent is extended or adjusted under 35 U.S.C. 154(b) by 406 days.

(21) Appl. No.: 17/431,356

(22) PCT Filed: Feb. 18, 2020

(86) PCT No.: PCT/NL2020/050093
§ 371 (c)(1),
(2) Date: Aug. 16, 2021

(87) PCT Pub. No.: WO2020/171699
PCT Pub. Date: Aug. 27, 2020

(65) Prior Publication Data
US 2022/0135878 A1 May 5, 2022

Related U.S. Application Data

(60) Provisional application No. 62/928,194, filed on Oct. 30, 2019, provisional application No. 62/807,197, filed on Feb. 18, 2019.

(51) Int. Cl.
C09K 11/66 (2006.01)
B82Y 20/00 (2011.01)
(Continued)

(52) U.S. Cl.
CPC ............ *C09K 11/666* (2013.01); *C01B 33/06* (2013.01); *B82Y 20/00* (2013.01); *C01P 2002/76* (2013.01);
(Continued)

(58) Field of Classification Search
CPC ................. H01L 33/24; H01L 31/1812; H01L 31/035227; H01L 31/1808; H01L 33/16;
(Continued)

(56) References Cited

U.S. PATENT DOCUMENTS 6,566,688 B1 * 5/2003 Zhang .................... B82Y 20/00
257/85
10,263,136 B1 * 4/2019 Yoo ......................... C30B 29/08
(Continued)

FOREIGN PATENT DOCUMENTS

WO 2013104723 A1 7/2013
WO 2018015368 A1 1/2018

OTHER PUBLICATIONS

Bakkers, E.P.A.M. et al., "New Opportunities with Nanowires", 2016 IEEE Photonics Society Summer Topical Meeting Series (SUM), IEEE, Jul. 11, 2016, pp. 124-125.
(Continued)

*Primary Examiner* — Mouloucoulaye Inoussa
(74) *Attorney, Agent, or Firm* — Suiter Swantz IP

(57) ABSTRACT

The invention relates to a light-emitting component comprising a light-emitting section consisting of a Hex-$Si_{1-x}Ge_x$ compound material, said Hex-$Si_{1-x}Ge_x$ compound material having a direct band gap for emitting light.
The invention also pertains to a light-absorbing component comprising a light-absorbing section consisting of a Hex-$Si_{1-x}Ge_x$ compound material, said Hex-$Si_{1-x}Ge_x$ compound material having a direct band gap for absorbing light.

11 Claims, 23 Drawing Sheets

(51) Int. Cl.
*C01B 33/06* (2006.01)
*H01L 31/028* (2006.01)
*H01L 31/036* (2006.01)
*H01L 33/18* (2010.01)
*H01L 33/34* (2010.01)
*H01S 5/34* (2006.01)

(52) U.S. Cl.
CPC ........ *C01P 2004/03* (2013.01); *H01L 31/028* (2013.01); *H01L 31/036* (2013.01); *H01L 33/18* (2013.01); *H01L 33/34* (2013.01); *H01S 5/3427* (2013.01)

(58) Field of Classification Search
CPC ....... H01L 33/18; H01L 31/036; H01L 33/34; H01L 31/028; H01L 21/02598; H01L 29/161; H01L 21/02433; H01L 21/02617; H01L 21/02609; H01L 21/0242; H01L 21/02532; H01L 33/0029; H01L 33/0025; H01L 33/30; H01L 33/06; H01L 27/15; H01L 33/305; C01B 33/06; C09K 11/666; B82Y 20/00; H01S 5/3427; H01S 5/22; H01S 5/205; H01S 5/2036; H01S 5/0655; H01S 5/3095; H01S 5/347; H01S 5/0658; H01S 5/34313; H01S 5/3402; H01S 5/0657; H01S 5/06216; H01S 2301/18; H01S 2301/166; C30B 23/08; C30B 23/063; C30B 29/52; C30B 29/08; C30B 29/20; C30B 29/06; G01S 7/4815; G01S 7/484; H04N 5/33; C01P 2002/76; C01P 2004/03

USPC ........... 257/90, 43, 627, 19, 21.121, 21.129, 257/31.06, 616, 29.07, 21.12, 21.127, 257/33.008, 21.125; 438/35, 104, 481
See application file for complete search history.

(56) References Cited

U.S. PATENT DOCUMENTS

| | | | |
|---|---|---|---|
| 2007/0126014 A1* | 6/2007 | Liao | H01L 33/34 257/E33.044 |
| 2012/0279394 A1* | 11/2012 | Menzel | C10L 3/102 95/186 |
| 2014/0264459 A1* | 9/2014 | Choi | H01L 21/02433 257/201 |
| 2016/0284929 A1* | 9/2016 | Bender | H01L 33/0054 |
| 2020/0152689 A1* | 5/2020 | Schwarzenbach | H01L 21/02532 |
| 2021/0005779 A1* | 1/2021 | Efros | H01L 33/06 |

OTHER PUBLICATIONS

Hauge, Hakon Ikaros T. et al., "Hexagon Silicon Realized", Nano Letters, vol. 15, No. 9, Aug. 7, 2015, pp. 5855-5860.
International Search Report mailed May 4, 2020 for PCT/NL2020/050093.
Luo, S. et al., "Size-dependent optical absorption modulation of Si/Ge and Ge/Si core/shell nanowires with different cross-sectional geometries", Nanotechnology, Institute of Physics Publishing, GB, vol. 26, No. 8, Feb. 3, 2015, p. 85702.

* cited by examiner

LIGHT-EMITTING OR LIGHT-ABSORBING COMPONENT

FIELD OF THE INVENTION

This invention relates to devices or optoelectronic components to achieve efficient light emission from group IV materials.

In particular the invention pertains to a light-emitting or light-absorbing component comprising a light-emitting or light-absorbing section of hexagonal Ge and SiGe alloys.

BACKGROUND OF THE INVENTION

Achieving efficient light emission from group-IV materials has been a holy grail in silicon technology for decades and, despite tremendous efforts, it has remained elusive. Silicon is the workhorse of the semiconductor industry because it has many advantageous properties. Unfortunately, due to the indirect band gap, Si is not able to emit light efficiently. It is been predicted back in 1973 that hexagonal Ge has a direct band gap and can thus emit light. Hexagonal Ge however is to be believed to have a small matrix element, and will thus not emit light efficiently.

It is thus an object of the invention to provide a method for manufacturing optoelectronic applications and/or optoelectronic products comprising an light emitting body or component based on Si and Ge.

SUMMARY OF THE INVENTION

According to an aspect of the invention, a light-emitting component is proposed, the component comprising a light-emitting section including a Hex-Si$_{1-x}$Ge$_x$ compound material, said Hex-Si$_{1-x}$Ge$_x$ compound material having a direct band gap for emitting light.

In particular, the Hex-Si$_{1-x}$Ge$_x$ compound material is structured to emit light with a B-coefficient for radiative emission of $0.7 \times 10^{-10}$ cm$^3$/s$<$B$_{rad}<$11$\times 10^{-10}$ cm$^3$/s at 300K, and more in particular with a B-coefficient for radiative emission of $0.7 \times 10^{-10}$ cm$^3$/s$<$B$_{rad}<$8.3$\times 10^{-10}$ cm$^3$/s at 300 K.

In an advantageous example, the Hex-Si$_{1-x}$Ge$_x$ compound material is structured to emit light between 1.8 μm for x=0.65 and 3.5 μm for x=1.0.

The light-emitting component according to any one of the preceding claims, wherein the Hex-Si$_{1-x}$Ge$_x$ compound material comprises strained quantum well structures of a different composition of the hexagonal Hex-Si$_{1-x}$Ge$_x$ compound material structured to emit light between 1.5 μm and 7.0 μm.

In yet another example of the invention, the Hex-Si$_{1-x}$Ge$_x$ compound material exhibits direct band gap emission with a sub-nanosecond recombination lifetime.

In another example, the Hex-Si$_{1-x}$Ge$_x$ compound material exhibits a linear dependence of the photoluminescence intensity versus the excitation power.

According to another aspect of the invention, a light-absorbing component is proposed, the light-absorbing component comprising a light-absorbing section including a Hex-Si$_{1-x}$Ge$_x$ compound material having a direct band gap for absorbing light.

Preferred embodiment of the light-emitting or light-absorbing component according to the invention exhibits an x of the Hex-Si$_{1-x}$Ge$_x$ compound material being defined with 0.2$<$x$<$1.0, or with 0.6$<$x$<$1.0, or with 0.2$<$x$<$0.99, or with 0.2$<$x$<$0.9, or with 0.6$<$x$<$0.9, or with 0.6$<$x$<$0.99.

In yet another advantageous embodiment, a light-emitting or light-absorbing component according to the invention is defined as comprising a monolithic structure including a Cub-Si substrate provided with the Hex-Si$_{1-x}$Ge$_x$ compound material as the light-emitting or light-absorbing section.

According to the invention different types of light-emitting components are obtained exhibiting an efficient light emission from direct band gap hexagonal Ge and SiGe alloys. Hexagonal SiGe embodies an ideal material system to fully unite electronic and optoelectronic functionalities on a single chip, opening the way towards novel device concepts and information processing technologies.

In particular, the Hex-Si$_{1-x}$Ge$_x$ compound material of the light-emitting or light-absorbing section can be either a quantum dot, a quantum well or a bulk semiconductor light emitting/absorbing body or section.

Additionally, the invention relates to a method for manufacturing a light-emitting component comprising the steps of: providing a substrate composed of a Group III-V compound semiconductor; depositing a Group 11 element catalyst on the substrate in the form of one or more nano-disk seeds; growing one or more Group III-V compound semiconductor nanowires; removing the one or more Group 11 element catalyst seeds; and growing a Si$_x$Ge$_{1-x}$ shell epitaxially over the one or more Group III-V compound semiconductor nanowires.

In particular the step of growing one or more Group III-V compound semiconductor nanowires is performed using a Group 11 element catalyst assisted chemical vapor deposition process In particular, the step of depositing step comprises the steps of annealing the Group 11 element catalyst seeds at a temperature higher than the eutectic temperature forming an alloy between the catalyst seed and the substrate, and forming an alloy between the catalyst seed and the substrate.

More in particular the growing step comprises the step of introducing trimethylgallium (TMGa) and Arsine (AsH$_3$) as material precursors, and more in particular at a set temperature of 650° C. and at molar fractions of $\chi_{TMGa}$=1.9$\times 10^{-5}$ mol, $\chi_{AsH_3}$=4.55$\times 10^{-5}$ mol.

Additionally, the step of growing a Si$_x$Ge$_{1-x}$ shell epitaxially over the one or more Group III-V compound semiconductor nanowires comprises the step of introducing gas precursors GeH$_4$ and Si$_2$H$_6$ at a temperature of 550-750° C., more in particular at a temperature of 600-700° C.

Next, the Group 11 element catalyst assisted chemical vapor deposition process is a metalorganic vapor-phase epitaxy, MOVPE, process.

Additionally, in the method according to the invention x of the Si$_x$Ge$_{1-x}$ shell is defined with 0.2$<$x$<$1.0, or with 0.6$<$x$<$1.0, or with 0.2$<$x$<$0.99, or with 0.2$<$x$<$0.9, or with 0.6$<$x$<$0.9, or with 0.6$<$x$<$0.99.

BRIEF DESCRIPTION OF THE DRAWINGS

Notwithstanding any other forms which may fall within the scope of the methods and devices as set forth in the Summary, specific embodiments of the methods and devices will now be described, by way of example, and with reference to the accompanying drawings in which.

DETAILED DESCRIPTION OF THE DRAWINGS

Fluidly merging the fields of integrated electronics and photonics using a single materials family and CMOS compatible process flow is the major goal of distributed information technologies. Silicon (Si) crystallized in the usual cubic (diamond) structure has dominated the electronics industry for more than half a century. However, cubic silicon (Cub-Si), germanium (Cub-Ge) and $Si_{1-x}Ge_x$-alloys are all indirect band gap semiconductors that cannot emit light efficiently.

Figure 1:
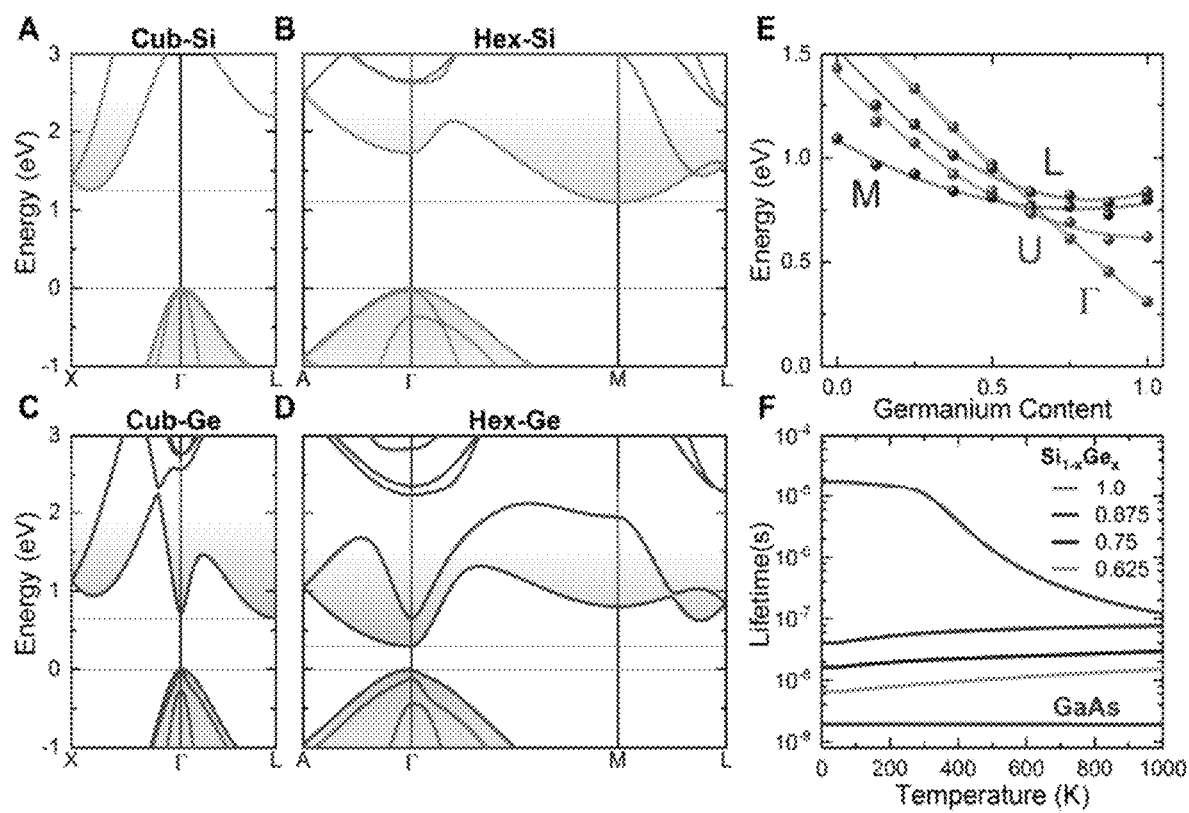
FIG. 1 depicts the calculated band structure of hexagonal Si$_{1-x}$Ge$_x$.

FIG. 1 depicts the calculated band structure of hexagonal $Si_{1-x}Ge_x$: In particular FIGS. 1A-1B-1C-1D show DFT calculations of the band structure of Cub- and Hex-Si and Ge. FIG. 1E depicts the energy of emission band minima fitted with a parabolic fit as a function of the Ge content in the Hex-$Si_{1-x}Ge_x$ alloy. FIG. 1F depicts the radiative lifetime of different Hex-$Si_{1-x}Ge_x$ compositions, with $10^{19}/cm^3$ n-doping, as compared to the radiative lifetime of cubic GaAs.

The band structure of Cub-Si, presented in FIG. 1A is very well known, having the lowest conduction band (CB) minimum close to the X-point and a second lowest minimum at the L-point. As such, it is the archetypal example of an indirect band gap semiconductor, that, notwithstanding many great efforts, cannot be used for efficient light emission. By modifying the crystal structure from cubic to hexagonal, the symmetry along the <111> crystal direction changes fundamentally, with the consequence that the L-point bands are folded back onto the Γ-point.

As shown in FIG. 1B, for hexagonal Si (Hex-Si) this results in a local conduction band minimum at the Γ-point, with an energy close to 1.7 eV. Clearly, Hex-Si remains indirect since the lowest energy conduction band minimum is at the M-point, close to 1.1 eV. Cub-Ge also has an indirect band gap but, unlike Si, the lowest conduction band minimum is situated at the L-point, as shown in FIG. 1C. As a consequence, for Hex-Ge the band folding effect results in a direct band gap at the Γ-point with a magnitude close to 0.3 eV, as shown in the calculated band structure in FIG. 1D.

To investigate how the direct band gap energy can be tuned by alloying Ge with Si, the band structures of Hex-$Si_{1-x}Ge_x$ (for 0<x<1) were calculated using ab initio density functional theory (DFT) and a cluster expansion method for isostructural hexagonal binary alloys, using so-called ab-initio calculations detailed in the paragraph below. Selected results, presented in FIG. 1E, show the composition-dependent size of the emission band gap for random Hex-$Si_{1-x}Ge_x$ alloys at high symmetry points in the Brillouin zone. Clearly, a direct band gap is predicted at the Γ-point for x>0.65 (the curve denoted with M) with a magnitude that is tunable across the energy range 0.3-0.7 eV. This spectral interval is of technological interest for many potential applications including optical interconnects in computing, silicon quantum photonic circuits and optical sensing, among others.

As to the ab-initio calculations it should be noted that according to the invention all calculations were performed using density functional theory (DFT) as implemented in the Vienna Ab Initio Simulation Package (VASP) A with the projector augmented wave method. A plane-wave cutoff of 500 eV was used and Ge 3d electrons were included as valence electrons. Brillouin zone integrations were carried out using 12×12×6 Γ-centered k-point grids for lonsdaleite Ge and 12×6×6 Γ-centered k-point grids for Si-Ge, ensuring a convergence of total energies to 1 meV/atom. For structural calculations, the PBEsol exchange-correlation potential was used, together with a convergence threshold of 1 meV/Å on Hellmann-Feynman forces. The modified Becke-Johnson exchange potential in combination with local density approximation (MBJLDA) was preferred for electronic structures and optical properties, as it guarantees band gaps in excellent agreement with experiments available in the prior art. Spin-orbit coupling were included in all calculations.

Alloys are studied using a cluster expansion method for isostructural lonsdaleite binary alloys. For the cluster expansion, the macroscopic alloy is divided into clusters of 8 atoms obtained from the primitive wurtzite (WZ) unit cell. In this way, it is possible to study 46 different structures ranging from pure Ge to pure Si. This method becomes more accurate with increasing size of the clusters, and it was verified that the thermodynamic averages are not significantly modified by performing calculations with 16 atom clusters. The radiative lifetime ($\tau_{rail}$) at temperature (T) is calculated using the formula:

$$1/\tau_{rad} = \sum_{cvk} A_{cvk} w_k f_{ck}(1 - f_{vk}) \quad (A1)$$

where $A_{cvk}$ denotes the radiative recombination rate for vertical optical transitions between a conduction state |ck⟩ and a valence state |vk⟩, with one-particle energies $\varepsilon_{ck}$ and $\varepsilon_{vk}$, and Fermi occupation functions $f_{ck}$ and $f_{vk}$ and $w_k$ the k-point weight. In order to reproduce experimental conditions, n=10$^{19}$ cm$^{-3}$ charge carriers due to n-doping in the conduction band were included, and modified accordingly the chemical potential of electrons. The radiative recombination rate is given by:

$$A_{cvk} = n_{eff} \frac{e^2(\varepsilon_{ck} - \varepsilon_{vk})}{\pi\varepsilon_0 \hbar^2 m^2 c^3} \frac{1}{3} \sum_{j=x,y,z} |\langle ck|p_j|vk\rangle|^2 \quad (A2)$$

where $n_{eff}$ is the refractive index of the effective medium (here set approximately to the experimental value for cubic Ge for which $n_{eff}$=5). The squares of the momentum matrix elements can be either averaged over all directions corresponding to the emission of unpolarized light, as in Eq. (A2), or only the in-plane component is considered, for light polarized perpendicularly to the wire axis. Denser k-point grids were necessary to calculate lifetimes (72×72×36 for lonsdaleite Ge and 24×12×12 for Si-Ge).

FIG. 1F shows the calculated radiative lifetime of 10$^{19}$/cm$^3$ n-doped Hex-Si$_{1-x}$Ge$_x$ alloys for a polarization perpendicular to the c-axis, for different compositions.

Remarkably, the radiative lifetimes of Hex-Si$_{1-x}$Ge$_x$ alloys are significantly lower than that of pure Hex-Ge, for which the lowest energy transition is dipole forbidden at the Γ-point. This observation can be traced to the reduced symmetry in the random Hex-Si$_{1-x}$Ge$_x$ alloys, which leads to mixing of Ge s-states into the lowest conduction band wave function.

It has been found, that the calculated lifetimes of the Hex-Si$_{1-x}$Ge$_x$ alloys are approaching those of III-V semiconductors, such as GaAs.

As to a comparison with group III-V semiconductors, the measured lifetime of
Hex-Si$_{0.2}$Ge$_{0.8}$ at low temperature is very comparable to the recombination lifetimes reported in prior art literature for III-V compound semiconductors, which are generally of the order of 1 ns. Prior art literature reported a temperature independent lifetime of 1 ns in core/shell GaAs/AlGaAs nanowires, very similar to the yet unpassivated Hex-Si$_{0.2}$Ge$_{0.8}$ nanowire shells according to the invention. The comparison of the quenching ratio of the integrated photoluminescence intensity when increasing the temperature from 4 K to 300 K, compares quite favorable for Hex-SiGe where this ratio varies between a factors of 15-100 as shown in FIG. 3C. Prior art literature found a photoluminescence quenching ratio of the order of 10$^5$ for InGaP. Prior art literature observed a quenching ratio around 200 for GaAsSbN/GaAs quantum wells. Prior art literature also observed quenching rations above between 100 for undoped GaN up to 1000 for Mg-doped GaN.

Examples according to the invention relate to Ge-rich alloys of Hex-Si$_{1-x}$Ge$_x$ as they combine a direct band gap, strong optical transitions and wavelength tunability. Here, it is demonstrated experimentally that Ge-rich alloys of Hex-Si$_{1-x}$Ge$_x$ are indeed direct gap semiconductors, observe strong emission, and a temperature independent nanosecond radiative lifetime. The results are shown to be in remarkable quantitative agreement with theoretical predictions.

Figure 2:
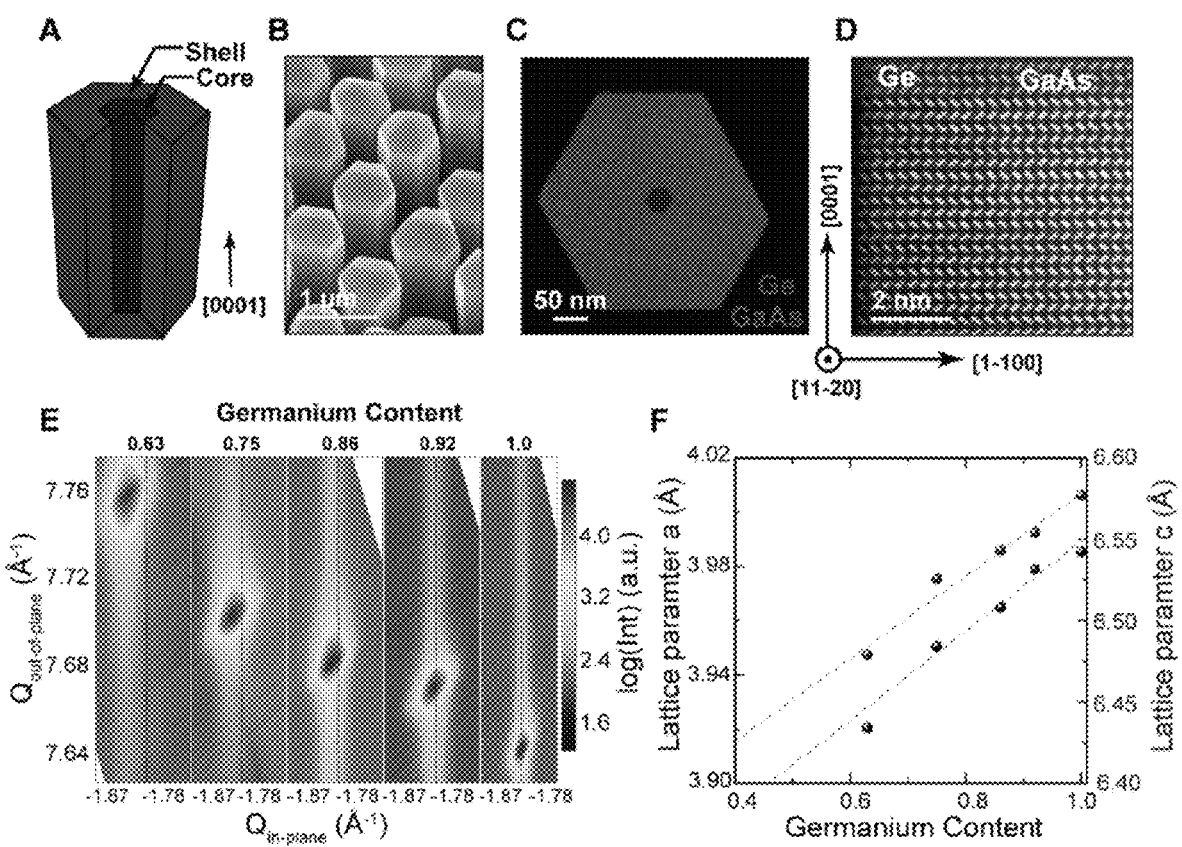
FIG. 2 depicts an overview of the Hex-Si$_{1-x}$Ge$_x$ material system.

In FIG. 2 an overview of the Hex-Si$_{1-x}$Ge$_x$ material system is shown. In particular, FIG. 2A shows schematic illustration of the hexagonal GaAs/Ge core/shell nanowires. FIG. 2B depicts a tilted view scanning electron micrograph of an array of epitaxial GaAs/Ge nanowires grown on a GaAs (111)$_B$ substrate in the [0001] crystallographic direction. FIG. 2C shows HAADF-STEM and EDX overlapped images of a cross sectional lamella of a representative GaAs/Ge core/shell nanowire, whereas FIG. 2D depicts an aberration-corrected HAADF-STEM image of the interface of GaAs/Ge structure obtained in the [11$\bar{2}$0] zone axis, displaying the ABAB stacking along [0001] of the hexagonal crystal structure. FIG. 2E shows reciprocal space maps around the hexagonal ($\bar{1}$018) nanowire reflections shown for five different Ge-concentrations. FIG. 2F depicts a plot of the Hex-Si$_{1-x}$Ge$_x$ in-plane lattice parameter (a) and out-of-plane lattice parameters (c) as a function of the Ge-content, wherein the error is smaller than the data symbols (lower series of dots and upper series of dots) used in the plot in accordance with Table S1 below:

TABLE S1

Extracted Lattice Parameters of the Hex-Si$_{1-x}$Ge$_x$ samples: Wurtzite lattice parameters of all measured Hex-Si$_{1-x}$Ge$_x$ samples with corresponding error-values extracted from XRD measurements.

| Ge-Content | Lattice parameter (a) (Å) | Lattice parameter (c) (Å) |
|---|---|---|
| 1.0 | 3.9855 ± 0.0003 | 6.5772 ± 0.0003 |
| 0.92 | 3.9789 ± 0.0001 | 6.5542 ± 0.0001 |
| 0.86 | 3.9649 ± 0.0005 | 6.5431 ± 0.0004 |
| 0.75 | 3.9505 ± 0.0008 | 6.5257 ± 0.0001 |
| 0.63 | 3.9206 ± 0.0000 | 6.4790 ± 0.0005 |

In an example of the method according the invention Ge-rich Si$_{1-x}$Ge$_x$ alloys are grown around a thin (~35 nm diameter) WZ gallium arsenide (GaAs) core that is lattice matched to Ge as shown in FIG. 2A. A thin GaAs core is used to further reduce lattice strain and strain induced defects. The Au catalytic particles used to grow the WZ GaAs nanowire template have been removed by wet chemical etching and thick (200-400 nm) Ge shells have been grown epitaxially on the WZ-GaAs as outlined in relation with the detailed description of FIG. 6. The overview scanning electron microscopy (SEM) image presented in FIG. 2B demonstrates that arrays of Hex-GaAs/Ge-core/shell nanowires are formed on the growth substrate. These nanowires are uniform in length and diameter and have smooth, well-defined {1100} side facets indicative of a single crystalline nature.

FIG. 2C shows a cross-sectional Electron Dispersive X-ray (EDX) spectroscopy map confirming the expected core/shell geometry. The high-resolution High Angular Annular Dark Field (HAADF) Transmission Electron Microscopy (TEM) image presented in FIG. 2D confirms the high-quality epitaxial growth of the Ge shell on the GaAs core and reveals an ABAB stacking along the [0001] crystal direction; the hallmark of a hexagonal crystal structure. These observations unequivocally confirm the single crystal nature of the nanowires and their hexagonal crystal structure. The crystal quality and lattice parameters of a range of samples with GaAs/Si$_{1-x}$Ge$_x$ (with x>0.5) core/shell wires were studied by X-ray diffraction (XRD) measurements using synchrotron radiation.

For all measured samples at least three individual hexagonal reflections have been measured. For the pure Hex-Ge sample, the azimuth was varied to enhance the fidelity of the extracted lattice parameters. In addition, a cubic GaAs substrate reflection has always been used as an anchor in reciprocal space to correct for any possible alignment offsets. From the measured symmetric reflections, as shown in the full series in FIG. 10, one could calculate and correct for the tilt of the lattice-planes ([111], [0001]) with respect to the samples surface. Furthermore, the $Q_{out-of-plane}$ position of the WZ (0008) reflection allows to calculate the c-lattice parameter, corresponding to the [0001]-crystal direction. For some Ge-concentration the (0008) nanowire reflection coincides with the cubic (444) substrate refection (see FIG. 10) which makes a systematic evaluation of the symmetric RSMs complicated, hence also asymmetric space maps, around reflections that are only allowed in the hexagonal crystal-lattice have been measured. The position of the asymmetric reflections in reciprocal space allows to extract the in—as well as the out-of-plane lattice parameters (a, c). In FIG. 2 a series of Hex-($\bar{1}$018) reflections for all measured Ge-concentrations is shown, the peak-position sensitively depends notably on the amount of Ge present in the alloy, lower Ge-concentrations result in lower lattice parameters (a and c), which are closer to the native lattice parameters of Hex-Si. For all shown RSMs the $Q_{out-of-plane}$ direction corresponds to the crystalline [0001] direction, and the $Q_{in-plane}$ direction corresponds to the [$\bar{1}$010] direction, both in the hexagonal system, indicated by the four Miller-Bravais indices.

To accurately determine the peak positions, all RSMs were corrected according to the peak positions of the cubic GaAs-substrate reflections to eliminate any angular alignment offsets. Then a 2D-Gauss fit was performed on the data-sets in q-space before gridding, to reduce the influence of possible artefacts coming from the gridding-routine. For plotting the dataset, the irregularly spaced q-coordinates, as measured and transformed from the angular-space, have been gridded into a regularly spaced q-coordinate system.

The combined results from the XRD measurements can be found in table S1 where the measured lattice parameters are given for each measured Ge-concentration. For all samples the influence of the WZ-GaAs core material on the Si$_{1-x}$Ge$_x$ lattice parameter can be neglected because of the fact that a relatively thin GaAs core (around 35 nm) is surrounded by a thick (several 100 nm) Si$_{1-x}$Ge$_x$ shell. Hence, the crystalline properties of the Hex-Si$_{1-x}$Ge$_x$ shell dominate the whole structure. Furthermore, Hex-Ge and WZ-GaAs are nearly lattice matched (see lattice parameter of WZ-GaAs which implies that basically no strain in the shell is expected for the samples with high Ge-concentrations (>60%) as also confirmed by FEM-simulation. This is an important aspect since it confirms the high fidelity of the found lattice parameters, especially for the lattice parameter of pure Hex-Ge. The errors given in table S1 consider the accuracy of defining the peak position with a 2D-fit as described, as well as the scattering of the individual lattice parameter values extracted from the evaluation of multiple peaks. The instrumental resolution can be neglected for the error estimation, since the contribution to the given errors will be much smaller than the total error-values.

The XRD measurements have been carried out at the Deutsches-Elektronen-Synchrotron (DESY) in Hamburg, at the high-resolution-diffraction beamline P08. For the diffraction experiments a high precision 6-circle diffractometer has been used, the photon energy was set to 15 keV with a corresponding wavelength of 0.8266 Å. The energy was carefully chosen to ensure a high photon flux while still being able to access higher-indexed reflections, needed for the precise measurements of the lattice parameters. The x-ray beam has been shaped by a slit system and the resulting spot-size on the sample was 200 μm (horizontal)× 100 μm (vertical), a size sufficient to illuminate a few thousands of wires at once. For measuring the scattered signal coming from the wires, a Dectris—"Mython" 1D X-ray detector has been used; this detector offers a high dynamic range and, due to the small pixel size (50 μm), an increased angular resolution in 2θ, compared to most 2D detectors. For the conversion of the measured angular coordinates to reciprocal space coordinates and all further data processing, such as 2D-peak-fitting and post-processing for plotting, the freely available software library "Xrayutilities" in combination with Python 3.6 has been used.

FIG. 2E shows a set of asymmetrical reciprocal space maps (RSMs) for samples with Si$_{1-x}$Ge$_x$ shells with nominal Si compositions x=1, 0.92, 0.86, 0.75 and x=0.63, respectively. The RSMs show the shift of the ($\bar{1}$018) reflection that is exclusively allowed in the hexagonal crystal phase, as a function of the Ge-concentration. The higher the Ge-concentration, the more the hexagonal reflection shifts to lower $Q_{out-of-plane}$ and $Q_{in-plane}$ values, indicating an increase in the out-of-plane lattice parameter (c) and the in-plane lattice parameter (a). From the narrow peak-width along $Q_{out-of-plane}$, it can be concluded that the overall crystal quality is very high, with an estimated stacking-fault (SF) density of 2-4 SFs/μm along the crystalline [0001] direction.

Figure 7:
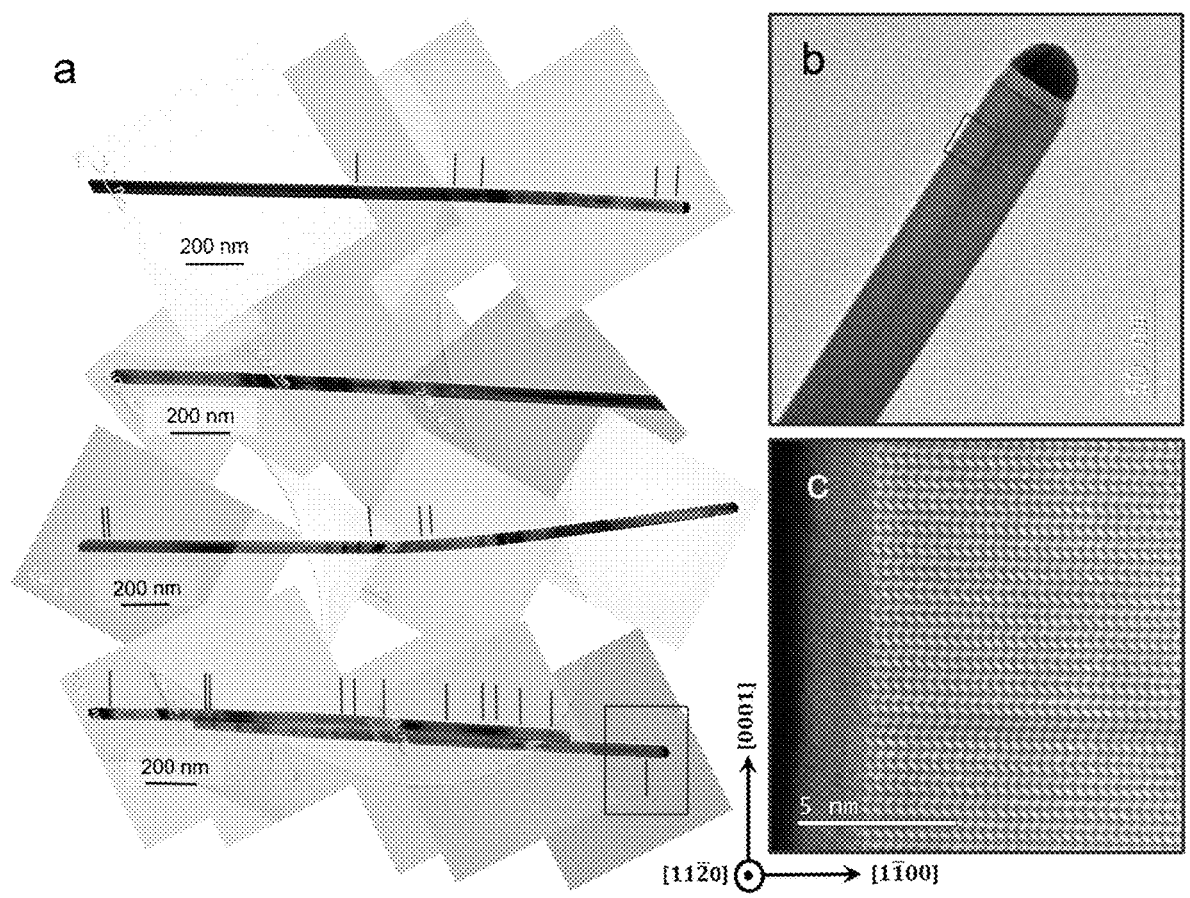
FIG. 7 depicts the crystal quality of the WZ GaAs nanowire cores.
Figure 10:
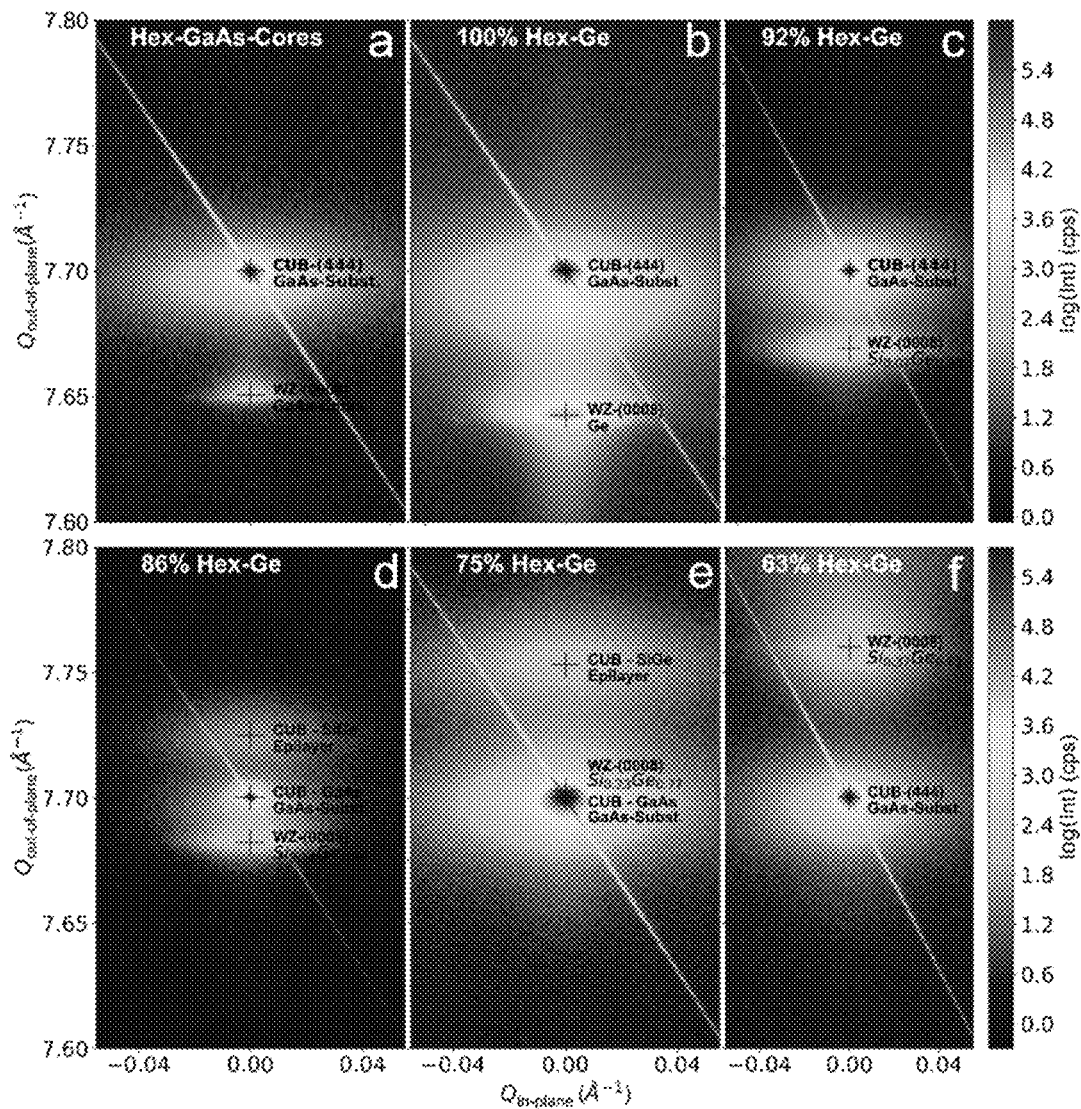
FIG. 10 depicts full series of symmetric (0008) reflections of Hex-$Si_{1-x}Ge_x$.

These results are in good agreement with the TEM measurements performed for the same samples, as shown FIG. 7. The a- and c-lattice parameters are determined from a set of symmetric and asymmetric RSMs as a function of the Ge composition, as depicted in FIG. 10 and table S1. The results of these experiments are presented in FIG. 2F. Data points with x>0.7 lie on the linear interpolation line between Hex-Si and Ge (following Vegard's rule) indicating that the lattice strain in the Si$_{1-x}$Ge$_x$ shell is negligible.

The structural quality of the crystals was investigated by transmission electron microscopy (TEM). Two different sample preparation methods were used. In the standard axial analysis, nanowires were mechanically transferred to a holey carbon TEM grid. Concerning the cross-section TEM studies, nanowires were prepared using a Focused Ion Beam (FIB). In both cases, high resolution TEM and Scanning TEM analyses were conducted using a JEM ARM200F probe-corrected TEM operated at 200 kV. For the chemical analysis, Electron Dispersive Xray (EDX) spectroscopy measurements were carried out using the same microscope equipped with a 100 mm$^2$ EDX silicon drift detector. TEM lamellae were prepared in a FEI Nova Nanolab 600i Dual beam system. For this, the nanowires were initially transferred with the aid of a Kleindiek nano-manipulator from the growth substrate to a piece of Si and then arranged to lie parallel to each other. These nanowires were covered with electron- and ion-beam induced metal deposition to protect them during the procedure. The lamella was cut out by milling with 30 kV Ga ions and thinned down with subsequent steps of 30, 16, and 5 kV ion milling in order to minimize the Ga-induced damage in the regions imaged with TEM.

By exploring the optical properties of the Hex-$Si_{1-x}Ge_x$ nanowires probed using power and temperature dependent photoluminescence spectroscopy, shown in FIGS. 3A and 3B, shown further beneficial examples according to the invention. In a first advantageous embodiment pure Hex-Ge is used as the binary endpoint of the Hex-$Si_{1-x}Ge_x$ alloy and $Si_{0.20}Ge_{0.80}$ being representative of the binary alloy in the middle of the compositional range for which a direct band gap is expected.

Figure 3:
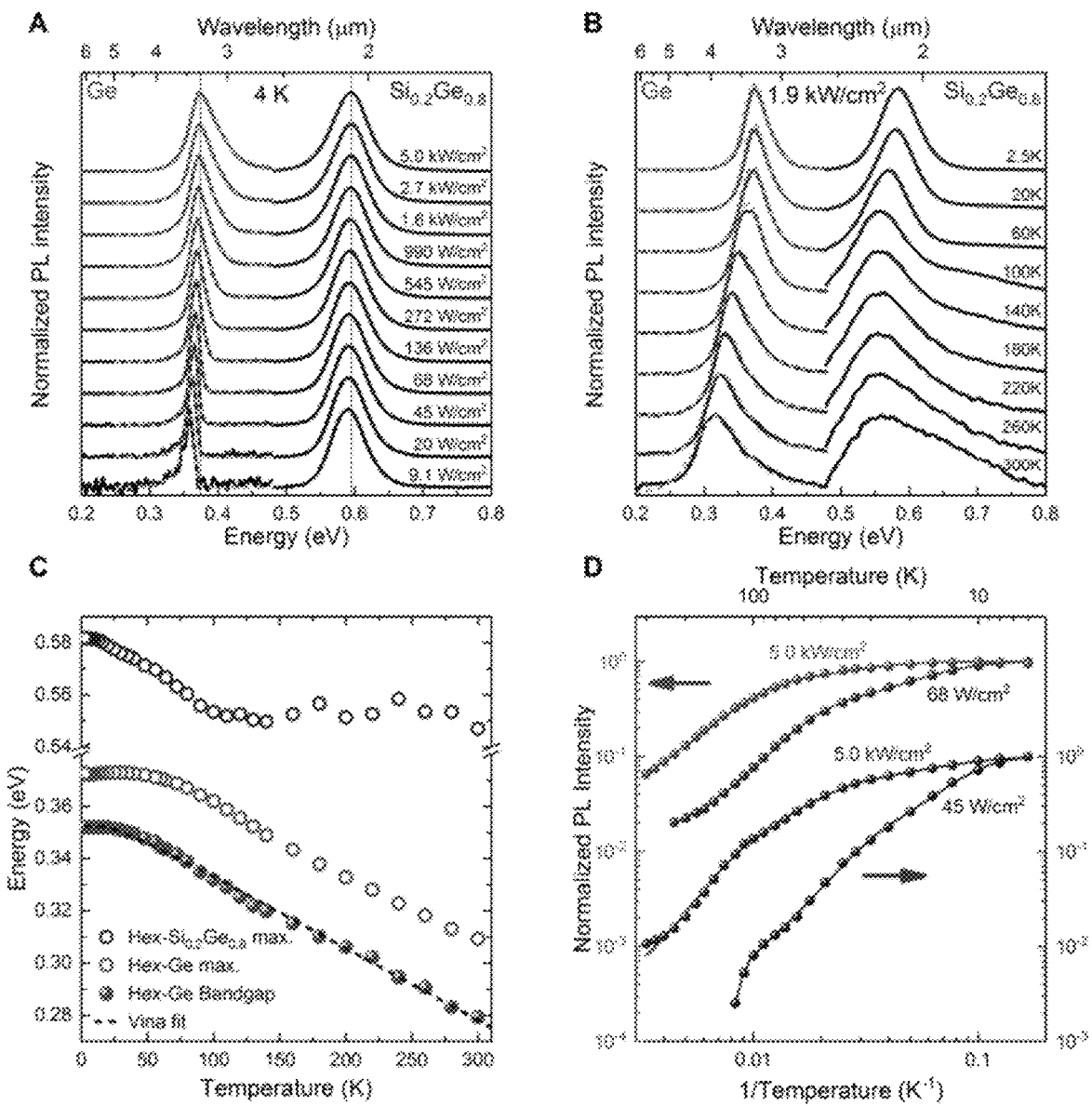
FIG. 3 depicts the emission from Hex-Ge and Hex-Si$_{0.2}$Ge$_{0.8}$.

FIG. 3 depicts the emission from Hex-Ge and Hex-$Si_{0.2}Ge_{0.8}$: FIG. 3A shows the excitation density dependent photoluminescence (PL) spectra of Hex-Ge (the left peak from 5.0 kW/$cm^2$ to 9.1 kW/$cm^2$) and Hex-$Si_{0.2}Ge_{0.8}$ (the right peak from 5.0 kW/$cm^2$ to 9.1 kW/$cm^2$) as-grown samples, measured at 4 K. All spectra are normalized to their own maximum. The Lasher-Stern-Würfel (LSVV) model fits of the Ge spectra are included as dashed lines. Vertical dotted black lines highlight the shift and broadening of the peaks, indicating BtB emission. FIG. 3B shows the temperature dependence of the PL spectra, normalized to their own maximum, measured at an excitation density of 1.9 kW/$cm^2$. A clear redshift and broadening are observed with increasing temperature for the both left and right peaks, both indicating BtB recombination. The fits with the Lasher-Stern-Würfel (LSVV) model are shown as dashed lines. The open circles show the maxima of the PL as plotted in (B) while the closed circles represent the band gap determined by fits using the LSW model As to the fitting using the Lasher-Stern-Würfel (LSVV) model, the observed photoluminescence spectra of Hex-Ge and Hex-SiGe all consist out of a single peak. The observation of a single photoluminescence peak is attributed to a band-to-band (BtB) recombination. The absence of excitonic effects at low temperatures is due to an As-doping level of $9.10^{18}$ $cm^{-3}$ as deduced by Atom Probe Tomography shown in FIG. 9. At this doping level, individual As-dopants, which are expected to be shallow in a small band gap semiconductor, will merge into a doping band which at its turn is expected to merge with the conduction band. GaAs nanowires with a similar doping level also show single peak photoluminescence spectra which are very similar to the findings in Hex-SiGe.

To accurately establish whether the observed photoluminescence is due to BtB recombination, the experimental spectra were fitted with the Lasher-Stern-Würfel (LSVV) model. This model, that predicts the shape of a photoluminescence peak, is derived from the Planck-Einstein radiation law and is given by:

$$I_{PL} = \frac{2\pi}{h^3 c^2} \cdot \frac{E^2 a(E)}{\exp\left(\frac{E - \Delta\mu}{kT}\right) - 1} \quad (A3)$$

In this equation $\Delta\mu$ is the splitting of the quasi-fermi levels and a(E) is the absorptivity. In modelling the absorptivity, parabolic bands have been assumed. Corrections for an Urbach tail and an excitation dependent Burstein-Moss shift have been made in analogy in the prior art. Both the temperature dependent and the excitation power dependent photoluminescence measurements were fitted as shown in FIG. 3A.

The high quality fits by the LSW model unambiguously show that the observed photoluminescence is exclusively due to BtB recombination. It is of paramount importance for the analysis that measured recombination lifetimes are due to BtB recombination and not due to e.g. an impurity or defect related optical transition. According to an advantageous effect according to the invention, it is noted that the deduced carrier temperature exceeds 700 K at the highest excitation densities.

FIG. 3C depicts the shrinkage of the band gap with temperature, fitted using the Vina equation as outlined below.

As to the temperature dependence of the fundamental band gap, although the temperature dependence of the fundamental band gap is most often described by the Varshni equation, the Vina equation provides a more accurate description for elevated temperatures $$E_g = a - b\left(1 + \frac{2}{\exp\left(\frac{\theta}{T}\right) - 1}\right), \quad (A4)$$

in which a is a constant, b represents the strength of the electron-phonon interaction, and θ is the Debye temperature of the material. For the band gap of Hex-Ge the Vina equation is fitted in FIG. 3C where the following values are found; a=0.36 eV, b=9.2 meV and a Debye temperature of θ=66 K.

The shrinkage of the $Si_{0.20}Ge_{0.80}$ band gap, which is displayed in FIG. 3C follows a different behavior due to compositional fluctuations of the crystal. The initial fast shift of the apparent band gap is probably due to the carrier thermalization towards compositional pockets with lower band gap while the apparent deviation from the Vina law at high temperature is most probably due to the fact that the spectrum should be interpreted as a convolution of the Fermi-Dirac distribution with a Gaussian broadening function due to the compositional fluctuations, the details of which are beyond the scope of the present paper.

FIG. 3A presents power dependent photoluminescence spectra recorded at a temperature of 4 K. The spectrum obtained from the Hex-Ge sample exhibits a narrow emission peak at the lowest excitation levels investigated. As the excitation density is increased, the emission peak broadens towards high energies and the peak blue-shifts by 19 meV. To understand the recombination mechanism, both the excitation and temperature dependent data have been fitted with the Lasher-Stern-Würfel (LSVV) model which describes band-to-band (BtB) recombination in a semiconductor. Model fits are included in FIGS. 3A and 3B, and confirm that the observed spectra of Hex-Ge can be explained by a BtB recombination process. From the fits, it can be concluded that the high energy broadening is due to an increase in the electron temperature and the observed blue-shift is due to the Burstein-Moss effect. In comparison to the pure Hex-Ge sample, the linewidth of the Hex-$Si_{0.20}Ge_{0.80}$ sample is larger due to alloy broadening (60 meV compared to 14 meV for Hex-Ge, at lowest excitation density) and can therefore not be fitted by the LSW model. Only a slight excitation-induced blue shift of 6 meV was observed for the $Si_{0.20}Ge_{0.80}$ sample.

FIG. 3B shows temperature dependent photoluminescence spectra recorded from the Hex-Ge and -$Si_{0.20}Ge_{0.80}$ sample. Clear asymmetric broadening is observed at high temperatures, which, from the LSW model fits, can be assigned to broadening of the Fermi-Dirac distribution tail, supporting the identification that the observed emission peak is due to a BtB recombination process. The band gap of Hex-Ge shifts from 3.5 µm (0.353 eV) at low temperature towards 4.4 µm (0.28 eV) at room temperature, confirming the expected band gap shrinkage for a BtB transition as depicted in FIG. 3C. The shrinkage of the $Si_{0.20}Ge_{0.80}$ band gap as well as a detailed fit to the data of Hex-Ge, which yield a Debye temperature of 66K, is discussed above as to the temperature dependence of the fundamental band gap.

FIG. 3D shows the temperature dependence of the integrated emission intensity of the samples on an Arrhenius representation of the PL intensity as function of inverse temperature for Hex-Ge (light dotted upper two lines) and Hex-$Si_{0.2}Ge_{0.8}$ (dark dotted lower two lines). All intensities are normalized to their respective intensity at 4 K. The reduced temperature dependence at higher excitation densities shows the approach towards the radiative limit. A decrease (factor 15-100) of the integrated emission intensity is observed upon increasing the lattice temperature. The ratio of the photoluminescence emission intensity at 4 K and 300 K compares favorably to many well-developed III-V semiconductors, as described above as to the measured lifetime of Hex-$Si_{0.2}Ge_{0.8}$ at low temperature. The decrease of the intensity with increasing temperature is suppressed for higher excitation powers, as shown in FIG. 3D, due to saturation of non-radiative processes. The fact that the emission decreases with increasing temperature provides the first indication that Hex-Ge is a direct band gap semiconductor. In contrast, for an indirect gap semiconductor at low temperature, excited carriers accumulate in the indirect minimum and do not, therefore, efficiently emit light. As the lattice temperature increases, the photoluminescence intensity is expected to increase as carriers are thermally excited into the higher energy direct minimum from where they can recombine with a higher quantum efficiency.

The radiative lifetime as well as the radiative emission efficiency of Hex-$Si_{0.20}Ge_{0.80}$ are deduced. It is important to note that the measured decay lifetime is determined by the fastest recombination process, which can be either radiative or non-radiative in nature. It is therefore crucial to choose experimental conditions in which the measured recombination lifetime is exclusively governed by pure radiative recombination. This can be achieved at low temperature, since non-radiative processes are commonly thermally activated and therefore negligible.

As to the temperature dependence of the integrated photoluminescence intensity a detailed Arrhenius analysis of the temperature dependence of the integrated PL is provided as presented in FIG. 4C. The goal is to provide quantitative information about the ratio between the radiative and non-radiative recombination rates. In order to explain the temperature dependence of the photoluminescence emission intensity, we first have to set up the proper rate equation model. Since the donors have merged into a donor band which shifted into the conduction band, we will not incorporate the donor level into the rate equation model.

Following the LSW analysis as described above, it was concluded that the photoluminescence spectrum can be explained by Band-to-Band (BtB) recombination with only a minor influence of the acceptor related transition. As a consequence, the rate equation model was limited to a three level system incorporating the conduction band, the valence band and a "killer defect" which is characterized by an activated non-radiative recombination lifetime. The one-center model in the classification of Reshchikov was then used, which is explained in more detail by a configuration coordinate diagram. In this one-center model, the internal quantum efficiency ($\eta_{int}$) for radiative emission varies with temperature according to the ratio of the radiative recombination rate divided by the total recombination rate by $\eta_{int}=\tau_r^{-1}/(\tau_r^{-1}+\tau_{nr}^{-1}(T))$. The low excitation data collected at 68 W/cm², which are presented in FIG. 3D, can be fitted with this formulae by assuming that the non-radiative recombination rate is thermally activated by $\tau_{nr}^{-1}(T)=\tau_{n,r0}^{-1}e^{-E_a/KT}$ similar to III-V materials.

The excellent quality of the Arrhenius fit provides evidence that the non-radiative recombination into the yet unknown killer defect can indeed be explained by an activated non-radiative recombination rate.

The temperature dependence of the photoluminescence intensity can thus be expressed as $$I(T) = \frac{I_0}{1 + R_A e^{\frac{-E_A}{kT}}} \tag{A5}$$

in which the photoluminescence quenching rate into the non-radiative center is given by $$R_A = \frac{\tau_r}{\tau_{nr,A,0}}.$$

In most semiconductors, different non-radiative recombination centers exist which feature e.g. activation energy $E_A$, $E_B$ and quenching rates $R_A$, $R_B$ resulting in $$I(T) = \frac{I_0}{1 + R_A e^{\frac{-E_A}{kT}} + R_B e^{\frac{-E_B}{kT}}} \tag{A6}$$

Figure 12:
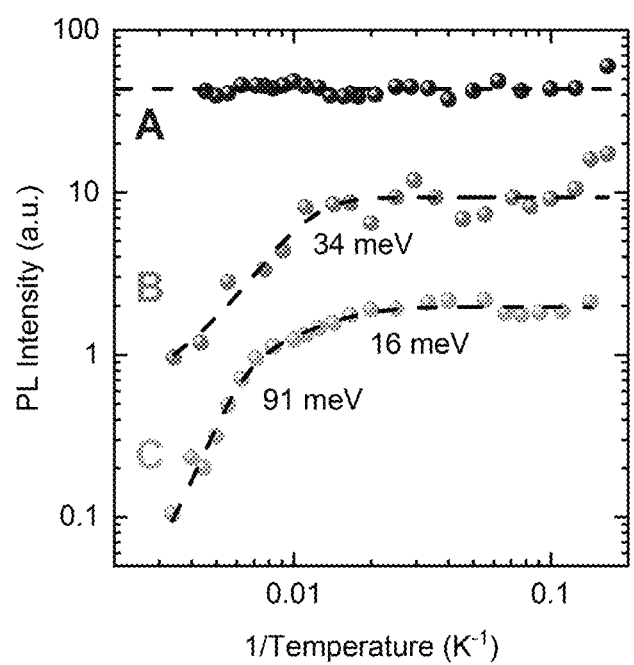
FIG. 12 depicts Arrhenius plots of Hex-$Si_{0.2}Ge_{0.8}$ with varying quality.

It is instructive to perform this analysis to three different generations of Hex-SiGe samples which are specified in table S2 and whose Arrhenius plots are shown in FIG. 12. In sample C, a first quenching mechanism is observed with activation energy $E_A$=16±1 meV with a quenching efficiency of $R_A$=3±1, and a second quenching mechanism with $E_B$=91±2 meV and $R_B$=6·10²±1 which is at least partially due to surface recombination. These rates imply an internal quantum efficiency of $$\frac{\tau_r^{-1}}{\tau_r^{-1} + \tau_{nr,A}^{-1} + \tau_{nr,B}^{-1}} = 0.15\%$$

when both non-radiative channels are fully activated (room temperature). The first quenching mechanism seems to have disappeared in sample B which was grown at a higher temperature. In sample B, we only observe photoluminescence quenching above a temperature of 100 K, which is again tentatively attributed to be at least partially due to surface recombination. The activation energy $E_B$=4±5 meV is tentatively explained by the de-trapping from localized states due to alloy fluctuations in the Hex-SiGe nanowire shell. Once the carriers are de-trapped, they will quickly diffuse to the nanowire surface where they recombine non-radiatively. In sample A, both quenching mechanisms have disappeared as $$R_A = \frac{\tau_r}{\tau_{nr,A,0}} = 0$$

and $$R_B = \frac{\tau_r}{\tau_{nr,B,0}} = 0$$

at an excitation density of 36 kW/cm², thus showing that sample A remains in the radiative limit up to 220 K. The quality of sample A is probably higher due its thick hex-SiGe shell which reduces the amount of surface recombination as well as by its length which reduces the influence of re-evaporating arsenic (As) and gallium (Ga) from unwanted growth on the substrate. To be completely sure, we have regrown sample A resulting in an identical temperature dependence as the first grown sample.

Figure 4:
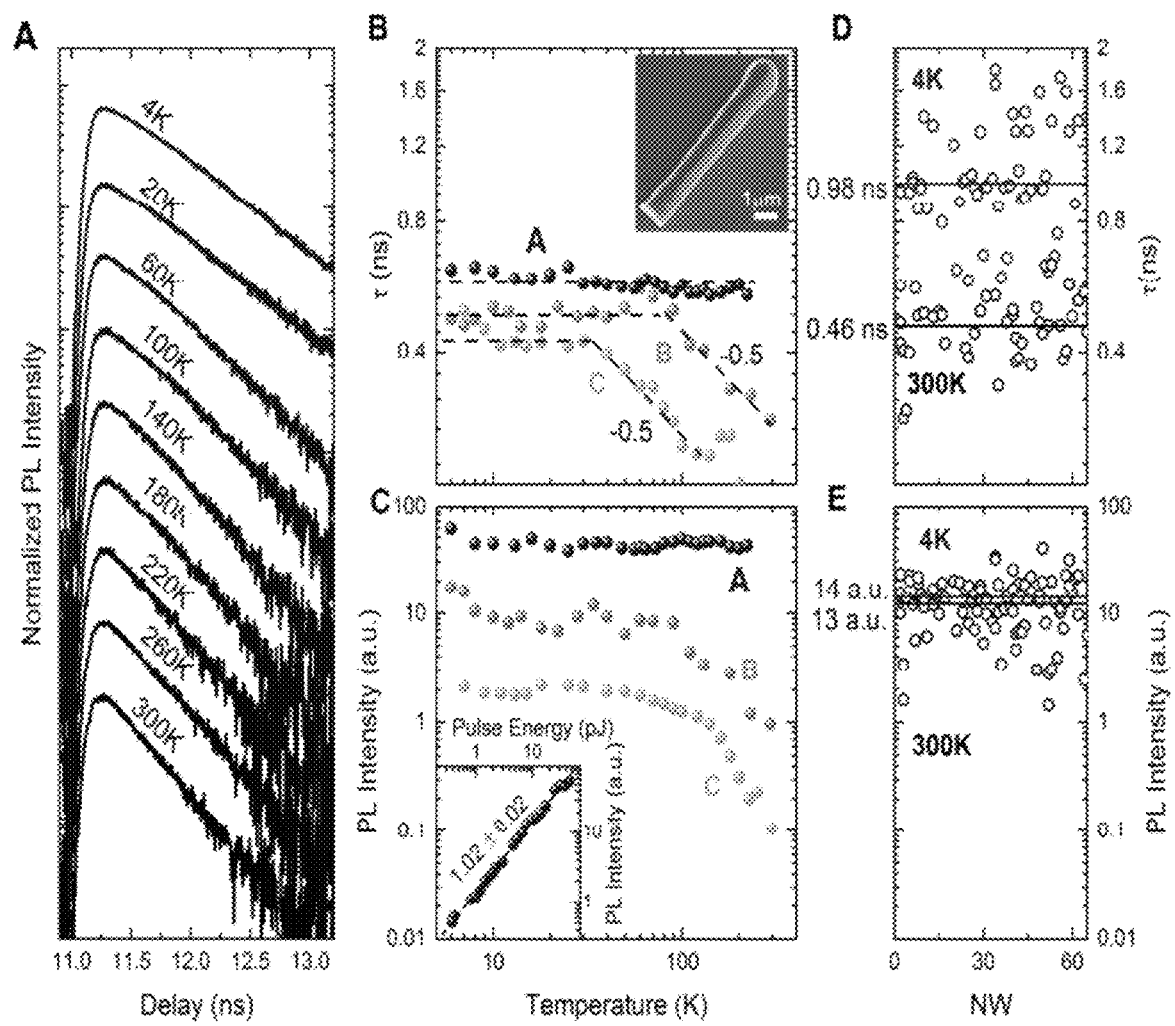
FIG. 4 depicts time-resolved photoluminescence measurements of single Hex-$Si_{0.2}Ge_{0.8}$ nanowires.

FIG. 4 depicts graphs representing the time-resolved photoluminescence measurements of single Hex-$Si_{0.2}Ge_{0.8}$ nanowires: FIG. 4A shows photoluminescence lifetime measurements of Hex-$Si_{0.2}Ge_{0.8}$ recorded from a single wire for different temperatures from sample A according the characteristics shown in Table S2 below. All decay traces show a single exponential decay and are vertically shifted for clarity.

TABLE S2

Growth parameters of Hex-SiGe samples with increasing quality: Here listed are the input temperature of the MOVPE reactor for the SiGe-shell growth and the resulting geometry of the nanowires that are presented in FIGS. 4B and 4B.

| Sample # | Growth Temp (° C.) | Ge-content (%) | nanowire Shell Radius (nm) | nanowire Core Diameter (nm) | nanowire Length (μm) |
|---|---|---|---|---|---|
| Sample A | 700 | 79 | 650 | 175 | 8 |
| Sample B | 700 | 80 | 400 | 35 | 2.5 |
| Sample C | 650 | 75 | 150 | 35 | 2.5 |

FIG. 4B shows the temperature dependence of the lifetime for three Hex-$Si_{0.2}Ge_{0.8}$ wires representing three different samples (A, B, C) with decreasing quality represented by the top, middle and lower series of dots indicated with A, B and C. The onset of the reduction in lifetime due to non-radiative recombination shift to higher temperature for higher quality wires, as emphasized by the dashed lines. The inset shows a representative SEM image of a single nanowire from sample A used for lifetime measurements.

FIG. 4C depicts the integrated photoluminescence intensity as a function of temperature for the same wires as in FIG. 4B, showing a nearly temperature independent radiative efficiency for the best sample (A, top series). The inset shows the excitation power dependence of the integrated photoluminescence intensity, exhibiting a slope very close to unity.

FIG. 4D shows a comparison of the low temperature (lighter set of dots) and room temperature (black set of dots) lifetime for a set of ~60 wires from sample A. The average lifetime shows a small decrease from 0.98 ns at 4 K to 0.46 ns at 300 K. FIG. 4E shows a comparison of the integrated photoluminescence intensity at 4 K and 300 K of the same wires measured in FIG. 4D, again showing a nearly temperature independent radiative efficiency.

As to the temperature dependence of the radiative lifetime, as shown in FIG. 4B, a temperature independent recombination lifetime is observed in sample A. In this section, it is shown that such a T-independent recombination lifetime can only be explained by radiative recombination in a degenerately doped semiconductor.

Non-radiative recombination features an activated behavior at low temperature which is governed by $\tau_{nr}^{-1}(T) = \tau_{n,r0}^{-1} e^{-E_a/KT}$ as explained as to the temperature dependence of the integrated photoluminescence intensity. By analyzing the well-known expressions for the Shockley-Read-Hall (SRH) non-radiative recombination mechanism for intrinsic material, the SRH lifetime can be expressed as $$\tau_{SRH} = \tau_{p,0}\left(1 + \cosh\frac{E_t - E_i}{k_B T}\right)$$

in which $E_t$ is the trapping level, $E_i$ is the intrinsic Fermi level and $\tau_{p,0}$ is the SRH lifetime for minority holes. At higher temperature, the SRH lifetime is expected to decrease with $T^{-1/2}$ due to the fact that both $\tau_{n0}$ and $\tau_{p0}$ are inversely proportional to the thermal velocity. It is concluded that it is clearly not possible to interpret the observed temperature independent recombination lifetimes as being due to non-radiative recombination.

Auger recombination is discussed, which might be expected due to the high n-doping by unintentional arsenic (As) incorporation during growth. The Auger rate includes two different processes, the nnp-Auger process in which the excess energy is transferred to an electron and the npp-Auger process in which the excess energy is transferred to a hole. With the present invention, high n-doping exists due to As incorporation during growth, resulting in a doping concentration $n_0$. It is expected that the nnp-Auger process will be most important in the n-doped Hex-SiGe samples. The Auger coefficients are however temperature dependent, which results in a T-dependent recombination lifetime, which is not consistent with the observations. Most importantly, as shown in the inset of FIG. 4C, a linear relation is observed between the integrated photoluminescence intensity and the excitation power. A decrease of the PL-intensity at high excitation is not observed, which is a strong indication that Auger processes are still weak at the experimental conditions.

As to the possibility of radiative recombination, the radiative lifetime for an intrinsic semiconductors increases with $T^{3/2}$ showing sub nanosecond radiative lifetimes at low temperature which increase to more than a microsecond at room temperature. For a degenerately doped semiconductor, the radiative lifetime is expected to be temperature independent since the B-coefficient for radiative recombination is proportional to $$B \equiv \frac{L}{np},$$

in which L is the spontaneous radiative recombination rate. It can be easily seen that for a degenerate semiconductor $p \propto T^{3/2}$, $L \propto T^{3/2}$ while n becomes temperature independent. Both the B-coefficient for radiative recombination rate and the radiative lifetime are thus expected to be independent of temperature.

Photoluminescence lifetime measurements for all three samples are presented in FIG. 4B. From FIG. 4C it is recalled, that sample C, B and A are in the radiative limit up to 40 K, 100K and >220 K. This behavior is exactly reproduced in FIG. 4B in which the lifetimes are constant up to 40 K, 90 K and >220 K which is indeed expected for a degenerate semiconductor in the radiative limit. In sample C, B, non-radiative recombination becomes the dominant recombination mechanism above 40 K and 90 K, respectively, as is clear from the observed slope which is close to −0.50 as expected for non-radiative SRH recombination at high temperature. The non-radiative recombination at high temperature is expected to be due to recombination at the nanowire surface.

In order to again obtain the correct statistics, photoluminescence lifetime measurements were performed on more than 60 different nanowires taken from sample A at 4 K and at 300 K. The data are displayed in FIG. 4D. A spread in the recombination lifetimes at 4 K is observed, which is attributed to variations of the local density of photonic states around each individual wire.

Moreover, measurements were performed at high excitation density to saturate non-radiative processes and to maintain the radiative limit up to increased temperature. Typical results from time-resolved luminescence measurements on a single wire from the $Si_{0.20}Ge_{0.80}$ sample are presented in FIG. 4A as a function of temperature. A clear mono-exponential decay transient was observed, characteristic of a single, dominant decay channel. For all Hex-$Si_{1-x}Ge_x$ nanowires investigated, the characteristic recombination lifetime is around 1 ns, very similar to conventional direct gap semiconductors such as GaAs or InP at low temperatures with similar doping levels, as described above as to the measured lifetime of Hex-$Si_{0.2}Ge_{0.8}$ at low temperature. It was further observed that the experimentally obtained lifetime is an order of magnitude smaller than the theoretically calculated lifetime, which indicates that the perfect crystal symmetry is also broken by other factors.

FIGS. 4B and 4C show the temperature dependence of both the recombination lifetime and the integrated emission intensity as a function of temperature from single wires from three different samples grown under different conditions leading to different quality, see Table S2. The wires show comparable lifetimes at low temperature, but the intensity and lifetime both start to decrease at a temperature of around 40 K (100 K) for sample C (FIG. 4B) which is the low (medium) quality wire. For the higher quality sample, a constant integrated photoluminescence intensity and lifetime as a function of temperature up to 220 K was observed, which conclusively shows the absence of non-saturated thermally activated non-radiative recombination processes, providing strong evidence for pure radiative recombination, as described above as to the temperature dependence of the radiative lifetime.

To be sure that the data for an individual wire are representative, more than 60 individual wires swiped from high crystal quality sample A were analyzed, which are presented in FIGS. 4D and 4E. The analysis shows that both the photoluminescence efficiency and the lifetime are almost temperature independent up to 300 K. Next the excitation power dependence of the emitted photoluminescence intensity in FIG. 4C inset was analyzed. Importantly, the plot shows a linear increase of the photoluminescence intensity with a slope very close to unity, which is consistent with a pure radiative decay mechanism.

As to the excitation power dependence of the integrated photoluminescence intensity it is noted, that at low excitation density, $\Delta n < n_0$, the nonradiative, radiative and Auger processes all yield a linear dependence of the PL-intensity versus excitation power with a slope of unity. However, this simplified analysis assumes that the non-radiative recombination centers are not being saturated.

Since no deviation from a linear behavior was observed, the data suggest that, even if non-radiative recombination centers would be present, it is possible to saturate them with excitation power. This suggests that no non-radiative recombination centers in the bulk of the material, implying that the radiative limit is reached. It is noted that this argument applies both for $\Delta n < n_0$ and $\Delta n > n_0$.

At high excitation density, $\Delta n > n_0$, a prior art analysis is used, according to which analysis the total carrier generation rate G should be equal to the total carrier recombination rate by $$G = An + Bn^2 + Cn^3 \qquad (A7)$$

in which $An$ is the Shockley-Read-Hall nonradiative recombination rate, $Bn^2$ is the radiative recombination rate and $Cn^3$ is the Auger nonradiative rate. At high excitation density (which is above 500 W/cm² for Hex-Ge as shown by bandfilling in FIG. 3A) when the photo-injected carrier densities $\Delta n$, $\Delta p$ are larger than the electron concentration due to unintentional As-doping (see APT measurements in FIG. 9).

$$G = A\sqrt{\frac{I_{PL}}{aB}} + \frac{I_{PL}}{a} + C\left(\frac{I_{PL}}{aB}\right)^{3/2} \qquad (A8)$$

In the plot of the integrated photoluminescence intensity versus excitation density, Eq. A6 yields a slope of two for non-radiative recombination (provided that the non-radiative recombination centers are not being saturated, see above), a slope of unity for radiative recombination and a slope of ⅔ for Auger recombination. It is noted that a decrease of the PL-intensity at the highest excitation power was not observed, providing a first indication that Auger recombination losses are not yet dominant in this material.

For the Hex-$Si_{0.20}Ge_{0.80}$ sample, a clear boundary between the $\Delta n < n_0$ and the $\Delta n > n_0$ regime could not be established due to the added complication of alloy broadening. Most probably, the $Si_{0.20}Ge_{0.80}$ alloy will be composed out of compositional pockets in which either $\Delta n < n_0$ or $\Delta n > n_0$ applies. The observation of a slope of exactly unity, as shown in the inset of FIG. 4C, implies that both type of pockets are in the radiative limit.

As to the radiative efficiency and B-coefficient of Hex-SiGe, in order to compare the radiative emission strength of Hex-SiGe with other well-known direct band gap semiconductors like e.g. GaAs or InP, the radiative emission rate is compared at room temperature which is most relevant for device applications. By making the comparison at 300 K, excitonic effects as well as effects due to carrier localization in the Hex-SiGe alloy are not relevant anymore. The key parameter to compare the radiative efficiency of a semiconductor is the B-coefficient which is a recombination rate, corrected for the doping density.

The radiative rate per volume of a semiconductor $R_{rad}$ can be expressed in terms of the B-coefficient, n- and p-type doping concentration $n_0$ and $p_0$ and the number of excited electron-hole pairs $\Delta n = \Delta p$. For a highly n-doped semiconductor, which yields $n_0 \gg \Delta n$, $R_{rad}$ can be expressed as:

$$R_{rad} = B_{rad}(n_0 \Delta n)(p_0 + \Delta p) \approx B_{rad} n_0 \Delta_p \qquad (A9)$$

The experimentally observed radiative lifetime $\tau_{rad}$ is determined by the recombination rate per volume $R_{rad}$ and the number of excited electron hole pairs $\Delta n = \Delta p$ such that $\tau_{rad} = \Delta p / R_{rad}$. Combining this result with equation A9 gives a definition for the B-coefficient of:

$$B_{rad} = \frac{1}{\tau_{rad} n_0} \quad \text{(A10)}$$

In which $\tau_{rad}$ is the radiative lifetime at 300 K and $n_0$ is the activated donor density. To determine the $B_{rad}$ coefficient the determined values are evaluated for $\tau_{rad}$ and the doping density $n_0$.

The measured photoluminescence-lifetimes show a spread over different wires as shown in FIG. 4D. This spread is attributed to a variation of the optical density of states of each individual wire. Using the decay times measured at 4 K (FIG. 4D) and extrapolating them to 300K assuming temperature independence, an upper limit of 1.6 ns is deduced, while the lower limit is close to 0.4 ns, as shown by the 300 K measurements in FIG. 4D.

It is argued whether the measured photoluminescence decay time at 300 K, is equal to the radiative lifetime. The main supportive argument is provided by FIG. 4E, which shows that the photoluminescence intensity at 300 K is almost equal to the photoluminescence intensity at 4 K. Since it is known that Hex-SiGe is in the radiative limit at 4 K, and almost the same emission intensity is observed at 300 K, it is clear that Hex-SiGe should remain very close to the radiative limit at 300 K.

A second point of concern might be whether the degenerate limit $\Delta n < n_0$ is still valid. The main evidence for this point is that, for most wires, an excitation power is measured independent photoluminescence decay time in the same excitation range as in the inset of FIG. 4C. In addition, a temperature independent photoluminescence lifetime is measured in FIG. 4B in connection with the above remarks as to the excitation power dependence of the integrated photoluminescence intensity, which can only be understood for a semiconductor with degenerate doping.

Since the measurements were performed in the radiative limit and the carriers accumulate in the direct minimum at low temperature, the observation of a direct band gap emission with a sub-nanosecond recombination lifetime was concluded. The data reveals conclusive evidence for Hex-$Si_{1-x}Ge_x$ ($0.65 < x < 1$) as being a new class of direct band gap semiconductors with a large optical matrix element according to an aspect of the invention. Subsequently the radiative transition rate of Hex-SiGe was compared with other direct band gap semiconductors. The radiative transition rate $R_{rad}$ is quantified by $R_{rad} = B_{rad} \cdot n \cdot p$ in which n and p are the electron and hole densities and $B_{rad}$ is the coefficient for radiative recombination, which is directly related to the transition dipole moments. The coefficient $B_{rad}$ can be deduced from a measurement of the pure radiative lifetime, $\tau_{rad}$ by $$B_{rad} = \frac{1}{\tau_{rad} n_0}$$

in which $n_0$ is the activated donor density.

Figure 9:
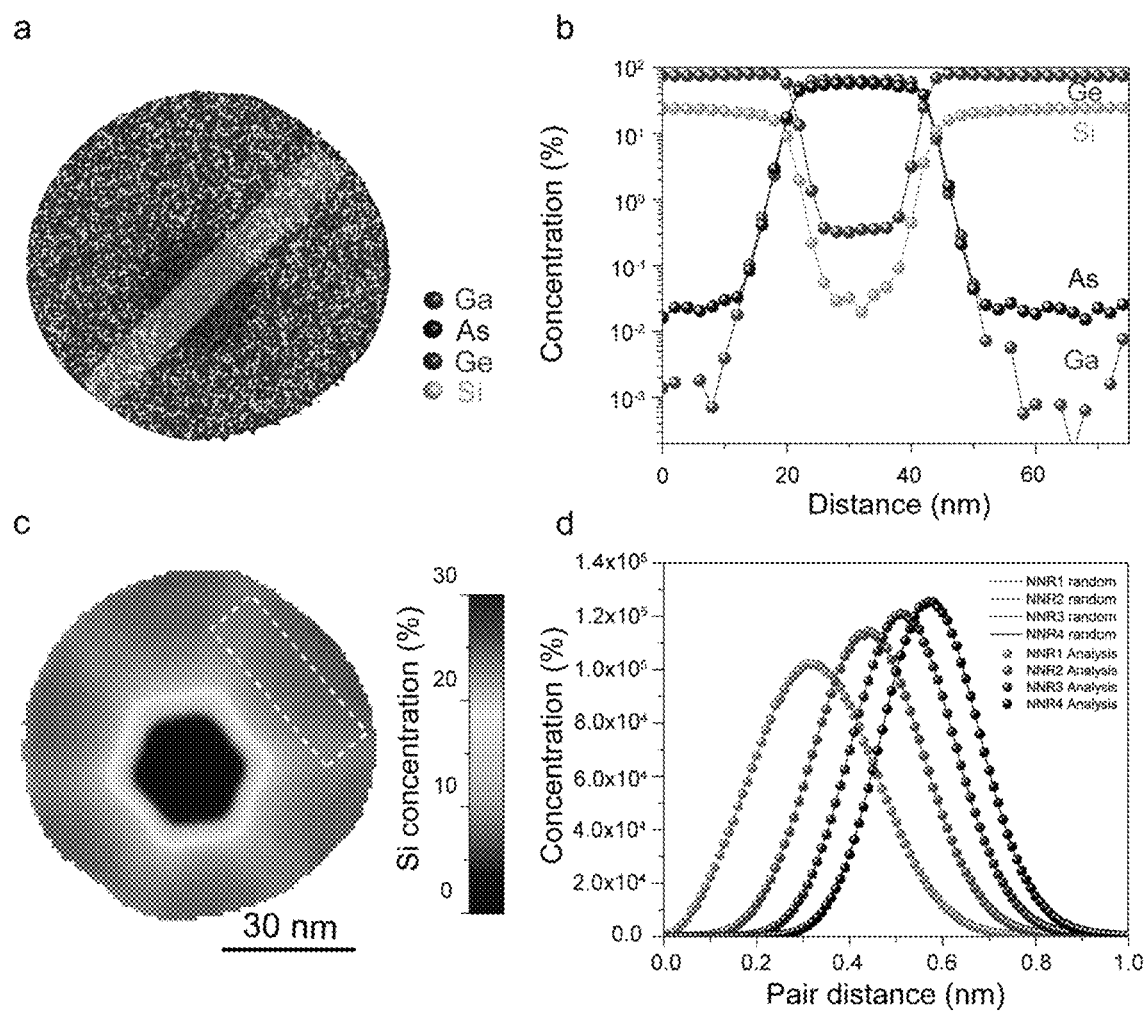
FIG. 9 depicts an atom probe tomography characterization of Hex-$Si_{0.25}Ge_{0.75}$.

The donor density $n_0$ has been estimated using two techniques, the first of which is atom probe tomography, shown in FIG. 9, where a donor concentration of $n_0 = 9 \cdot 10^{18}$ cm$^{-3}$ is found. However this number might differ from the number of active dopants. The active doping concentration can be calculated from the electron-quasi-fermi-level (eQFL) and the density of states in the conduction band. An eQFL of 35 meV is found using the results of the LSW fitting model as described above as to the fitting using the Lasher-Stern-Würfel (LSVV) model and the density of states are calculated using the effective masses following DFT calculations. Using these values a doping level is found of $n_0 = 2.3 \cdot 10^{18}$ cm$^{-3}$.

Now combining the upper bound for the donor density of $9 \cdot 10^{18}$ cm$^{-3}$ with the upper bound of 1.6 ns for the radiative lifetime, a lower bound is obtained for the B-coefficient of $0.7 \cdot 10^{-10}$ cm$^3$/s, which is roughly 2× smaller than the B-coefficient of InP. Using the lower limits for $n_0$ and $\tau_{rad}$ an upper limit of $11 \cdot 10^{-10}$ cm$^3$/s is found for the B-coefficient, which is 9× larger as for InP. A comparison of B-coefficients of different III-V materials, Cub-Si and Hex-$Si_{0.2}Ge_{0.8}$ is made in table S3 below. Extracting the B-coefficient and thus the transition matrix elements is of great importance for possible device applications of Hex-SiGe for e.g. lasers, modulators, detectors and LEDs which all critically depend on the strength of the light-matter interaction.

As to the radiative efficiency and B-coefficient of Hex-SiGe, $0.7 \cdot 10^{-10}$ cm$^3$/s $< B_{rad} < 11 \cdot 10^{-10}$ cm$^3$/s at 300 K is obtained, which is comparable in magnitude to GaAs and InP and almost 5 orders of magnitude larger than for Cub-Si as shown in Table S3 below. Hex-$Si_{1-x}Ge_x$ is thus a fully silicon compatible semiconductor with a radiative emission strength comparable to a direct band gap III-V semiconductor.

TABLE S3

Radiative coefficients of Hex-$Si_{0.2}Ge_{0.8}$, GaAs, InP and Cubic-Si: Listed are the B-coefficients for Hex-$Si_{0.2}Ge_{0.8}$ as calculated and described above S8 as to the radiative efficiency and B-coefficient of Hex-SiGe, and values for GaAs, InP and Cub-Si as known in the prior art.

| Hex-$Si_{0.2}Ge_{0.8}$ | GaAs | InP | Cub-Si |
|---|---|---|---|
| $0.7 \cdot 10^{-10}$ cm$^3$/s – $11 \cdot 10^{-10}$ cm$^3$/s | $3.5 \cdot 10^{-10}$ cm$^3$/s | $1.2 \cdot 10^{-10}$ cm$^3$/s | $4.73 \cdot 10^{-15}$ cm$^3$/s |

Figure 5:
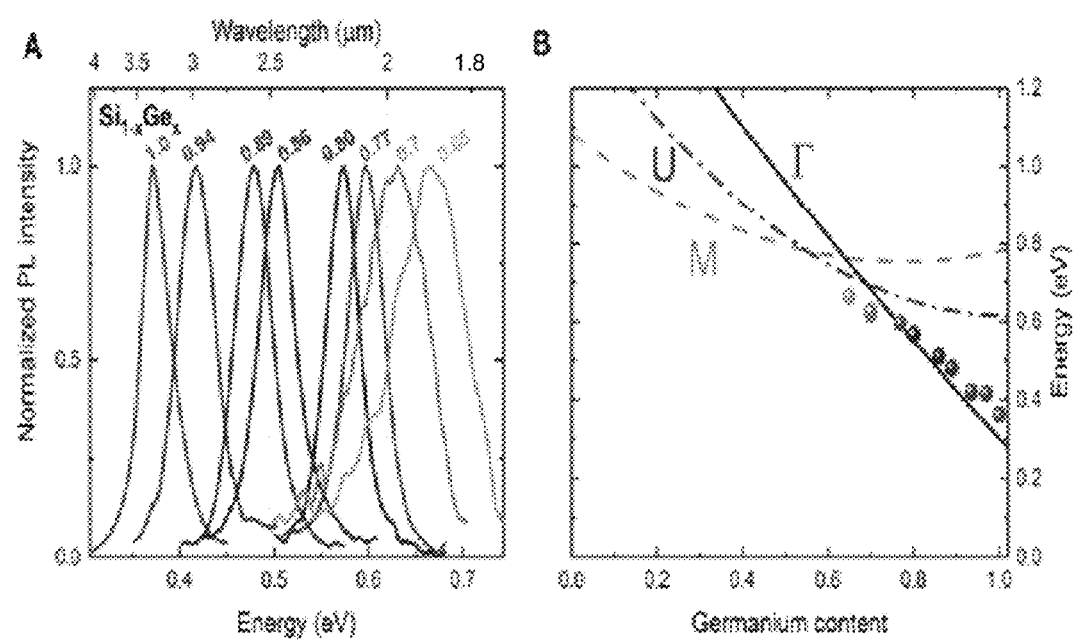
FIG. 5 depicts the tunability of the direct band gap of Hex-$Si_{1-x}Ge_x$ alloys.
Figure 5:
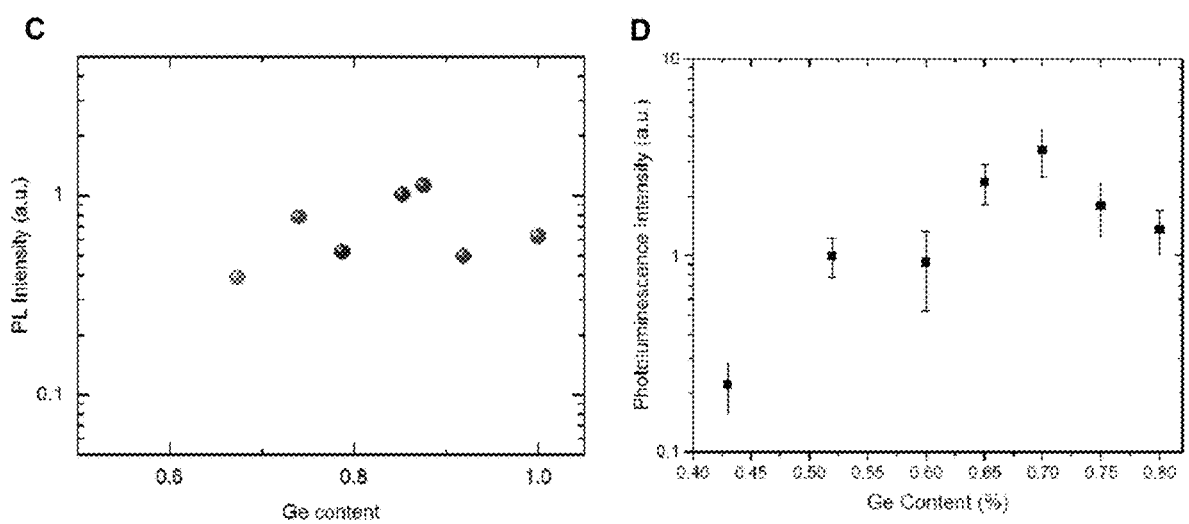

FIG. 5 depicts the tunability of the direct band gap of Hex-$Si_{1-x}Ge_x$ alloys: FIG. 5A shows the tunability of the PL spectra for different compositions. The spectra were recorded at 4 K at an excitation density of 1.9 kW/cm$^2$ on as-grown samples. The spectra for Hex-$Si_{0.3}Ge_{0.7}$ and Hex-$Si_{0.35}Ge_{0.65}$ where measured, using time-correlated single photon counting measurements as outlined in the next paragraph, on wires dispersed onto a silicon substrate capped with a gold (Au) layer. FIG. 5B shows a comparison of the measured peak energy as a function of the Ge content with the calculated emission band minima.

Hereto, time-correlated single photon counting measurements have been performed on single $Si_{0.2}Ge_{0.8}$ wires. The wires have been mechanically transferred onto a silicon wafer with a chromium (15 nm), Gold (300 nm) and $SiO_x$ (12 nm) top layer to act as a back mirror. This approach enhances the measured intensity and avoids potential optical signals emitted by the wafer. The samples with transferred $Si_{0.2}Ge_{0.8}$ wires were mounted in an Oxford Instruments HiRes2 helium flow cryostat and were excited with a 1030 nm, NKT ONEFIVE Origami femto-second pulsed laser with a 40 MHz repetition rate. The photoluminescence signal was measured in a backscattering geometry using a 36X gold coated cassegrain objective which focused the excitation laser to a spot of ~3 µm. The laser was filtered out of the PL signal using a 1350 nm long pass filter. Using an achromatic lens the PL signal was then focused onto a SM2000 single mode fiber and fed to a Single Quantum superconducting-nanowire-single-photon-detector which was optimized for a >35% quantum efficiency at 1800 nm and a >15% quantum efficiency at 2000 nm. The 1350 nm long pass filter in combination with the SM2000 fiber defined a spectral interval of 1350 nm to ~2300 nm over which PL was integrated. The time correlations between a laser pulse and a detection event were measured and counted using a PicoQuant PicoHarp 300 module. The overall instrumental response function (IRF) shows a FWHM of 96 ps with a decay time of $\tau_{IRF}=21$ ps which is the minimum observable decay time of the system. All measurements presented in FIG. 4 have been performed with 125 pJ pulses resulting in an excitation density of ~0.4 mJ/cm², with the exception of the inset of FIG. 4C where the excitation energy was varied. All lifetime measurements have been baseline corrected and fitted using a single exponential decay transient. Spectrally resolved Photoluminescence experiments with accurate temperature control have been carried out on as-grown samples mounted in an Oxford Instruments HiRes2 helium flow cryostat. The samples were illuminated using a 976 nm, continuous wave laser, modulated at a frequency of 35 kHz, focused down to a 45 µm spot on the sample using a 2.1 cm focal distance off-axis parabolic Au-mirror. The same off-axis parabolic mirror was used to collimate the photoluminescence signal and coupled it into a Thermo Scientific Nicolet IS50r FTIR, equipped with an MCT detector, used for $Si_{1-x}Ge_x$ samples with x>0.8 and an extended-InGaAs detector, used for samples with x≤0.8. The FTIR was operated in step-scan mode, which allowed to use a lock-in technique to eliminate the thermal background. In order to minimize parasitic absorption the full optical path was purged with nitrogen.

According to an aspect of the invention the direct nature of the band gap of $Hex-Si_{1-x}Ge_x$ has been established and the size of the direct band gap can be tuned via compositional engineering. FIG. 5A shows photoluminescence measurements recorded at T=4 K from the series of samples with x=0.65-1.00 between a wavelength range of at least 1.8 µm till 4 µm. Bright emission is observed that redshifts with increasing Ge-content from 0.67 eV (x=0.65) to 0.35 eV (x=1.00). The peak energy of the emission is compared in FIG. 5B with the calculated energy of the direct band gap (Γ) revealing excellent agreement. Herewith as an example according to the invention $Hex-Si_{1-x}Ge_x$ for x>0.65 with a direct band gap is obtained.

FIG. 5C depicts the relative photoluminescence (PL) intensity between compositions: Here the relative PL intensities are given of the samples that are presented in FIGS. 5A and 5B. It is noted that only measurements on ensembles of as-grown standing wires are included where an equal number of wires is probed, therefore the $Si_{0.35}Ge_{0.65}$ sample is not included. For this comparison all the samples have been excited with an excitation density of 5 kW/cm² at a temperature of 4K using the same MCT-detector and the same KBr beam splitter. The samples are found to be very similar in intensity despite the change in setup-efficiency, a variation in total excited volume due to thickness differences and potentially strain induced non-radiative recombination centers for high Si-content samples. Because of these additional factors no conclusive experimental argument can be made on whether the material becomes more efficient for higher Si-contents. Additionally it is acknowledged that, PL-spectra were not measured from wires with x<0.65, indicating that the direct-indirect transition lies near this point.

FIG. 5D depicts the relative photoluminescence (PL) intensity between several compositions $Hex-Si_{1-x}Ge_x$, for 0.4<x<1.0. These measurements were performed on single Hex-SiGe nanowires using the time-correlated single photon counting setup as described before, which is sensitive below a wavelength of 2.3 µm. This setup only allowed to measure the integrated photoluminescence intensity using spectral filters. It is important to say that the growth conditions were optimized for wires with x=1 (pure Ge) and x=0.2, and it is possible to further optimize the PL-intensity for other compositions. The wires have been mechanically transferred onto a silicon wafer with a chromium (15 nm), Gold (300 nm) and $SiO_x$ (12 nm) top layer to act as a back mirror.

Direct band gap $Hex-Si_{1-x}Ge_x$ opens a pathway towards tight monolithic integration of $Hex-Si_{1-x}Ge_x$ light sources with passive cubic Si-photonics circuitry on the same chip. This will reduce stray capacitances thereby increasing performance and reducing energy consumption which is important for green information and communication technologies. According to an aspect to the invention on a conventional Cub-Si substrate of a light-emitting or light-absorbing component a $Hex-Si_{1-x}Ge_x$ compound structure is provided as the light-emitting or light-absorbing section. Possible integration routes are strain-induced transformation of $Hex-Si_{1-x}Ge_x$, for instance by a dielectric (i.e. $SiO_x$ or $SiN_x$) strain envelope, or alternatively by template-assisted selective area growth of the hexagonal phase.

According to an another aspect of the invention, the usable wavelength region of the $Hex-Si_{1-x}Ge_x$ compound material for emitting light can be extended towards a range between 1.4 µm and 7.0 µm using strain. This includes the application of strain on the $Hex-Si_{1-x}Ge_x$ compound material by growing strained quantum well structures using a different composition of the hexagonal $Si_{1-x}Ge_x$ compound material in each layer of the quantum well structure.

Figure 6:
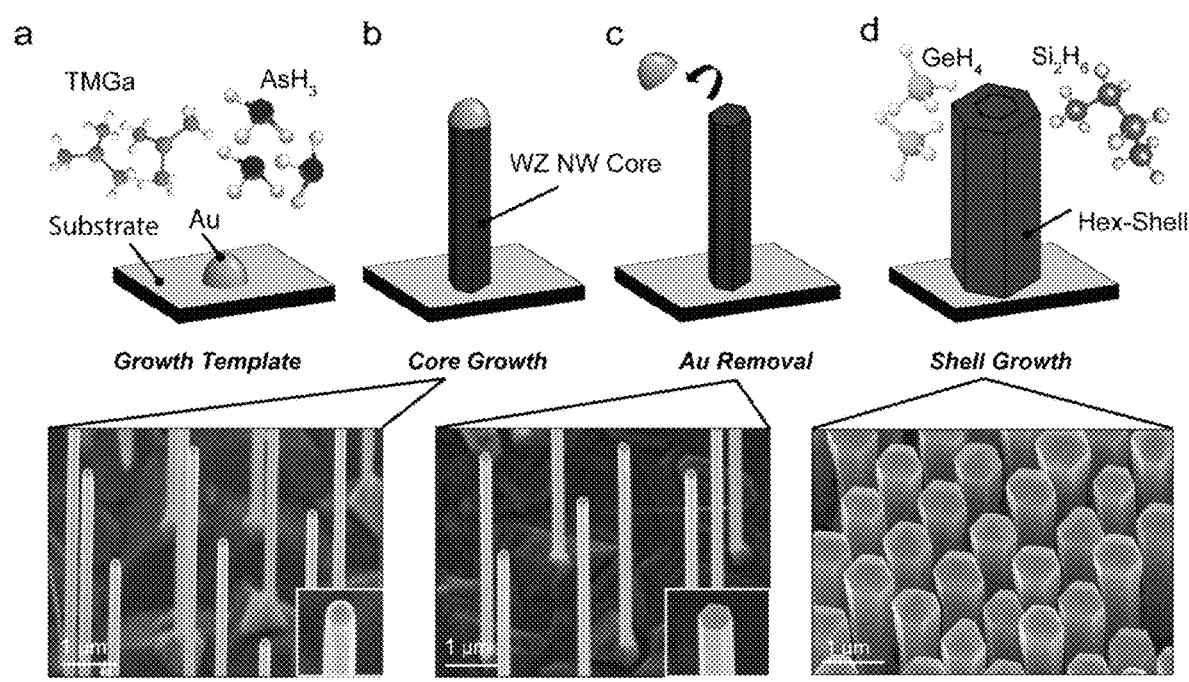
FIG. 6 depicts a schematic illustration of the nanowires growth process.

FIG. 6 depicts a schematic illustration of the nanowires growth process according to the invention. In a first method step, Group III-V compound semiconductor nanowires, in particular GaAs nanowires were grown in a Close Coupled Shower head (CCS) Metal Organic Vapor Phase epitaxy (MOVPE) reactor via catalyst assisted growth following the Vapor-Liquid-Solid (VLS) mechanism utilizing a Group 11 element catalyst seeds, in particular gold (Au) catalyst seeds as schematically illustrated in FIG. 6.

According to a method step according to the invention, the Group 11 element catalyst seeds, here Au catalyst seeds were deposited in nano disks arrays arrangement on a Group III-V compound semiconductor substrate, here a GaAs $(111)_B$ substrate via an electron beam lithography technique. The growth was performed at a reactor flow of 8.2 standard litres per minute (slm) and a reactor pressure of 50 mbar. For the GaAs nanowires, the growth template was annealed at a set thermocouple temperature of 635° C. under an $AsH_3$ flow set to a molar fraction of $\chi_{AsH_3}=6.1\times10^{-3}$ mols. Then, the growth was performed at a set temperature of 650° C. with trimethylgallium (TMGa) and Arsine ($AsH_3$) as material precursors set to molar fractions of $\chi_{TMGa}=1.9\times10^{-5}$ mol, $\chi_{AsH_3}=4.55\times10^{-5}$ mol, respectively, resulting in a V/III ratio of 2.4.

After the growth of the GaAs core nanowires, in a further method step the GaAs core nanowires are chemically treated with a cyanide based solution to remove the Au catalyst particles to avoid gold contamination in the SiGe shells, (see, FIG. 6). Eventually, the GaAs nanowire core is used as a hexagonal material template and in a next method step overgrown with a $Si_{1-x}Ge_x$ shell by introducing the suitable gas precursors for the shell growth which are $GeH_4$ and $Si_2H_6$. As an aspect of the method according to the invention, the $Si_{1-x}Ge_x$ shell was grown at a set temperature of 650-700° C. at a molar fraction of $\chi_{SiGe}=1.55\times10^{-4}$ mol for a certain time according to the desired thickness.

FIG. 7 shows a schematic illustration of the nanowires growth process according to an example of the method according to the invention. In a first method step, the core nanowires growth starts with (a) a substrate patterned with Au catalyst seeds, which is introduced in the MOVPE reactor and annealed at a temperature higher than the eutectic temperature forming an alloy between the catalyst seed and the substrate. (b) Afterwards, the GaAs gas precursors (TMGa and $AsH_3$) are introduced, Au-catalysed GaAs core nanowires are grown. To proceed with the SiGe shell growth: (c) Au seeds are chemically etched away from the GaAs cores, and (d) the sample is reintroduced in the MOVPE reactor. A Hex-$Si_{1-x}Ge_x$ shell is epitaxially grown around the GaAs cores from ($Si_2H_6$ and $GeH_4$) precursors. (The molecules are drawn with the freely available MolView Software). The 30 degree tilted SEM images in the bottom panel are representative to the results of the growth steps in the top panel.

As to the crystal quality of the WZ GaAs nanowire Cores grown with an example of a method according the invention, FIG. 7A depict bright field TEM images recorded in the [11-20] zone axis of five (5) representative GaAs core nanowires of a pure WZ crystal where stacking faults are indicated with a thin, upward directed line, resulting in a stacking fault density of (0-6 SFs/µm). FIG. 7B shows a zoomed in bright field TEM image of the top part of one of the nanowires in (a) (highlighted with a square box) to indicate the purity of the crystal structure. FIG. 7C depicts a HAADF-STEM image of the highlighted part with a dashed line box in FIG. 7B displaying the ABAB stacking of the GaAs atomic columns; the hall mark of the hexagonal crystal structure. The clear visible grey line indicated with X7 highlights a stacking fault forming one cubic layer in the hexagonal structure.

Figure 8:
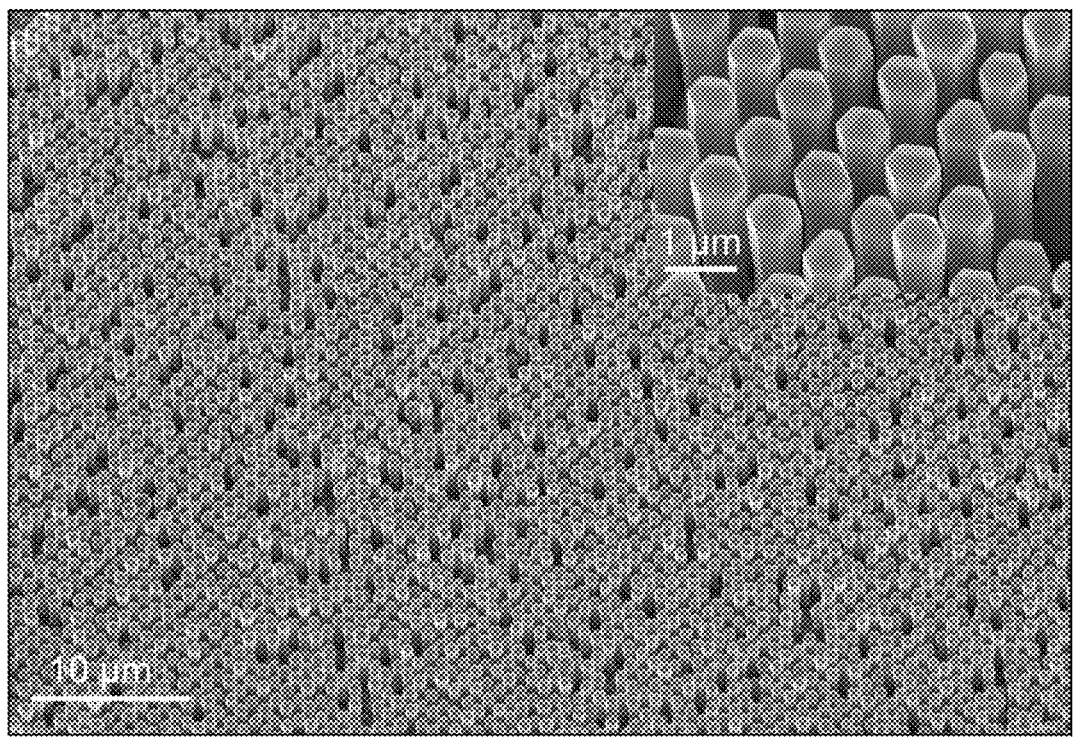
FIG. 8 depicts a representative SEM of Hex-Ge sample.

FIG. 8 depicts a representative SEM of Hex-Ge sample according to the invention. It shows an overview scanning electron microscopy (SEM) image of Hex-Ge/GaAs core shells showing the uniformity of the growth across the sample with a detailed inset displaying a magnified image of the nanowire arrays.

FIG. 9 shows an atom probe tomography characterization of Hex-$Si_{0.25}Ge_{0.75}$: FIG. 9A shows a 3D volume reconstruction of part of a Hex-$Si_{0.25}Ge_{0.75}$ core/shell nanowire with thicknesses of 35 nm/46 nm. For clarity only a slab of 40 nm thick of the entire 1100 nm long analyses is shown. Ge and Si can clearly be seen to form a shell around the hexagonal Ga, and As core. FIG. 9B shows a plot of the atomic species concentration in the SiGe shell in the highlighted yellow rectangle in (a) as a function of the radial distance across the core/shell structure. Every data point in the plot represents a 2 nm slice taken along the entire length of the nanowire analyses excluding the cubic top part. Constant incorporation of As at a level of approximately 200 ppm is observed in the entire shell while the Ga concentration quickly drops to a value close to the noise level of ~10 ppm.

FIG. 9C shows a radial profile of the SiGe core/shell structure from the APT measurement integrated over a 1.0 µm length of the structure showing a Si content of around 25% as shown in (b). On the highlighted dotted rectangular volume of (c), a nearest neighbor analysis for Si atoms was carried out as previously used to evaluate random alloys of GeSn. The nearest neighbor analysis evaluates the distances between each Si atoms pair and its first (to fourth) neighbors.

Finally, FIG. 9D depicts a plot comparing the nearest neighbor analysis on the measurement data to a randomized data set. This provides no indication of Si clustering and has been established as a reliable way to evaluate random alloys.

For the APT measurements, individual nanowires (nanowires) were isolated from a forest of nanowires as described previously with a Kleindiek nano-manipulator inside a FEI Nova Nanolab 600i Dual beam. APT analyses were carried out in a LEAP 4000X-HR from Cameca. The system is equipped with a laser generating picosecond pulses at a wavelength of 355 nm. The experimental data were collected at laser or voltage pulse rates between 65-125 kHz with laser pulse energies between 5-10 pJ or pulse fractions between 25-27.5%. No significant differences between laser and voltage pulses are seen aside from a slightly higher compression of the core in laser pulsed mode and a lower quality of the mass spectra in voltage pulsed mode. During the analysis the sample is kept at a base temperature of 20 K in a vacuum of $\sim2\cdot10^{-11}$ mbar.

FIG. 10 depicts full series of symmetric (0008) reflections of Hex-$Si_{1-x}Ge_x$: FIG. 10A shows a Reciprocal Space Map (RSM) of as-grown WZ GaAs nanowires on a Cub-GaAs substrate, containing the WZ-GaAs (0008) reflection and the Cub-GaAs (444) reflection. FIG. 10B shows an RSM for a similar sample as in FIG. 10A yet with a thick Ge-shell, including the Cub-GaAs (444) substrate reflection and the Hex-Ge (0008) reflection. Additional RSMs are shown for samples with $Si_{1-x}Ge_x$ shells, in FIG. 10C (x=0.92), FIG. 10D (x=0.86), FIG. 10E (x=0.75), FIG. 10F (x=0.63), as also listed in table S1. A clear increasing shift of $Q_{out-of-plane}$ has be observed for increasing Si-content, corresponding to a decreasing lattice constant. For the RSMs in FIGS. 10D and 10E also a reflection from a parasitic, epitaxial Cub-SiGe layer is found.

Figure 11:
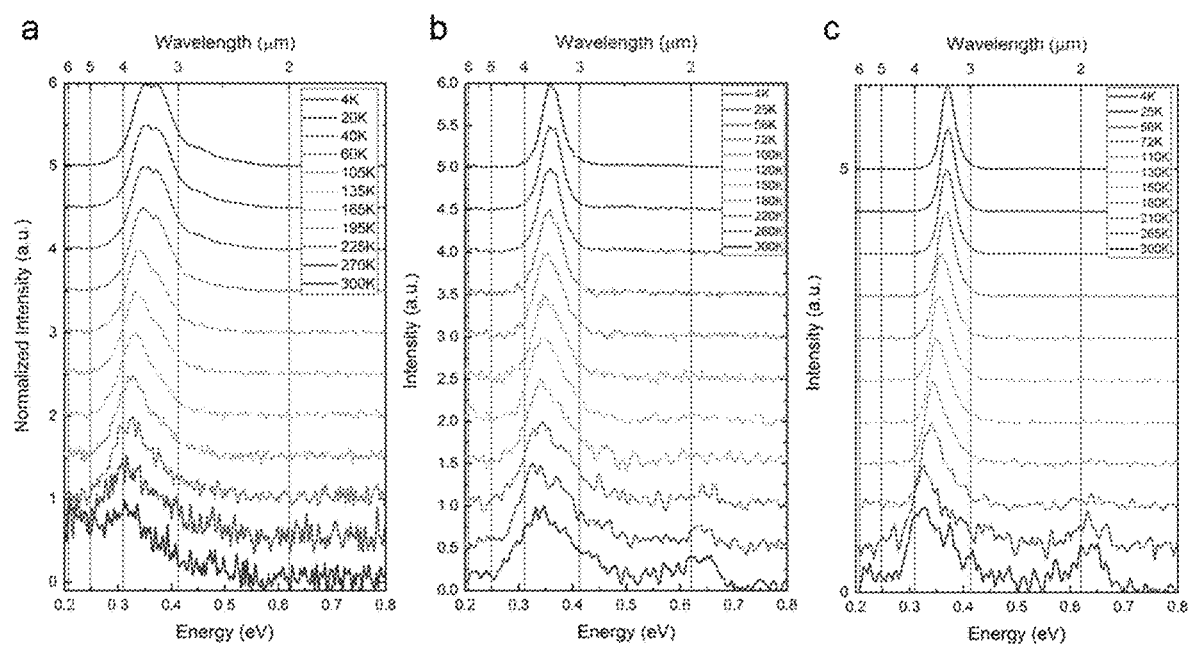
FIG. 11 depicts a comparison between different generations of Hex-Ge samples.

FIG. 11 shows a comparison between different generations of Hex-Ge samples. FIG. 11A shows the photoluminescence from the first Hex-Ge shell, which was grown using a WZ-GaP core, thus creating many defects due to a large lattice mismatch between the core and the shell. The first Hex-Ge grown on a lattice-matching GaAs shell is shown in FIG. 11B where the Hex-Ge is grown at a temperature of 600° C. FIG. 11C shows the spectra of Hex-Ge shells grown at a temperature of 650° C. further improving the optical quality.

FIG. 12 depict Arrhenius plots of Hex-$Si_{0.2}Ge_{0.8}$ with varying quality. The plots show the same data as presented in FIG. 4C, but here presented in an Arrhenius representation. For the lowest quality sample C, two non-radiative processes are found with activation energies of 16 meV and 91 meV. For sample B only a single activation energy is found of 34 meV where sample A does not show any decay in intensity over the full measured temperature range. Details of the samples are given in table S2.

Figure 13:
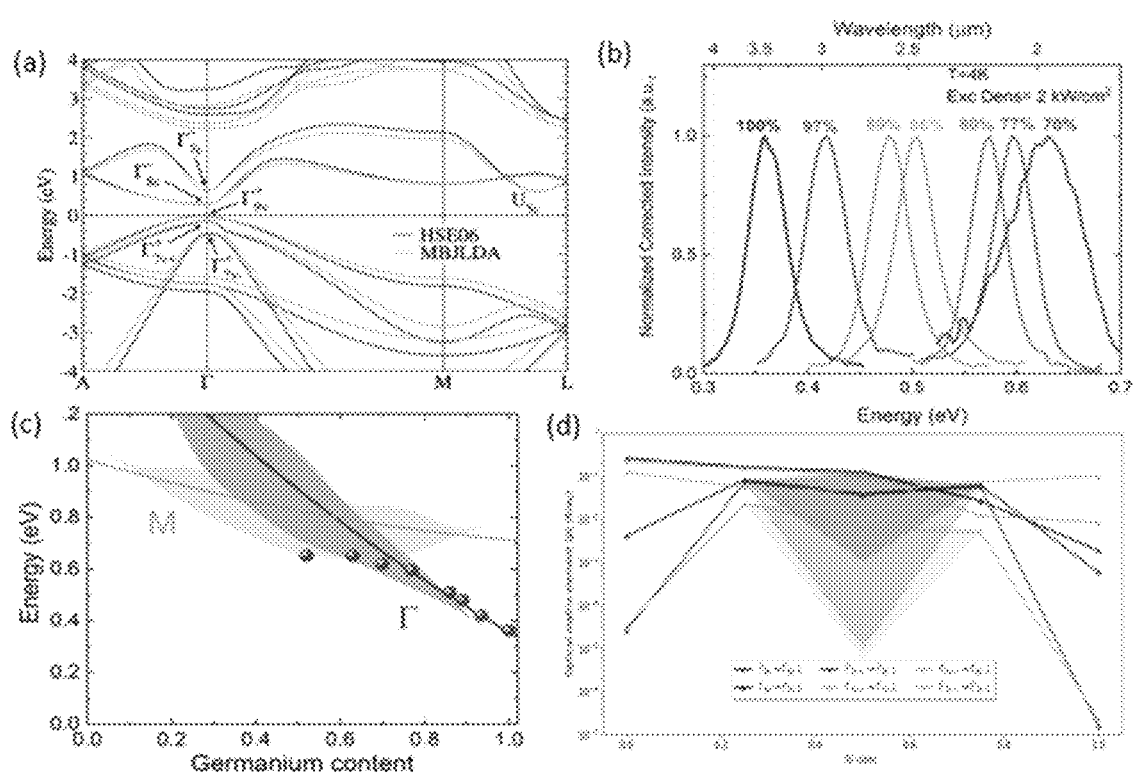
FIG. 13 depicts the calculated band structure of hexagonal Ge.

The calculated band structure of hexagonal Ge is shown in FIG. 13A. From this figure it is clear that hexagonal Ge has a direct band gap at the center of the Brillouin zone (Γ-point). In FIG. 13B the conduction band minima are calculated as a function of the $Si_{1-x}Ge_x$ composition. It is clear that for x>0.6 the material has a direct band gap. These calculations have been substantiated by photoluminescence measurements, which are shown in FIG. 13C.

The emission blue shifts with increasing Si concentration. The experimentally obtained emission energies are included in FIG. 13B as a function of the composition and the agreement with the calculations is clear. The strength of the optical process is determined by the matrix element. The calculated optical matrix elements of hexagonal $Si_{1-x}Ge_x$ compounds are shown in FIG. 13D. For 0.2<x<0.9, (actually 99-60% Ge) the $\lceil 9_v \rightarrow \lceil 8_c$ element is much higher (almost a factor of 100) than for the pure Ge and/or Si material. More specifically, compositions x>0.6 have a direct bandgap, and a band gap energy of around 0.6-0.7 eV, which is close to the telecommunication wavelength.

An aspect of the invention an optical device is characterized by hexagonal $Si_{1-x}Ge_x$ compounds with 0.6<x<0.9. This material compound is important for integration of photonic functionalities in the Silicon industry. This material can be used to fabricate light-emitting diodes (LEDs), lasers, and detectors, and can be integrated in Si technology or can be used as active device in passive optical circuitry. Application of such devices is in logic chips, telecommunication, chemical sensing, IR imaging etc.

The efficient light emission has been experimentally verified by performing time-resolved photoluminescence lifetime measurements, yielding photoluminescence lifetimes of the order of 0.5-0.8 ns for an detailed aspect of an optical device according to the invention being characterized by $Si_{0.78}Ge_{0.22}$.

Further aspects of the invention pertain to optoelectronic applications and/or optoelectronic products comprising an light emitting body or component comprised of hexagonal $Si_{1-x}Ge_x$ compounds, which more in particular exhibit a direct band gap at Brillouin zone center for 0.6<x<1.0.

Additionally according to a further aspect of the invention, the optical emitting body or component comprised of hexagonal $Si_{1-x}Ge_x$ compounds may exhibit large matrix elements for hexagonal $Si_{1-x}Ge_x$ compounds with 0.2<x<1.0.

In particular optical emitting component comprised of hexagonal $Si_{1-x}Ge_x$ compounds with the particular range 0.6<x<0.8 exhibit large oscillator strengths and a direct fundamental gap 0.6-0.8 eV, which corresponds to emission wave length 1.5-2.0 μm.

The method or process according to the invention allows fabricating or manufacturing hexagonal $Si_{1-x}Ge_x$ crystals throughout the whole range of stoichiometry of the alloy. The hexagonal crystal phase of the $Si_{1-x}Ge_x$ crystal is achieved via the "Crystal Transfer" technique where the hexagonal crystal structure of the $Si_{1-x}Ge_x$ is adopted from a hexagonal material template. According to an aspect of the method according to the invention, this is achieved by utilizing non-tapered and single-crystalline wurtzite (hexagonal) GaAs nanowires (nanowires) that act as a template and then overgrow them with an epitaxial layer of $Si_{1-x}Ge_x$ using Metal Organic Vapor Phase Epitaxy (MOVPE) technique.

Figure 14:
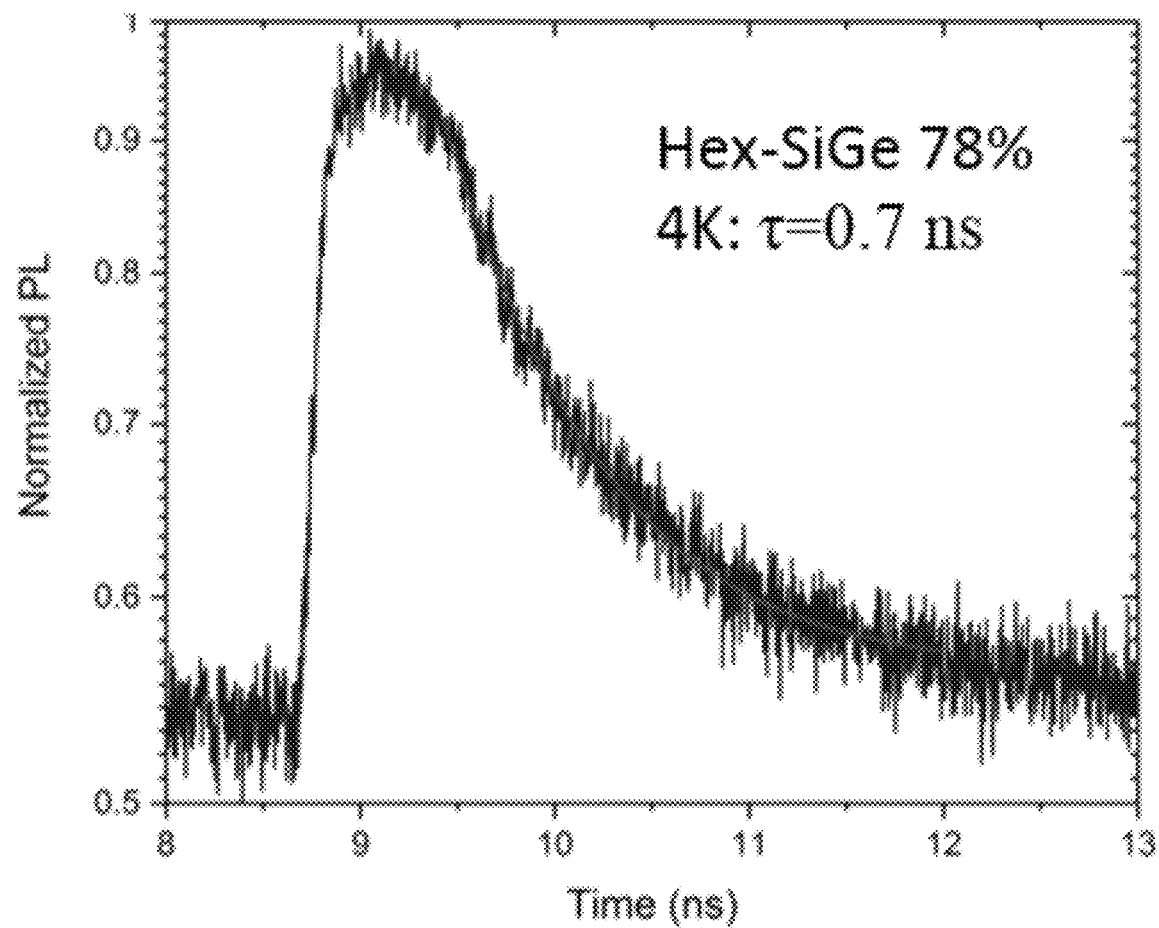
FIG. 14 depicts an experimental observation of efficient light emission for $Si_{0.78}Ge_{0.22}$.

An experimental observation of efficient light emission for an example of an optoelectronic compound according to the invention comprised of $Si_{0.78}Ge_{0.22}$ as evidenced by the 0.7 ns photoluminescence (PL) lifetime is shown in the graph of FIG. 14, whereas a schematic illustration for the full growth process according to the invention is shown in FIG. 15A-15J.

Figure 15:
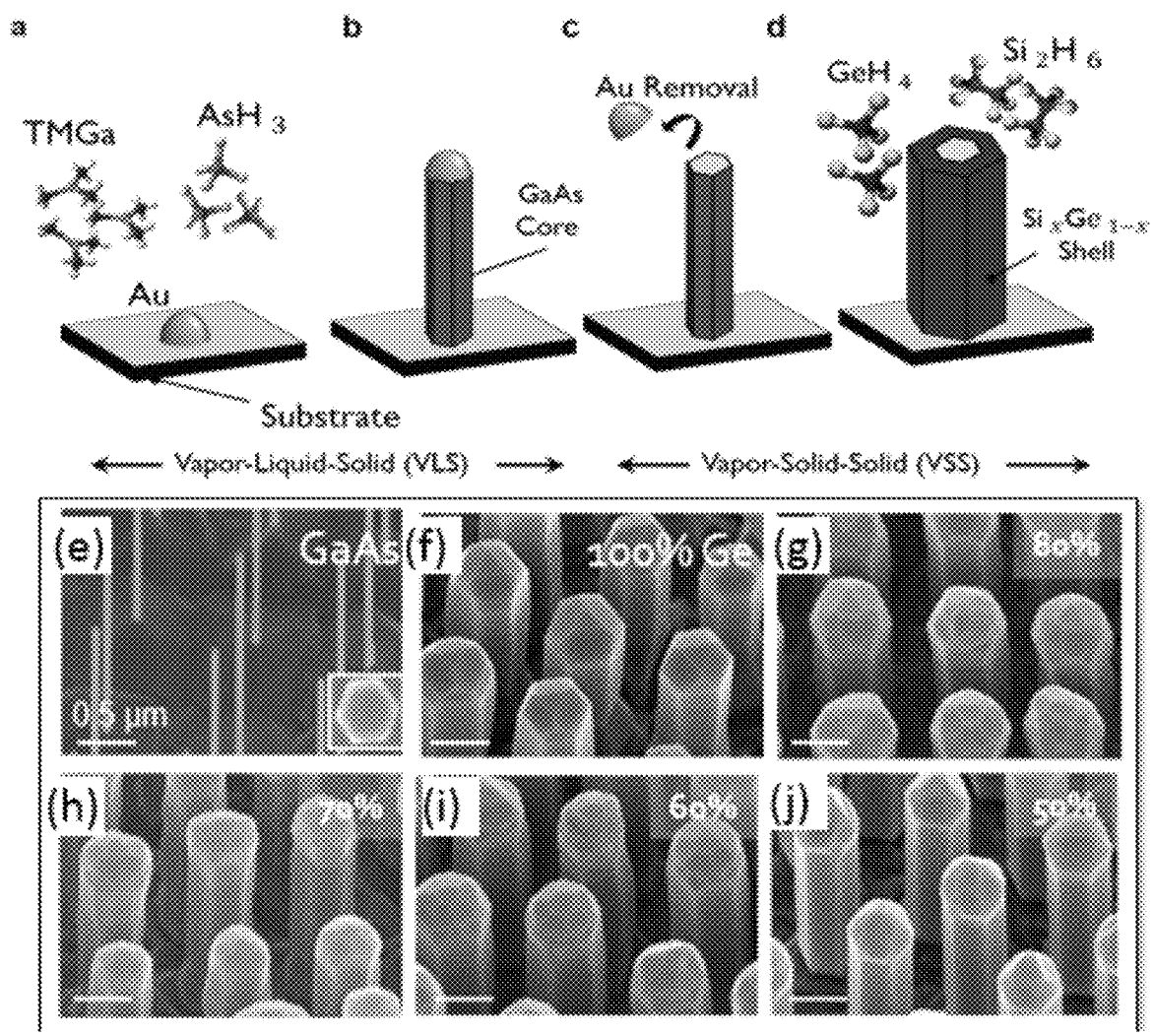
FIG. 15 shows a schematic illustration for the full growth process according to the invention.
Figure 16:
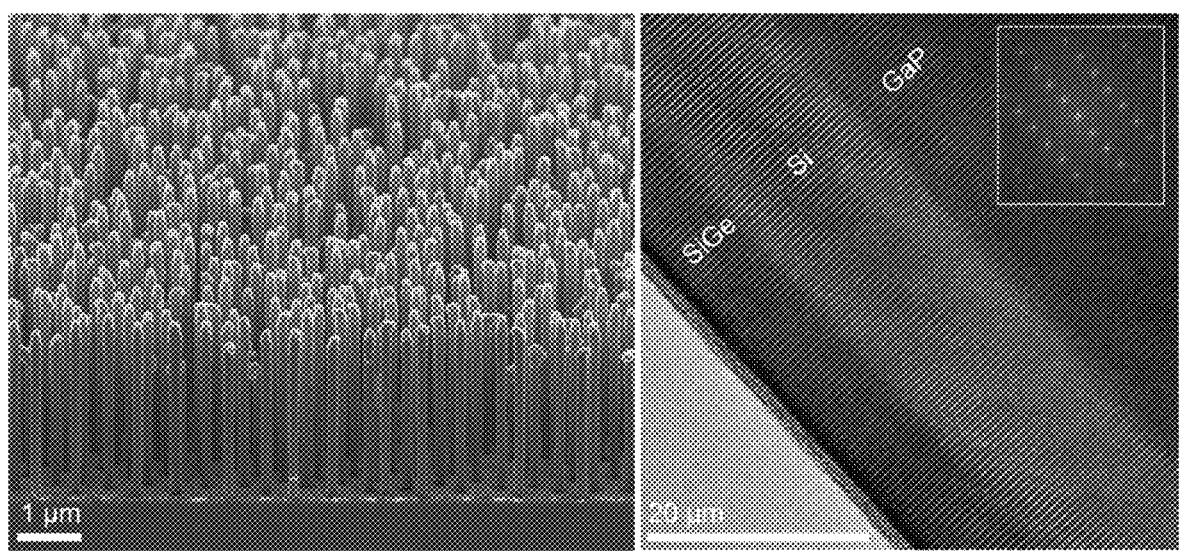
FIG. 16 depicts an image of a representative GaP/Si/SiGe core/multishell nanowire.

In an aspect of the method according to the invention the GaAs nanowires are grown by the Vapor-Liquid-Solid (VLS) mechanism utilizing gold (Au) catalyst seeds deposited in nano disks arrays arrangement on a GaAs $(111)_B$ substrate via electron beam lithography. The growth template in FIG. 15A is brought to the MOVPE reactor. Then, the gas precursors needed to grow the GaAs core nanowires (Trimethyl Gallium (TMGa) and Arsine ($A_sH_3$)) are introduced to the growth chamber as illustrated in FIG. 15A. After the GaAs nanowires are grown (see, FIG. 15B), they are chemically treated with a diluted potassium cyanide solution to remove the Au droplets to avoid gold contamination.

Eventually, the GaAs nanowire core is overgrown with the $Si_{1-x}Ge_x$ shell by introducing the suitable gas precursors of the shell growth (Germane ($G_eH_4$) and Disilane ($Si_2H_6$)) in the reactor, see FIG. 15D. The experimental realization of $Si_{1-x}Ge_x$ shells for x=0-0.5 is shown in FIG. 15F-J.

In an example of the method according to the invention the epitaxy process was performed at a reactor flow of 8.2 standard litres per minute (slm). The growth template was annealed at a surface temperature of 526° C. monitored by argus under $A_sH_3$ flow set to a molar fraction of $\chi_{AsH3}$=6.1× $10^{-3}$. Then, the growth was performed at a surface temperature of 546° C. with TMGa, and $A_sH_3$ as material precursors set to molar fractions of $\chi_{TMGa}$=1.9×$10^{-5}$, $\chi_{AsH3}$=4.55×$10^{-5}$, respectively, achieving a V/III ratio of 2.4. The $Si_{1-x}Ge_x$ crystals were grown at a surface temperature of 560° C. at a molar fraction of $\chi_{SiGe}$=1.55×$10^{-4}$.

Figure 17:
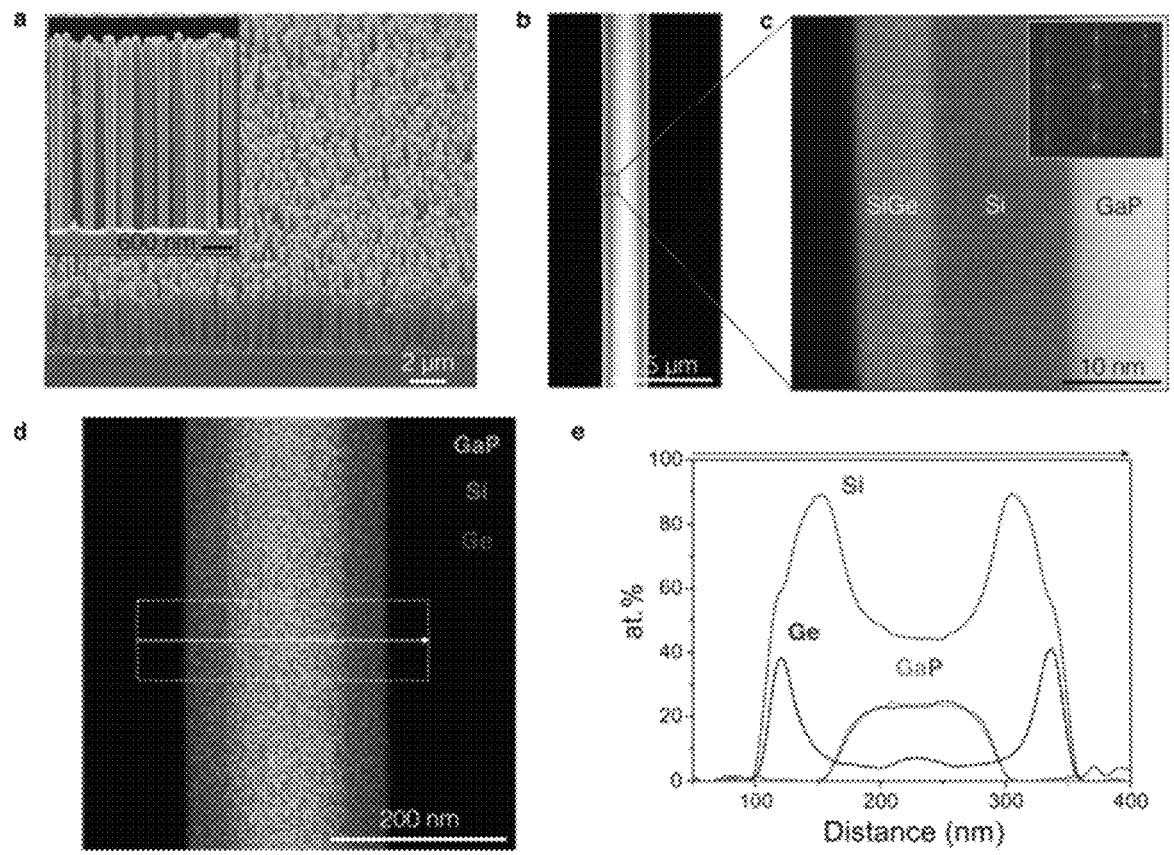
FIG. 17 depicts examples of hexagonal GaP/Si/SiGe core/multishell nanowires.

In FIG. 17A, a scanning electron microscopy (SEM) image is depicted with an array of about 7 μm long GaP/Si/SiGe core/multishell nanowires. The cross-sectional SEM image at a higher magnification (inset of FIG. 17A) shows that the nanowires are nontapered with smooth sidewalls. FIG. 17B displays a high-angle annular dark-field scanning transmission electron microscopy (HAADF STEM) image of a representative GaP/Si/SiGe core/multishell nanowire where the SiGe shell has been deposited at 600° C. The HAADF high-resolution STEM image of the SiGe/Si/GaP interfaces (FIG. 17C) viewed in the [11-20] zone axis together with the fast Fourier transform (FFT) (see inset) reveal the hexagonal phase character of the system, as well as the perfect epitaxy between the layers. The composition of the GaP/Si/SiGe core/multishell nanowires is confirmed from the energy dispersive X-ray (EDX) spectros-copy map (FIG. 17D) and the compositional line profile (FIG. 17E) extracted from the map. For this nanowire, the Ge content measured in terms of atom % is found to be 60.0±0.5 atom % in the outer shell.

Figure 18:
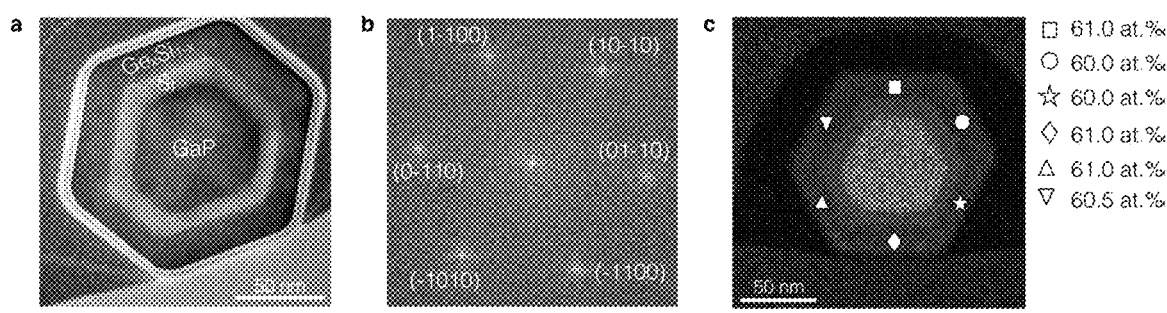
FIG. 18 depicts a cross-sectional study of GaP/Si/SiGe core/multishell nanowires.

FIG. 18 depicts a cross-sectional study of GaP/Si/SiGe core/multishell nanowires. FIG. 18A shows a bright-field TEM cross-sectional image of a representative nanowire, and FIG. 18B depicts the corresponding FFT to FIG. 18A. FIG. 18C shows the EDX chemical analysis of the same cross-section, where the Ge content in each facet has been averaged and the results in each facet are indicated by different symbols.

For a better understanding of the vapor-solid shell growth mechanism as well as for future optical characterization experiments it is important to assess the homogeneity of the Ge distribution along the entire shell. Therefor the Ge content is determined in the SiGe shell of the samples grown. To quantify the Ge content, the samples were prepared by focused ion beam (FIB) for cross-sectional TEM studies. The cross-sectional bright-field (BF) TEM image of FIG. 18A has a cross-section that has been aligned along the [0001] direction. The hexagonal symmetry of the six {1-100} facets of the SiGe shell around the Si shell and GaP core is evident (FIG. 18B). The Ge content has been evaluated averaging over positions from each of the six facets, each represented by different symbols □, ○, ☆, ◇, Δ and ∇ in FIG. 18C. From this analysis, it is found that the Ge content is uniformly distributed in the SiGe shell and in this specific case is around 60.0±0.5 atom %.

Figure 19:
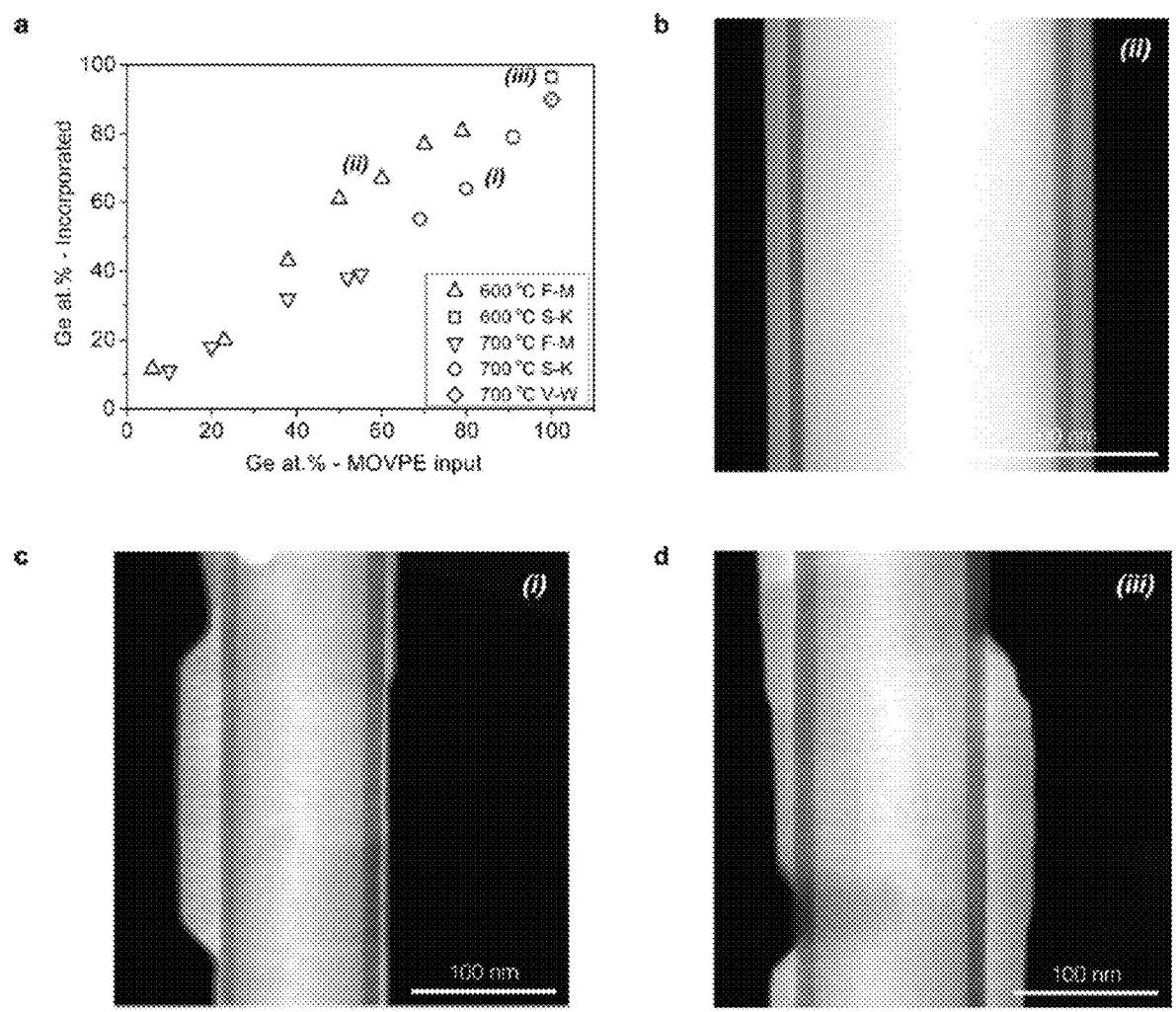
FIG. 19 depicts the incorporation of Ge into the SiGe layer or shell and growth modes.

FIG. 19 depicts the incorporation of Ge into the SiGe shell and growth modes. FIG. 19A shows along its y-axis the atom % of Ge content incorporated into the SiGe shell, as determined by EDX spectroscopy, as a function of the atom % Ge content in the precursor gas mixture in the MOVPE chamber along its x-axis. FIGS. 19B-D show HAADF STEM images of a sample grown at 600° C. at a Ge content 60 atom % input; 67 atom % incorporated exhibiting F-M growth, 700° C. at 80 atom % input; 66 atom % incorporated exhibiting S-K growth, and 700° C. at 99 atom % input; 91 atom % incorporated exhibiting V-W growth, respectively.

To further reveal the SiGe shell growth mechanism, it is useful to plot the resulting incorporated Ge content in the shell, as determined by EDX spectroscopy, as a function of the Ge content in the precursor gas flow in the MOVPE chamber, for all the heterostructures investigated. This is shown in FIG. 19A, where a higher incorporation of Ge is observed at the lower deposition temperature of 600° C. as compared to the one performed at the higher temperature of 700° C. The fact that the Ge content of the SiGe shell, for the same amount of input Ge (in the vapor phase in the precursor gas mixture) during MOVPE growth, is higher at lower temperatures can be understood as follows. The two precursor gases, namely disilane ($Si_2H_6$) and germane ($GeH_4$), have different decomposition temperatures, around 640° C. for $Si_2H_6{}^{30}$ and around 300° C. for $GeH_4$. This means that at 600° C. the $Si_2H_6$ has not been completely thermally decomposed and therefore the relative amount of Ge available that can be incorporated into the shell is higher. The net result is that at 600° C. the ratio of Ge in the SiGe shell is higher than in the precursor gas mixture. On the other hand, at 700° C. more $Si_2H_6$ has decomposed, thus more Si is available for deposition and the relative amount of Ge incorporated into the shell decreases.

A characteristic feature of the cubic Si/SiGe system is the appearance of different growth modes as the Ge content; consequently, the lattice strain increases in the SiGe shell and it is observed for the hexagonal phase as well. For most of the samples (for a Ge content of less than 80 atom % grown at 600° C. and of less than 60 atom % grown at 700° C., indicated by solid symbols in FIG. 19A), uniform layers are formed suggesting a Frank-van der Merwe (F-M) layer-by-layer growth mode. Furthermore, all the samples grown at 600° C. up to the Ge content of 80 atom % are defect-free. As can be observed in FIGS. 19A and 19C, the samples grown at 700° C. at a Ge content above 60 atom % exhibit a thin SiGe layer combined with the formation of islands. For high Ge content, the strain build-up after a few layers of layer-by-layer growth leads to strain relaxation by transitioning into island growth. This morphology is characteristic of the well-known Stranski-Krastanov (S-K) growth mode. The sample grown at 600° C. with 80 atom % Ge, which is the point where the transition from F-M to S-K growth mode takes place, is the exact point where defects start to appear, while all the samples below that are defect-free. Moreover, for the growths at 700° C., when the Ge content is above 90 atom % the SiGe shell is characterized in most cases by island growth only, therefore being dominated by the Volmer-Weber (V-W) growth mode (FIGS. 19A, 19D). It is noted that the islands (FIGS. 19C, 19D) do not seem to exhibit the typical pyramid or dome shape observed in heterostructures with the cubic crystal structure. Because the shape of the island structures formed during S-K and V-W growth depends on the surface energies, one would not expect that the same shapes would appear for the hexagonal crystal structure or for growth on a nanowire sidewall. On the other hand, it is observed that for the growths carried out at 600° C., the layer-by-layer growth continues up to a Ge content of 80 atom % (FIGS. 19A, 19B). This difference in morphology can be understood in terms of the combination of strain and different diffusion lengths of the adatoms for the different growth temperatures, which has been elaborated for metastable layers of cubic SiGe. In particular, strain increases with the Ge content in the shell and at high temperatures the adatom diffusion length is longer. Thus, adatoms can diffuse over longer distances to relieve strain by forming islands. On the other hand, at lower temperatures the adatom diffusion length is shorter, thus the adatom diffusivity is too short to form islands in the time frame available for growth. As a result, a continuous metastable layer with increasing strain is grown. In summary, from FIG. 19 it was observed that at the growth temperature of 600° C. not only is the Ge incorporation more efficient but also that layer-by-layer defect-free growth continues up to higher Ge contents, well above the expected direct band gap transition stoichiometry of about $Si_{0.35}Ge_{0.65}$.

Figure 20:
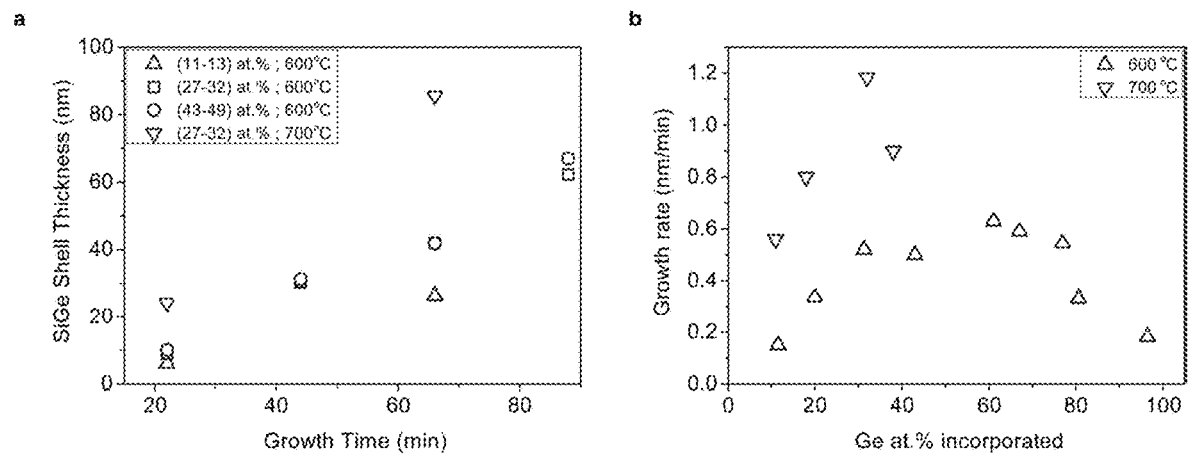
FIG. 20 depicts the linear dependence of the SiGe thickness with respect to the growth time.

The growth kinetics have been studied in more detail and especially the growth rate as a function of time and temperature. The linear dependence of the SiGe thickness with respect to the growth time indicates that the growth rate is roughly constant (FIG. 20A). This indicates that the growth rate limiting step is determined by surface kinetics rather than by, for example, volume diffusion. The growth rate depends however on the Ge content. For the growths performed at 600° C., the shell thickness at 22 min of growth is approximately independent of the Ge content. For longer growth times, the growth rates start to differ; in particular the growth rate for the samples with a Ge content in the range of 11-13 atom % is markedly smaller than for the ones with a Ge content in the range of 27-33 atom % and 43-49 atom % (for which instead the rate is almost the same). This is indicated by a smaller slope for the 11-13 atom % Ge samples, and hence results in a thinner shell. For the growths at 700° C., the thickness doubles for the region of 27-33 atom % Ge relative to the same atom % Ge region at 600° C.

In addition, the study of the growth rate was performed with a series of samples grown for the whole range of SiGe stoichiometries and for the two different temperatures of 600 and 700° C. In FIG. 20B, the growth rate is presented as a function of the Ge content for the two deposition temperatures of the SiGe shell. In terms of the Ge content, two well-differentiated regimes can be observed. First of all, a regime of low Ge content, characterized by a marked increase of the growth rate as the Ge content is increased. In this regime, strain does not influence the growth dynamics and instead the increase in growth rate can be attributed to an increase in hydrogen desorption from the growth surface due to Ge. Indeed, Ge acts to lower the activation energy of hydrogen desorption, thus freeing-up more surface sites for Si and Ge growth species. This results in an increase in the growth rate with increasing Ge content. The second regime is found in the region with a high Ge content, characterized by a decrease of the growth rate as a function of Ge content. Two different reasons have been proposed to explain this behavior; either high strain and/or decreased reactive hydride adsorption. In the first case, strain starts to play the dominant role, and the decrease in the growth rate that takes place is attributed to strain accumulation due to the very high Ge content. Note that as the lattice constant is increased, so is the diffusion energy barrier, and this makes diffusion more difficult. In turn, less diffusion implies a lower growth rate. The second reason for the decreasing growth rate at high Ge content is a decreased reactive hydride adsorption. This has been explained by a lower adsorption coefficient of the precursors, resulting in a lower growth rate. The competition between these different effects is clearly seen in FIG. 20B and is in agreement with previous studies. While the dependence of the growth rate with the Ge content of the shell shows the same trend for the two temperatures studies, 600 and 700° C., the quantitative behavior is different. In the case of the growth at high temperature (700° C.), it is found that the peak growth rate is higher, and reached for a smaller Ge content than for the growth at low temperatures (600° C.). This behavior can be understood in terms of adsorption and desorption, by a similar mechanism as that discussed above. Indeed, for higher temperatures, besides the decomposition of the precursors both the adatom diffusion and the hydrogen desorption increase, explaining the markedly higher peak growth rates for the shells grown at 700° C. Furthermore, the 700° C. curve is cut off relatively quickly due to the onset of S-K growth. In essence, FIG. 20B further solidifies the claim that for the growth at 600° C., layer-by-layer defect-free growth continues up to higher Ge contents, above $Si_{0.35}Ge_{0.65}$ where the direct band gap transition is expected to occur.

An aspect of the method according to the invention pertains to the growth of single-crystalline defect-free SiGe with or on a hexagonal diamond crystal structure. According to the invention the growth temperature leads to significant differences in the resulting SiGe layer morphology: SiGe layers grown at lower temperatures exhibit uniform layer-by-layer F-M growth, while at higher temperatures and for the same Ge content, island-based S-K growth dominates. The maximum stoichiometry achieved for defect-free smooth layer thin film growth was at 77 atom % Ge, significantly above the predicted direct band gap transition at 65 atom % Ge. Moreover, it is observed that layer growth continues to this high value significantly more at the growth temperature of 600° C. Therefor this allows for the utilization of hexagonal SiGe in optoelectronic applications.

Examples of the GaP/Si/SiGe core/multishell nanowires according the invention were developed in a low-pressure (50 mbar) Aixtron Close Coupled Showerhead (CCS) MOVPE reactor. In this case though, the Si shell thickness was kept to a minimum of 10-12 nm. This could potentially act as sacrificial buffer layer to trap any P or Ga species from the GaP core from diffusing into the SiGe shell.

Directly after the growth of the Si shell and in the same growth run, the SiGe shell was grown. This was done by switching off the $Si_2H_6$ precursor gas and gradually lowering the temperature of the MOVPE growth chamber to either 600 or 700° C. Once the aimed temperature was reached and stabilized, $Si_2H_6$ and $GeH_4$ were introduced to the chamber and their flows were adjusted to suit the desired stoichiometry. $Si_2H_6$ molar flow was modified from $2.87\times10^{-7}$ at the low end to $1.00\times10^{-4}$ at the high end, whereas $GeH_4$ was modified from $3.66\times10^{-6}$ at the low end to $3.33\times10^{-4}$ at the high end in order to achieve the desired ratio. Hydrogen ($H_2$) was used as a carrier gas for the precursors and the total flow into the rector was 8.2 L/min. At the end of the SiGe shell growth, the precursor flows were terminated, the heating elements were switched off and the chamber was allowed to cool down to room temperature.

For the Transmission Electron Microscopy, TEM, studies, two different sample preparation methods were used. In the standard axial analysis, nanowires were mechanically transferred to a holey carbon TEM grid. Concerning the cross-section TEM studies, nanowires were prepared using FIB. In both cases, HRTEM and STEM analyses were conducted using a JEM ARM200F aberration-corrected TEM operated at 200 kV. For the chemical analysis, EDX measurements were carried out using the same microscope equipped with a 100 $mm^2$ EDX silicon drift detector.

TEM Lamellae. TEM lamellae were prepared in a FEI Nova Nanolab 600i Dualbeam system. For this, the nanowires were initially transferred with the aid of a nanomanipulator from the growth substrate to a piece of Si and then arranged to lie parallel to each other. These nanowires were covered with electron- and ion-beam induced metal deposition to protect them during the procedure. The lamella was cut out by milling with 30 kV Ga ions and thinned down with subsequent steps of 30, 16, and 5 kV ion milling in order to minimize the Ga-induced damage in the regions imaged with TEM.

In another example according to the invention, high-quality defect-free lonsdaleite Si and Ge can be grown on hexagonal nanowire substrates. These hexagonal phases of group-IV semiconductors exhibit improved electronic and optical properties for optoelectronic applications. While lonsdaleite Si is a well-characterized indirect semiconductor, experimental data and reliable calculations on lonsdaleite Ge are scarce and not consistent regarding the nature of its gap. Using ab initio density-functional theory described above, accurate structural, electronic, and optical properties for hexagonal Ge can be determined. Given the well-known sensitivity of electronic-structure calculations for Ge to the underlying approximations, the performance of several exchange-correlation functionals, including meta-GGA and hybrid functionals can be tested. It is validated for cubic Ge, obtaining atomic geometries and band structures in agreement with available experimental data. The same approach is applied to predict electronic and optical properties of lonsdaleite Ge. According to a further aspect of the invention, an optoelecionic device comprised of lonsdaleite Ge as a direct semiconductor with only weakly dipole-active lowest optical transitions, small band gap, huge crystal-field splitting, and strongly anisotropic effective masses. The unexpectedly small direct gap and the oscillator strengths of the lowest optical transitions are explained in terms of symmetry and back-folding of energy bands of the diamond structure.

The integration of a material featuring efficient interaction with light into Si technology is of high technological interest. In fact, the copper interconnect between transistors on a chip has become a bigger challenge than reducing transistor size. A possible solution to this critical bottleneck are optical interconnects. Si in the diamond structure is an indirect band-gap material and cannot be used for this purpose. Several attempts to obtain light emission from Si in the telecommunication band had only limited success.

Si and Ge, despite their chemical similarity, are very different from an optical perspective. Ge, one of the most important and widely used semiconductors, crystallizes like Si in the cubic diamond structure (space group $Fd\bar{3}m$) with an indirect band gap of about 0.7 eV under ambient conditions. Diamond-structure Ge is characterized by a poor light-emission efficiency because of the indirect nature of its fundamental band gap. However, its direct band-gap energy is close to the indirect one, and significant engineering efforts are being made to convert Ge into an efficient gain material monolithically integrated on a Si chip. To raise the interest in Ge for possible active optoelectronic applications, e.g. in light-emitting diodes or lasers, the k-selection rule that forbids optical dipole transitions at the minimum band gap of Ge has to be broken. To this end, ingenious approaches have been proposed, for instance, based on straining, nanostructuring, or amorphization.

Figure 21:
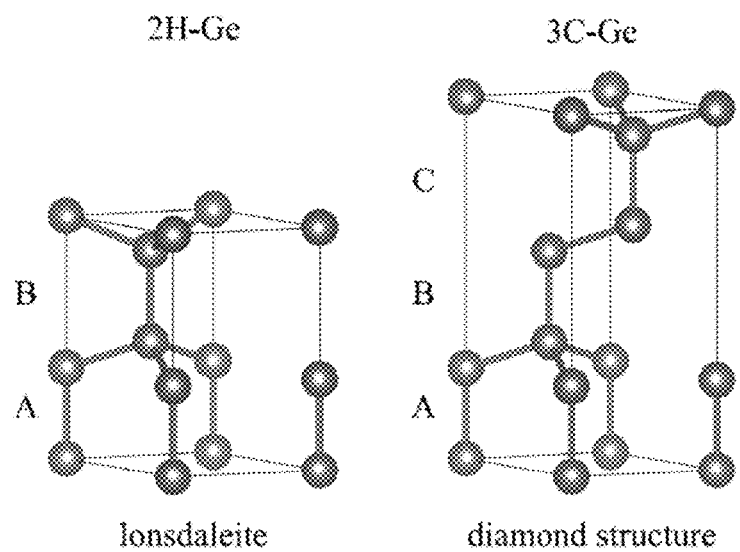
FIG. 21 depicts the atomic bilayer stacking in the lonsdaleite (2H) and diamond-structure (3C) phase of Ge, wherein the figures of the crystal structures have been produced with VESTA.

Besides the thermodynamically stable diamond structure, other metastable allotropes of Ge have been explored for optical applications. Ge in the hexagonal lonsdaleite structure (space group P63/mmc), occasionally also called wurtzite Ge, is attracting increasing attention as a promising material for optoelectronics. In the lonsdaleite phase, the Ge atoms feature the same tetrahedral nearest-neighbor coordination as in the cubic diamond structure, but, instead of an ABC stacking of adjacent Ge bilayers along the threefold symmetry axis, the lonsdaleite phase is characterized by an AB stacking. Therefore, reference is made to cubic Ge in the diamond structure also as 3C-Ge and to hexagonal Ge in the lonsdaleite structure as 2H-Ge (see FIG. 21). Lonsdaleite Ge was first obtained at low pressure using ultraviolet laser ablation. Recently, it has been grown on top of a template of wurtzite-GaP nanowires in form of core-shell nanowires, similarly to what had already been achieved for lonsdaleite Si. Other routes towards hexagonal Ge nanowires have also been suggested. Moreover, exploiting strain-induced phase transformations, Ge nanowires featuring homojunctions of different polytypes can be synthesized.

In the hexagonal Brillouin zone (BZ) of the lonsdaleite structure, the L point of the diamond-structure BZ that lies on the cubic [111] axis is mapped onto the G point. Therefore, the lowest conduction-band minimum (CBM) at the L point of cubic Ge is folded onto the G point rendering 2H-Ge a direct-gap semiconductor. Comparing hexagonal Si and Ge, it seems that breaking the k-selection rule is easier in Ge, since the original and the backfolded conduction band are energetically very close. The exact ordering of the lowest conduction bands at G is extremely important, as the electron radiative lifetime of the material strongly depends on the symmetry of these states.

Together with optical emission or absorption measurements for photon energies comparable with the size of the band gap, accurate electronic-structure calculations can provide detailed answers concerning conduction-band ordering and the strength of optical transitions. Despite the fact that Ge is an elemental material, the experience acquired with calculations of diamond-structure Ge proves that Ge is a difficult system for accurate band-structure studies. On the one hand, it is essential to account for spin-orbit coupling (SOC) and to treat the shallow Ge 3d shell as valence electrons. On the other hand, the approximations used to describe exchange and correlation (XC) contributions to the electron-electron interaction significantly influence the k-space position of the lowest conduction-band minimum and the size of the direct and indirect gaps.

Applying density-functional theory (DFT), a Kohn-Sham (KS) band structure obtained within the local-density approximation (LDA) or any flavor of the generalized gradient approximation (GGA) is not sufficient, as the system is erroneously predicted to be metallic in this case. Moreover, the band gap is extremely sensitive to the value of the lattice constant. Therefore, an accurate description of the atomic geometry is indispensable. More sophisticated approaches, beyond semi-local XC functionals, are needed to obtain reliable quasiparticle states.

In fact, 3C-Ge band structures have also been computed approximating the XC self-energy within Hedin's GW approximation, and it is expected this state-of-the-art approach for excited states to work also for lonsdaleite Ge. However, the computational cost coming along with Green's function calculations is very high and would likely make their application to more complex systems (such as alloys, doped or defective crystals, surfaces, or interfaces) unfeasible. It is remarked that also the empirical-pseudopotential method (EPM), widely used for 3C-Ge, can be helpful at a reduced computational cost. However, empirical approaches that very accurately reproduce experimental data for 3C-Ge would need additional assumptions to be reliably applied to 2H-Ge.

A careful analysis of the electronic and optical properties of 2H-Ge is presented, with a particular focus on the choice of accurate and computationally efficient XC functionals for ground-state and excited-state calculations. The functionals are first tested against experimental data for 3CGe. They are then used for a careful analysis of the electronic and optical properties of 2H-Ge. In view of potential optoelectronic applications, special interest is given to conduction-band ordering, direct and indirect band gaps, band splittings, effective masses, optical transition strengths, and radiative lifetimes.

All calculations were performed with the Vienna Abinitio Simulation Package (VASP) with the projector-augmented wave (PAVV) method and a plane-wave cutoff of 500 eV. The shallow Ge 3d electrons were explicitly included as valence electrons. BZ integrations were carried out using 12×12×12 (3C-Ge) or 12×12×6 (2H-Ge) r-centered k points (unless otherwise stated), ensuring a convergence of total energies to 1 meV/atom. Atomic geometries and elastic properties were calculated with (semi-)local XC functionals, using the LDA as well as the GGA parametrizations PBE, PBEsol (a modified version of the PBE functional optimized for solids), and AM05.

The ground-state atomic structures, the isothermal bulk modulus $B_0$, and its pressure derivative $B'_0$ were determined by a series of fixed-volume relaxations and a subsequent fit of the resulting energy-over-volume curve to the Vinet equation of state (EOS). The internal cell parameters were relaxed until the Hellmann-Feynman forces drop below 1 meV/Å. It was found that the inclusion of SOC has essentially no impact on the lattice parameters and only a minor effect on the elastic constants. This observation is in line with general conclusions for other simple solids and zincblende-type semiconductors.

It is well known that KS band structures calculated in the LDA or GGA significantly underestimate all band gaps and interband transition energies. Quasiparticle calculations in the state-of-the-art GW approximation, on the other hand, are challenging and computer-time consuming for Ge, due to the necessity to include SOC, to account for the 3d electrons, and to calculate the full dynamical screening.

What is more, the GW quasiparticle band structures need to be computed self-consistently to overcome the problem of the negative fundamental gap in the LDA/GGA starting electronic structure of both 3C-Ge and 2H-Ge (see Sections III and IV). One reason for the negative gaps is the overestimation of the p-d repulsion. This is a direct consequence of the underestimated binding energy of the Ge 3d electrons within LDA or GGA, which pushes the p-like valence-band maximum (VBM) towards higher energies. An improved description of the localized d states can be achieved within the DFT+U method with a Hubbard parameter U for the 3d electrons which comes at the price of introducing a tunable parameter. The DFT+U method was tested in the Dudarev approach using a small but reasonable value U=1.3 eV, which reproduces the lattice constant of 3C-Ge and is in rough agreement with the picture of an atomic Coulomb integral of about $U^{atom}$=15 eV screened by the bulk Ge dielectric constant.

The HSE06 hybrid functional was used with a fraction a=0.25 of short-range Fock exchange and an inverse screening length µ=0.2 Å$^{-1}$ to calculate reliable band structures for cubic and hexagonal Ge. It has been shown that the HSE06 functional yields reasonable indirect and direct gaps for Ge and many other sp semiconductors. The most important contribution to the gap opening within the GW approach is due to the screened-exchange part of the electronic self-energy. The Coulomb hole, the second contribution to the GW self-energy, mainly influences the absolute position of the one-particle energies. In the HSE06 functional, the fraction a of Fock exchange simulates the important non-locality feature of the self-energy and the screening of the electron-electron interaction by an average dielectric constant of 1/a.

As a computationally cheap alternative to hybrid functionals, we also consider the meta-GGA functional MBJLDA of Tran and Blaha that is based on the modified Becke-Johnson (MBJ) exchange functional. The MBJLDA functional does not only give reasonable band gaps for 3C-Ge but also for other semiconductors. The strongly reduced computational cost allows for the application of the MBJLDA functional to more complex systems. In particular in the context of potential optoelectronic applications of 2H-Ge, also strained, disordered, or defective systems with larger supercells become computationally accessible. Moreover, both the hybrid and the meta-GGA functional allow for an easy inclusion of SOC.

Having in mind optoelectronic applications (e.g. lasing), the global optical emission properties of 2 H-Ge near the fundamental absorption edge can be characterized by the optical transition matrix elements of the near-edge transitions and the radiative lifetime of the material. Here, the optical transition matrix elements are calculated in the longitudinal gauge. They are given as matrix elements <ck|p|vk> of the momentum operator p between conduction band c and valence band v at a given k point.

The optical matrix elements at the G point can be linked to characteristic quantities from k:p perturbation theory introducing the average of the squared momentum matrix element over spin-orbit degenerate states i, j=1,2 in the conduction and valence bands at the zone center, $$p^{\perp/\parallel} = \sqrt{\frac{1}{2}\sum_{c_i v_j} |\langle c_i k = 0|p^{\perp/\parallel}|v_j k = 0\rangle|^2} . \qquad (1)$$

Then, the Kane energy reads $$E_p^{\perp/\parallel} = \frac{2}{m}(p^{\perp/\parallel})^2 \qquad (2)$$

and the (dimensionless) optical oscillator strength $$f^{\perp/\parallel} = \frac{E_p^{\perp/\parallel}}{\varepsilon_{ck=0} - \varepsilon_{vk=0}}, \qquad (3)$$

where ⊥/∥ stands for light polarized perpendicular/parallel to the c axis of the lonsdaleite structure. For 3C-Ge, these two directions are equivalent due to the isotropy of the material.

The radiative lifetime τ at temperature T, as a global measure for the light-emission properties of a material, is given by the thermally averaged recombination rate:

$$\frac{1}{\tau} = \sum_{cvk} A_{cvk} \frac{w_k e^{-(\varepsilon_{ck}-\varepsilon_{vk})/(k_B T)}}{\sum_{cvk} w_k e^{-(\varepsilon_{ck}-\varepsilon_{vk})/(k_B T)}}, \qquad (41)$$

where $A_{cvk}$ denotes the radiative recombination rate for vertical optical transitions between a conduction state |ck> and a valence state |vk> with the one-particle energies $\varepsilon_{ck}$ and $\varepsilon_{vk}$ and k-point weight $w_k$. The radiative recombination rate reads $$A_{cvk} = n_{eff} \frac{e^2(\varepsilon_{ck} - \varepsilon_{vk})}{\pi\varepsilon_0 \hbar^2 m^2 c^3} \frac{1}{3}\sum_{j=x,y,z} |\langle ck|p_j|vk\rangle|^2. \qquad (5)$$

with $n_{eff}$ the refractive index of the effective medium consisting of the Ge sample and its environment (set to 1 in the following). The squares of the momentum matrix elements are averaged over all directions corresponding to the emission of unpolarized light. Eq. (5) is given in the independent-(quasi)particle approximation, i.e., neglecting excitonic effects, which, however, can be easily taken into account. In Eq. (4), it is assumed that the thermalization of electrons and holes after their injection is more efficient than the radiative (or nonradiative) recombination. Whereas the convergence of the radiative lifetimes with the number of bands is very fast, we need 72×72×72 (3C-Ge) or 72×72×36 (2HGe) k points to sample the BZ with sufficiently high accuracy.

As to the diamond-structure of germanium, the lattice constant, elastic properties, and cohesive energy of 3C-Ge have been calculated with various XC correlation functionals (see Table S4). Comparing with experimental values, the expected tendencies are visible: The LDA tends to overbind, whereas the inclusion of gradient corrections, in particular within PBE, leads to an underestimation of the strength of the chemical bonds. The functionals PBEsol and AM05 yield the best agreement with experiment. However, they still slightly overestimate the experimental lattice constant. Further improvement can be obtained by DFT+U calculations (see Table S4) at the price of introducing the adjustable parameter U. Also the isothermal bulk modulus $B_0$, its pressure derivative $B'_0$, and the cohesive energy are consistent with experiment.

Figure 22:
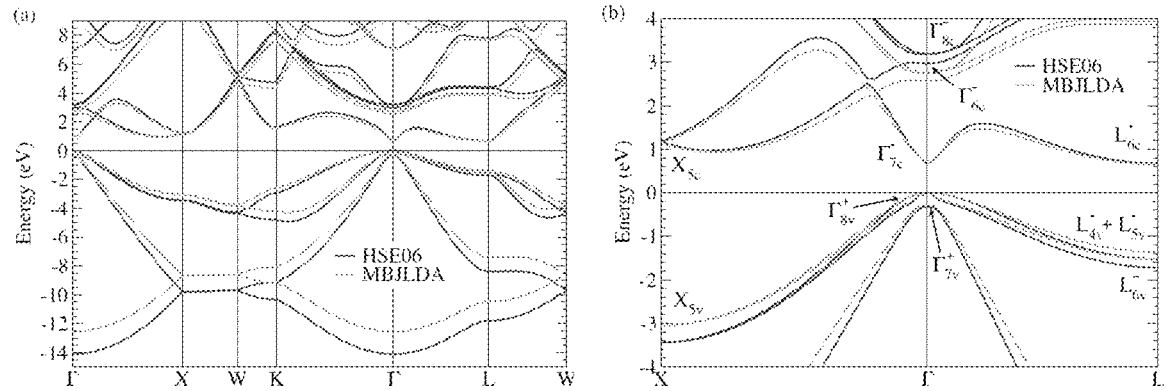
FIG. 22 depicts the band structure of 3C-Ge computed with the HSE06 and MBJLDA functionals (a). The irreducible representations of relevant high-symmetry states in the band-gap region are given in the double-group notation, and wherein the VBM is set to zero.

Subsequently, the band structure of 3C-Ge including SOC was calculated using the PBEsol, HSE06, and MBJLDA functionals at the PBEsol lattice constant (see FIG. 22 and Table S5).

TABLE S4

Lattice constant $a_0$, isothermal bulk modulus $B_0$, its pressure derivative $B'_0$, and cohesive energy $E_{coh}$ of 3C—Ge. Experimental (Exp.) values are given for comparison.

| Method | $a_0$ (Å) | $B_0$ (GPa) | $B'_0$ | $E_{coh}$ (eV/at.) |
|---|---|---|---|---|
| LDA | 5.626 | 71.8 | 4.92 | 4.63 |
| PBE | 5.760 | 58.7 | 5.01 | 3.73 |
| PBEsol | 5.673 | 67.3 | 4.89 | 4.15 |

TABLE S4-continued

Lattice constant $a_0$, isothermal bulk modulus $B_0$, its pressure derivative $B'_0$, and cohesive energy $E_{coh}$ of 3C—Ge. Experimental (Exp.) values are given for comparison.

| Method | $a_0$ (Å) | $B_0$ (GPa) | $B'_0$ | $E_{coh}$ (eV/at.) |
|---|---|---|---|---|
| AM05 | 5.677 | 65.7 | 4.82 | 3.92 |
| PBEsol + U | 5.652 | 68.7 | 4.86 | 4.15 |
| AM05 + U | 5.656 | 67.2 | 4.87 | 3.91 |
| Exp. | 5.658[a] | 75.0[b] | | 3.85[c] |
| | 5.652[d] | 64.7[e] | 5.0(1)[e] | |
| | | 77(4)[f] | 4.3(1.0)[f] | |

[a]X-ray diffraction at T = 298.15 K [65].
[b]Obtained from ultrasonic measurements of the elastic moduli $C_{11}$ and $C_{12}$ at ambient pressure at T = 298.15 K [66] using the relation $B_0 = (C_{11} + 2C_{12})/3$.
[c]From Ref. [67].
[d]X-ray diffraction at T = 10 K [68].
[e]From fitting an EOS to room-temperature experimental data for various pressures [69].
[f]From fitting the Vinet EOS to room-temperature experimental data for various pressures [70].

The states at the high-symmetry points of the BZ are labeled according to the double-group notation. The small difference between the PBEsol and the experimental lattice constant corresponds to an isotropic tensile strain of <0.4%. The volume deformation potential for the direct gap (the most volume-sensitive band-to-band transition) amounts to −9.0 eV (MBJLDA) implying that differences in the direct gap due to the discrepancy in the lattice constant are smaller than 0.1 eV. For the sake of comparability, all calculations of electronic and optical properties presented in the following are based on the PBEsol lattice constant.

GGA functionals like PBEsol yield a negative KS band gap for 3C-Ge in contradiction to experimental findings (cf. Table S5) which is why they are unsuitable for the description of the electronic structure of this material. The band ordering, band energies, and spin-orbit splittings Dso obtained with the more sophisticated HSE06 functional agree well with experimental results. Comparing HSE06 and MBJLDA band structures close to the fundamental gap, we find similar indirect ($\Gamma_{8v}^+ \to L_{6c}^+$) and direct ($\Gamma_{8v}^+ \to \Gamma_{7c}^-$) band gaps. Also the spin-orbit splittings of the p states are much the same. Further away from the band-gap region, the discrepancy between HSE06 and MBJLDA band energies increases. This is, however, not a crucial problem here, since we are mostly interested in optoelectronic properties that are governed by the electronic structure in the vicinity of the band gap. In particular, the ordering of the $\Gamma_{7c}^-$ and $L_{6c}^+$ conduction-band minima is correct, only their energy distance is slightly underestimated compared to experiment (independent of temperature). Note that GW corrections on top of HSE06 or MBJLDA band structures are known to overestimate the gaps.

In Table S5, the electron and hole effective masses of relevant band extrema are compiled. Besides the band masses at the G point, also the masses of the conduction-band minimum at the L point parallel and perpendicular to the L-G line are given. The masses have been derived from the corresponding HSE06 and MBJLDA band structures. The HSE06 masses are in excellent agreement with experimental values. The MBJLDA functional slightly overestimates the experimental band masses which is in line with previous observations and the generally lower band widths in the MBJLDA calculation compared to the HSE06 calculation (cf. FIG. 22).

Considering the findings for 3C-Ge, we rely on the PBEsol functional for the structural properties of 2H-Ge. The HSE06 and MBJLDA functionals will be used to study the electronic and optical properties of lonsdaleite Ge. This strategy is corroborated by the fact that both allotropes of Ge feature similar chemical bonding properties, i.e. they are both insulators with tetrahedral coordination. Therefore, the performance of the functionals should be largely transferable.

TABLE S5

Band energies and spin-orbit induced band splittings $\Delta_{so}$ of 3C—Ge at high-symmetry points of the BZ calculated with the PBEsol, HSE06, and MBJLDA functionals at the PBEsol lattice constant. Experimental low- and room-temperature values are provided for comparison. All values in eV.

| State | PBEsol | HSE06 | MBJLDA | Experiment low temperature | Experiment room temperature |
|---|---|---|---|---|---|
| $\Gamma_{7v}^+$ | −0.292 | −0.314 | −0.270 | −0.297[a] | |
| $\Gamma_{8v}^+$ | 0.000 | 0.000 | 0.000 | | |
| $\Gamma_{7c}^-$ | −0.174 | 0.678 | 0.705 | 0.887(1)[a], 0.898(1)[b] | 0.805(1)[b] |
| $\Gamma_{6c}^-$ | 2.296 | 2.969 | 2.564 | | |
| $\Gamma_{8c}^-$ | 2.508 | 3.189 | 2.760 | $\Gamma_{6c}^-$ + 0.200[a] | |
| $\Delta_{so}(\Gamma_{8v}^+ - \Gamma_{7v}^+)$ | 0.292 | 0.341 | 0.270 | 0.297[a] | |
| $\Delta_{so}(\Gamma_{8c}^- - \Gamma_{6c}^-)$ | 0.212 | 0.220 | 0.196 | 0.200[a] | |
| $L_{6v}^-$ | −1.585 | −1.719 | −1.530 | | |
| $L_{4v}^- + L_{5v}^-$ | −1.401 | −1.519 | −1.359 | $L_{6v}^-$ + 0.228[a] | |
| $L_{6c}^+$ | 0.005 | 0.675 | 0.653 | 0.744(1)[b] | 0.6643[c] |
| $\Delta_{so}(L_{4v+5v}^- - L_{6v}^-)$ | 0.184 | 0.200 | 0.171 | 0.228[a] | |
| $X_{5v}$ | −3.155 | −3.441 | −3.047 | | |
| $X_{5c}$ | 0.585 | 1.177 | 1.142 | | |

[a]Schottky-barrier electroreflectance at 10 K [72].
[b]Magnetoabsorption at 1.5 K and 293 K [73].
[c]Optical absorption-edge fine structure at 291 K [74].

TABLE S6

Effective electron and hole masses of 3C—Ge in units of the free electron mass m. The VBM at $\Gamma$ splits into a heavy hole ($m_h^{hh}$), light hole ($m_h^{lh}$), and spin-orbit split-off hole ($m_h^{so}$). The heavy-hole and light-hole masses are averaged over the $\Gamma$-X and $\Gamma$-L directions. The masses of the conduction-band minimum at L are given both parallel ($m_e^{\parallel}$) and perpendicular ($m_e^{\perp}$) to the L-$\Gamma$ direction.

| Mass | HSE06 | MBJLDA | Exp. |
|---|---|---|---|
| $m_h^{so}(\Gamma_{7v}^+)$ | 0.097 | 0.122 | 0.095(7)[a] |
| $m_h^{lh}(\Gamma_{8v}^+)$ | 0.043 | 0.059 | 0.0438(30) B∥[100][b] |
| | | | 0.0426(20) B∥[111][b] |
| | | | 0.0430(30) B∥[110][b] |

TABLE S6-continued

Effective electron and hole masses of 3C—Ge in units of the free electron mass m. The VBM at Γ splits into a heavy hole ($m_h^{hh}$), light hole ($m_h^{lh}$), and spin-orbit split-off hole ($m_h^{so}$). The heavy-hole and light-hole masses are averaged over the Γ-X and Γ-L directions. The masses of the conduction-band minimum at L are given both parallel ($m_e^{\|}$) and perpendicular ($m_e^{\perp}$) to the L-Γ direction.

| Mass | HSE06 | MBJLDA | Exp. |
|---|---|---|---|
| $m_h^{hh}(\Gamma_{8v}^+)$ | 0.203 | 0.233 | 0.284(1) B∥[100][b] |
|  |  |  | 0.376(1) B∥[111][b] |
|  |  |  | 0.352(4) B∥[110][b] |
| $m_e(\Gamma_{7c}^-)$ | 0.034 | 0.047 | 0.0380(5)[a] |
| $m_e^{\|}(L_{6c}^+)$ | 1.573 | 1.728 | 1.588(5)[c], 1.59[d] |
| $m_e^{\perp}(L_{6c}^+)$ | 0.090 | 0.096 | 0.08152(8)[c], 0.0823[d] |

[a]Piezomagnetoreflectance at 30 K [75].
[b]Cyclotron resonance at 4 K with magnetic field B oriented in various directions [76].
[c]Cyclotron resonance at 1.4 K [77].
[d]Magnetophonon resonance at 120 K [78].

As to the atomic geometry and bonding lonsdaleite Germanium, the positions of the four atoms in the unit cell of the lonsdaleite structure are defined by the hexagonal lattice constants a and c, as well as the dimensionless internal cell parameter u. In Table S7, the results of the calculations of the structural properties of 2H-Ge with various XC functionals are compiled. As already discussed for 3C-Ge, a consistent over- and underestimation of bond lengths depending on the choice of the functional is observed. These tendencies are also reflected in the values for the cohesive energy $E_{coh}$ and the bulk modulus $B_0$.

On average, the bond lengths of 2H-Ge are slightly reduced in comparison to the 3C-Ge bond length $d_\perp = \sqrt{3}/4 a_0$. This can be understood in terms of a detailed analysis of the atomic geometry. The Ge-Ge bonds parallel to the c axis (bond length $d_\| = \mu c$ and those not parallel to the c axis (bond length $d_\perp = \sqrt{a^2/3 + (1/2 - u)^2 c^2}$) form distorted tetrahedra. All bonds in the distorted tetrahedra have the same length only when $u = 1/4 + 1/3(c/a)^{-2}$ holds. For the ideal lonsdaleite structure with $(c/a)_{ideal} = \sqrt{8/3}$ and $u_{ideal} = \sqrt{3/8}$, also the bond angles become equal and the coordination tetrahedra are regular.

It can be deduced from Table S7 that $c/a > (c/a)_{ideal}$ and $u < u_{ideal}$. The relation $d_\perp < d < d_\|$ holds, resulting in tetrahedral that are slightly elongated along the c axis. For instance, we find $d_\perp = 2.451$ Å and $d_\| = 2.468$ Å for the PBEsol functional. The average bond length $d_{av} = 2.455$ Å of 2H-Ge is only slightly smaller than the 3C-Ge bond length $d = 2.457$ Å. These findings are in line with the empirical rule of Lawaetz for III-V semiconductor compounds, which states that materials with $c/a > (c/a)_{ideal}$ favor a zincblende ground-state structure, or for an elemental materials as Ge, the diamond structure. The computed values of u nearly follow the relation $u = 1/4 + 1/3(c/a)^{-2}$ indicating that the deformation of bonding tetrahedra in 2H-Ge can be explained to a good share by deviations of the bond angles from the ideal value.

In summary, a relatively strong hexagonal crystal deformation in 2H-Ge is observed, which is characterized by large $(c/a > (c/a)_{ideal}$ and $u - u_{ideal}$, despite the presence of covalent bonds. The calculated lattice parameters of 2H-Ge agree very well with the available experimental data. However, experimental structural parameters are scarce in the literature and, in some cases, have been obtained from nanostructured and potentially strained samples.

TABLE S7

Structural and elastic properties of 2H—Ge. Structural parameters a, c, and u as wells as the isothermal bulk modulus $B_0$, its pressure derivative $B'_0$, and cohesive energy $E_{coh}$. Available experimental data are given for comparison.

| Method | a (Å) | c (Å) | c/a | u | $B_0$ (GPa) | $B'_0$ | $E_{coh}$ (eV/at.) |
|---|---|---|---|---|---|---|---|
| LDA | 3.962 | 6.539 | 1.6504 | 0.3742 | 71.9 | 5.00 | 4.61 |
| PBE | 4.058 | 6.692 | 1.6492 | 0.3744 | 59.1 | 4.74 | 3.71 |
| PBEsol | 3.996 | 6.590 | 1.6492 | 0.3744 | 67.6 | 4.81 | 4.14 |
| AM05 | 3.999 | 6.594 | 1.6490 | 0.3745 | 66.0 | 4.95 | 3.91 |
| PBEsol + U | 3.980 | 6.568 | 1.6503 | 0.3743 | 69.0 | 4.80 | 4.13 |
| Am05 + U | 3.982 | 6.568 | 1.6503 | 0.3743 | 67.4 | 4.81 | 3.89 |
| Exp | 3.96[a] | 6.57[a] | 1.659[a] |  |  |  |  |
|  | 3.9878 (20)[b] | 6.5776 (3)[b] | 1.6494[b] |  |  |  |  |

[a]Potentially strained samples from micro-indentation [79].
[b]Room-temperature x-ray diffraction of unstrained crystalline nanowires [80].

TABLE S8

Band energies of 2H—Ge computed with different XC functionals. The $\Gamma_{9v}^+$ is used as energy zero. The crystal-field and spin-orbit splitting parameters $\Delta_{cf}$, $\Delta_{so}^{\|}$, and $\Delta_{so}^{\perp}$ for the VBM have been calculated from the band energies. Band energies from an empirical-pseudopotential model (EPM) are given for comparison. All energies in eV.

| State | HSE06 | MBJLDA | EPM (Ref. [33]) |
|---|---|---|---|
| $\Gamma_{7v-}^+$ | −0.484 | −0.433 | −0.490 |
| $\Gamma_{7v+}^+$ | −0.134 | −0.120 | −0.129 |
| $\Gamma_{9v}^+$ | 0.000 | 0.000 | 0.000 |
| $\Gamma_{8c}^-$ | 0.286 | 0.298 | 0.310 |
| $\Gamma_{7c}^-$ | 0.614 | 0.632 | 0.766 |
| $U_{5c}$ | 0.615 | 0.620 |  |
| $\Delta_{cf}$ | 0.288 | 0.270 |  |
| $\Delta_{so}^{\|}$ | 0.329 | 0.282 |  |
| $\Delta_{so}^{\perp}$ | 0.320 | 0.274 |  |

Figure 23:
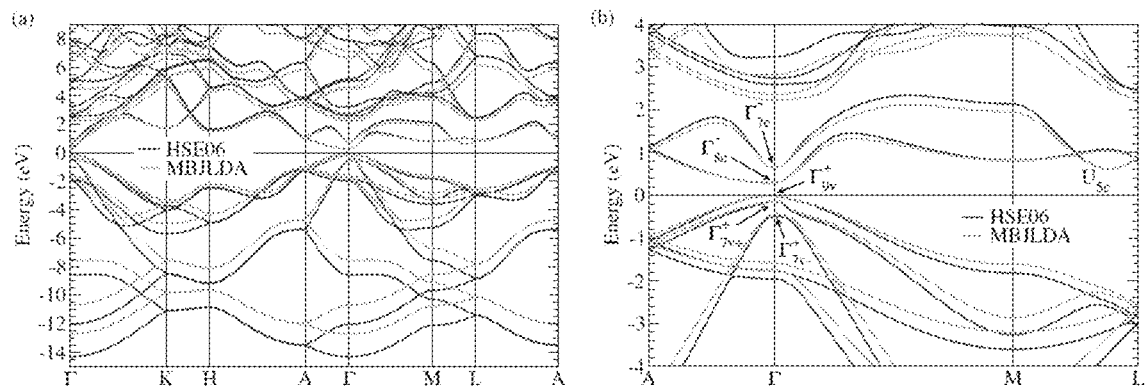
FIG. 23 depicts the band structure of 2H-Ge computed with the HSE06 and MBJLDA functionals, wherein the irreducible representations of relevant high-symmetry states in the band-gap region are given in the double-group notation, and wherein the VBM is set to zero.

The band structure of 2H-Ge including SOC has been calculated with the HSE06 and MBJLDA functionals for the PBEsol atomic structure (see FIG. 23). As for 3C-Ge, local (LDA) and semilocal (PBE, PBEsol, AM05) XC functionals yield negative band gaps. High-symmetry states in the vicinity of the band gap are labeled according to the double-group notation. Their energies are also given in Table S8. The state labels are essentially the same as for the wurtzite structure. Due to the additional inversion symmetry in the lonsdaleite crystal structure, some high-symmetry states also have a well-defined parity which is indicated by a superscript index. The parities of the highsymmetry states were calculated at time-reversal invariant momentum (TRIM) points (see FIG. 23 and Table S8) that are characterized by the relation $k_{TRIM} = -k_{TRIM} + G$. At the TRIM points, a displacement by a reciprocal lattice vector G reverses the application of time-reversal symmetry. In the lonsdaleite structure, these TRIM points are the Γ, the 3 L, and the 3 M points of the hexagonal BZ. The parities we find are partially at odds with those given by the prior art. However, the optical oscillator strengths that we obtain for the near-gap transitions (see below) corroborate the findings. Moreover, the parities are in line with the known prior art results for carbon in the lonsdaleite structure.

2H-Ge is found to be a direct-gap semiconductor with a band gap of 0.286 eV (HSE06) or 0.298 eV (MBJLDA). Note that the precise gap values are highly sensitive to lattice strain due to the huge deformation potentials of the gap-forming states. The results agree well with previously calculated gaps of 0.31 eV (empirical-pseudopotential method) or 0.32 eV (HSE06 calculation), being slightly higher than a GW gap of 0.23 eV obtained by the prior art. As for 3CGe, the HSE06 and MBJLDA energies of the near-gap states match excellently. Deviations occur for states further away from the band-gap region (see FIG. 23).

The conduction-band minima of 3C-Ge are the four $L_{6c}^+$ states. The $L_{6c}^+$ state in [111] direction is backfolded to the $\Gamma_{8c}^-$ state in 2H-Ge and becomes the conduction-band minimum of 2H-Ge. The other L points of 3C-Ge are mapped onto a point between M and L on the U line of the hexagonal BZ. In the ideal lonsdaleite structure, the backfolded L points lie at $\tfrac{2}{3}\overline{ML}$, whereas they are slightly shifted along the U line in the relaxed structure. Indeed, a minimum of the first conduction band on the U line of 2H-Ge is observed at approximately $\tfrac{2}{3}\overline{ML}$ that is almost degenerate in energy with the $L_{6c}^+$ state of 3C-Ge.

The $\Gamma_{8c}^-$ state in 2H-Ge is downshifted by 0.4 eV compared to the cubic $L_{6c}^+$ state which cannot be understood by simple folding arguments. It is, however, in agreement with the behavior of Si going from diamond to lonsdaleite structure, whereas it is in clear contrast with the small band-gap opening in biatomic semiconductors when the structure changes from zincblende to wurtzite. The cubic $\Gamma_{7c}^-$ state coincides with the $\Gamma_{7c}^-$ state of the second conduction band in the lonsdaleite structure.

Due to the presence of inversion symmetry in the lonsdaleite structure, the valence bands in 2H-Ge do not show a spin-orbit-induced splitting of the k dispersion along the $\Gamma$-M line as it occurs in wurtzite semiconductors. Following k·p theory, we can write the energy splittings at $\Gamma$ as $$\varepsilon(\Gamma_{9v}^+) - \varepsilon(\Gamma_{7v\pm}^+) = \frac{\Delta_{cf} + \Delta_{so}^\parallel}{2} \mp \frac{1}{2}\sqrt{\left(\Delta_{cf} - \tfrac{1}{3}\Delta_{so}^\parallel\right)^2 + \tfrac{8}{9}(\Delta_{so}^\perp)^2} . \quad (6)$$

These formulas allow to extract the crystal-field splitting $\Delta_{cf}$ and the spin-orbit splitting parameters parallel and perpendicular to the c axis, $\Delta_{so}^\parallel$, and $\Delta_{so}^\perp$. The band ordering $\Gamma_{9c}^+ > \Gamma_{7v}^+ > \Gamma_{7v}^-$ at the top of the valence bands which we find for 2H-Ge is in line with the ordering observed in wurtzite semiconductors (except AlN and ZnO for which the band ordering is $\Gamma_{7v}^+ > \Gamma_{9\ v}^+ > \sigma_{7v-}$). Note that the subscript indices 7v± represent bands of the same symmetry; the symbols ±merely serve to distinguish between the upper and the lower state. They are not to be confused with superscript parity indices.

The crystal-field splitting has been extracted from a calculation without SOC and used Eq. (6) to compute the spin-orbit splitting parameters from the band splittings of the calculation including SOC. The resulting values are compiled in Table S8. In particular, the direction-averaged spin-orbit splitting $\Delta_{so} = (\Delta_{so}^\parallel + 2\Delta_{so}^\perp)/3$ compares well to the spin-orbit splitting of the VBM in 3C-Ge (cf. Table S5). The crystal-field splitting in 2H-Ge is much larger than for III-V compounds that crystallize in zincblende or wurtzite structure under ambient conditions. The large crystal-field splitting for 2H-Ge is, however, in accordance with the significant deformation of the bonding tetrahedra, as indicated by the increase of c/a (see Table S7) with respect to its ideal value. The large $\Delta_{cf}$ shifts the $\Gamma_{9v}^+$ level toward higher energies and, hence, explains the observed small direct gap.

It is emphasized that the quasicubic approximation $\Delta_{so}^\parallel = \Delta so^\perp$ that was used in the prior art is not valid for 2H-Ge and leads to splitting parameters at variance with the values.

The effective masses of the band edges at $\Gamma$ are compiled in Table S9. The small electron mass with almost vanishing anisotropy for the $\Gamma_{7c}^-$ conduction band of 2H-Ge is of the order of magnitude of the $\Gamma_{7c}^-$ mass of 3C-Ge in Table S6. The mass tensor at the conduction-band minimum $\Gamma_{8c}^-$, on the other hand, is highly anisotropic with a large mass along the hexagonal c axis and a small mass in the plane perpendicular to it. These values qualitatively agree with the longitudinal and transverse masses $m_e^\parallel(L_{6c}^+)$ and $m_e^\perp(L_{6c}^+)$ at the $L_{6c}^+$ minimum of 3C-Ge. The strong direction dependence of the $\Gamma_{8c}^-$ conduction-band dispersion is consistent with the identification of the band symmetry. The hole masses also exhibit strong asymmetries, especially for the $\Gamma_{9v}^+$ and $\Gamma_{7v}^+$ bands.

TABLE S9

Effective electron and hole masses of 2H—Ge in units of the free electron mass m. The masses are given for several directions in the BZ. The VBM at G splits into a heavy hole ($m_h^{hh}$), light hole ($m_h^{lh}$), and split-off hole ($m_h^{so}$).

| Mass | Direction | HSE06 | MBJLDA |
|---|---|---|---|
| $m_h^{so}(\Gamma_{7v-}^+)$ | $\Gamma \to M$ | 0.252 | 0.325 |
|  | $\Gamma \to A$ | 0.044 | 0.053 |
| $m_h^{lh}(\Gamma_{7v+}^+)$ | $\Gamma \to M$ | 0.079 | 0.101 |
|  | $\Gamma \to A$ | 0.085 | 0.120 |
| $m_h^{hh}(\Gamma_{9v}^+)$ | $\Gamma \to M$ | 0.055 | 0.074 |
|  | $\Gamma \to A$ | 0.463 | 0.526 |
| $m_e(\Gamma_{8c}^-)$ | $\Gamma \to M$ | 0.076 | 0.089 |
|  | $\Gamma \to A$ | 0.997 | 1.088 |
| $m_e(\Gamma_{7c}^-)$ | $\Gamma \to M$ | 0.038 | 0.052 |
|  | $\Gamma \to A$ | 0.033 | 0.042 |

Figure 24:
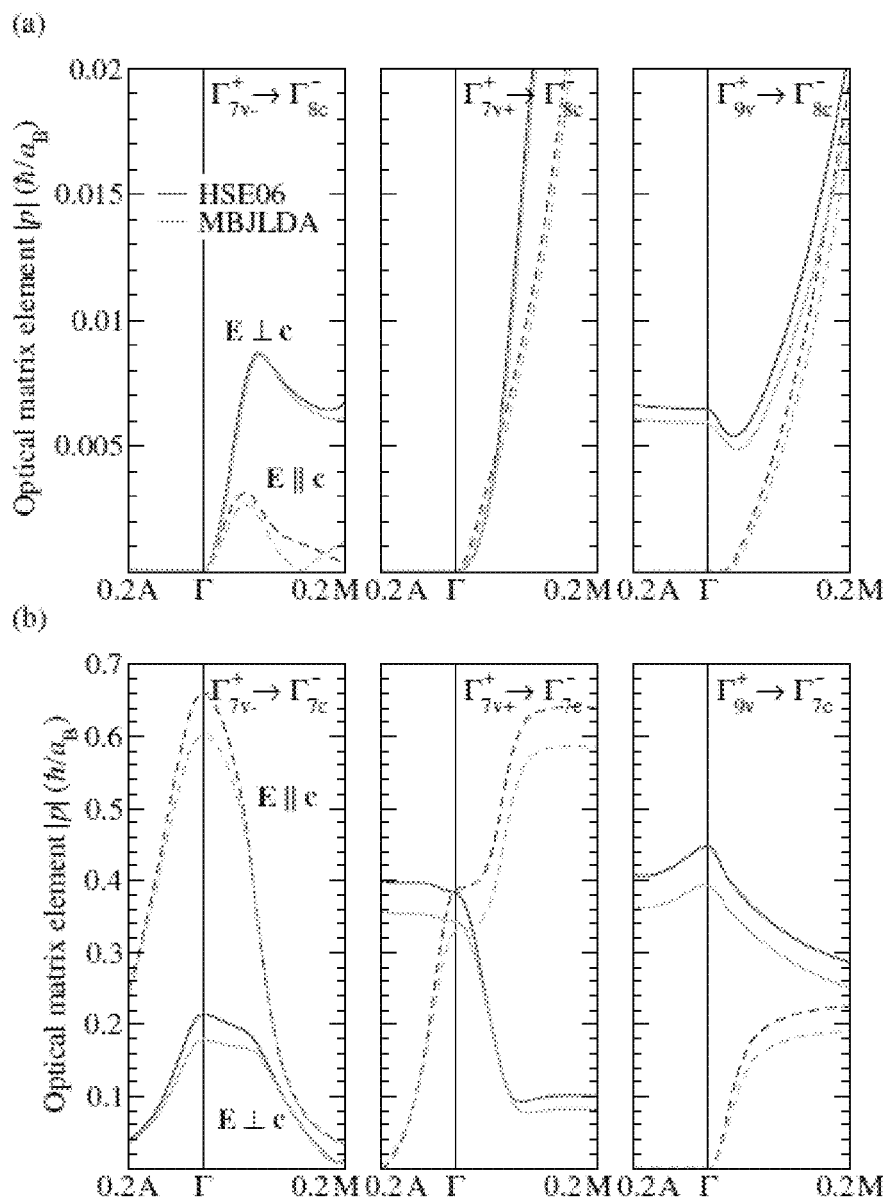
FIG. 24 depicts optical transition matrix elements |p| of the lowest band-to-band transitions in 2H-Ge along high-symmetry lines in the vicinity of Γ, wherein the matrix elements have been calculated for ordinary (E⊥c) and extraordinary (E∥c) light polarization using the HSE06 and the MBJLDA functionals, respectively.

The oscillator strengths of optical transitions between the three uppermost valence and two lowest conduction bands of 2H-Ge are given in Table S10. Transitions that are dipole forbidden due to group-theoretical arguments are indicated by horizontal lines. These symmetry considerations corroborate the identified band ordering at the $\Gamma$ point ($\Gamma_{7c}^- > \Gamma_{8c}^-$). In FIG. 24, the corresponding optical matrix elements are plotted along high-symmetry lines close to G. It is evident that transitions which are dipole forbidden at G can be dipole allowed in its immediate vicinity. As a direct consequence, a transition that is dipole forbidden at G at zero temperature may become optically active at higher temperatures when electrons and holes populate the bands also in the surroundings of G. What is more, deviations from the perfect lonsdaleite structure due to defects, nanostructuring, or surfaces/interfaces may violate the k-selection rule rendering beforehand dipole-forbidden transitions dipole allowed.

TABLE S10

Optical transitions between valence and conduction bands of 2H—Ge characterized by transition energy, optical transition matrix element, Kane energy, and oscillator strength. Transitions that are dipole forbidden by symmetry are indicated by horizontal lines. The values have been calculated with the HSE06 and MBJLDA functionals for light polarized perpendicular and parallel to the c axis.

| Transition | Method | Transition energy $\varepsilon_{ck} - \varepsilon_{vk}$ (eV) | Optical transition matrix element $p^\perp$ ($\hbar/a_B$) | $p^\parallel$ ($\hbar/a_B$) | Kane energy $E_p^\perp$ (eV) | $E_p^\parallel$ (eV) | Oscillator strength $f^\perp$ | $f^\parallel$ |
|---|---|---|---|---|---|---|---|---|
| $\Gamma_{9v}^+ \to \Gamma_{8c}^-$ | HSE06 | 0.286 | $6.48 \cdot 10^{-3}$ | — | $2.29 \cdot 10^{-3}$ | — | $8.00 \cdot 10^{-3}$ | — |
| | MBJLDA | 0.298 | $5.92 \cdot 10^{-3}$ | — | $1.91 \cdot 10^{-3}$ | — | $6.39 \cdot 10^{-3}$ | — |
| $\Gamma_{7v+}^+ \to \Gamma_{8c}^-$ | HSE06 | 0.419 | — | — | — | — | — | — |
| | MBJLDA | 0.418 | — | — | — | — | — | — |
| $\Gamma_{7v-}^+ \to \Gamma_{8c}^-$ | HSE06 | 0.770 | — | — | — | — | — | — |
| | MBJLDA | 0.730 | — | — | — | — | — | — |
| $\Gamma_{9v}^+ \to \Gamma_{7c}^-$ | HSE06 | 0.614 | 0.447 | — | 10.9 | — | 17.7 | — |
| | MBJLDA | 0.632 | 0.394 | — | 8.44 | — | 13.4 | — |
| $\Gamma_{7v+}^+ \to \Gamma_{7c}^-$ | HSE06 | 0.748 | 0.384 | 0.388 | 8.01 | 8.21 | 10.7 | 11.0 |
| | MBJLDA | 0.752 | 0.343 | 0.330 | 6.42 | 5.92 | 8.54 | 7.87 |
| $\Gamma_{7v-}^+ \to \Gamma_{7c}^-$ | HSE06 | 1.098 | 0.214 | 0.661 | 2.49 | 23.8 | 2.27 | 21.7 |
| | MBJLDA | 1.065 | 0.178 | 0.603 | 1.72 | 19.8 | 1.62 | 18.6 |

Figure 25:
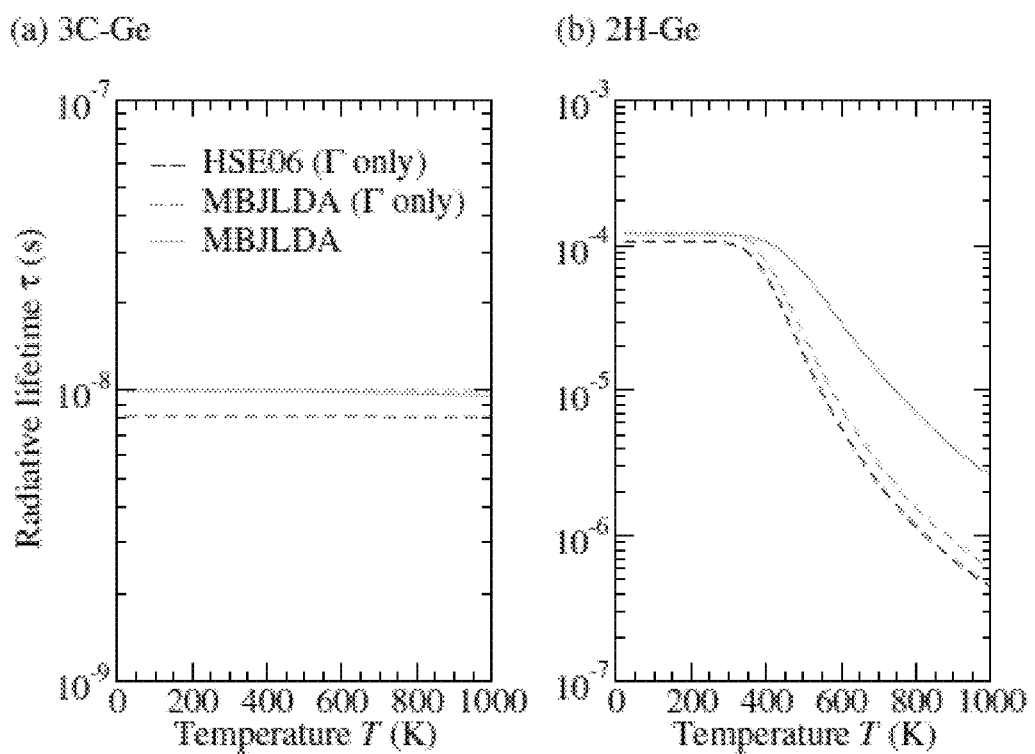
FIG. 25 shows the radiative lifetime t versus temperature for 3C-Ge and 2H-Ge calculated at the Γ point only (dashed lines) or integrating over the whole BZ (solid lines), wherein the results are given for the HSE06 and MBJLDA functionals.

Lonsdaleite Ge, being a direct semiconductor with a very weak lowest optical transition, exhibits significant variations in luminescence and absorption in comparison to cubic Ge. The effects can be expected to be stronger than for Si and SiGe alloys. For a clear illustration of the global light-emission properties, the radiative lifetime t as a function of temperature is shown in FIG. 25. The lifetimes were calculated according to Eq. (4) using transition energies and optical matrix elements obtained with the HSE06 and the MBJLDA functionals which yield comparable results. Full k-point convergence could, however, only be achieved with the computationally cheaper MBJLDA functional. When we compare the radiative lifetime of 3C-Ge and 2HGe, we find striking differences. As expected, the radiative lifetime of cubic Ge is largely temperature independent because of its larger fundamental band gap. Excluding off-Γ optical transitions in the evaluation of the lifetime does not have any significant impact. The radiative lifetime of lonsdaleite Ge, on the other hand, which is very high at low temperatures due to the extremely weak oscillator strength of the lowest Γ-Γ transition, decreases rapidly above 400 K, when the second conduction band that is optically active starts to be populated. What is more, off-G optical transitions significantly contribute to the lifetime. This is easily understood by recalling that optical matrix elements that vanish by symmetry at G can be non-zero in the immediate vicinity of the BZ center (see FIG. 24).

The large gap difference between 3C-Ge and 2H-Ge and its consequence for the temperature-dependent band populations explain the huge difference of τ by several orders of magnitude for low temperatures. (Note that for the thermalization of electrons and holes in Ge nanocrystals similar curves have been published in the prior art.) Manipulation of the atomic structure of 2H-Ge by straining or alloying, for instance, may lead to an inversion of the $\Gamma_{8c}^-$ and $\Gamma_{7c}^-$ conduction states which is likely to drastically improve the light-emission properties of lonsdaleite Ge, thus providing a vast playground for engineering its optoelectronic performance.

The lonsdaleite (2H) phase of Ge, which can be grown using hexagonal III-V nanowire templates, is considered a good candidate for Si on-chip optical interconnects and Sicompatible quantum light sources, thanks to its predicted direct band gap. Since experimental data and reliable calculations on 2H-Ge are scarce and often inconsistent, we first established the computational approach for efficient predictive ab initio calculations in this work. The performance of several XC functionals of DFT was benchmarked, including meta-GGA and hybrid functionals, to calculate the experimentally and theoretically well known structural and electronic properties of diamond-structure (3C) Ge. In a second step, these functionals were used to predict the structural, electronic, and optical properties of lonsdaleite Ge.

The atomic structure of 2H-Ge was computed with the PBEsol functional which is shown to yield excellent lattice parameters for the well studied cubic phase of Ge. The electronic structures of cubic and lonsdaleite Ge were calculated with the HSE06 hybrid functional and the MBJLDA meta-GGA, finding consistent results with both approaches, and an excellent agreement with the available experimental data. The $\Gamma_{8c}^-$ conduction-band minimum of lonsdaleite Ge results from the backfolding of the L point of diamond-structure Ge onto the Γ point of the hexagonal BZ, while the $\Gamma_{7c}^-$ conduction-band state, that is derived from the lowest conduction band at Γ of cubic Ge, is pushed towards higher energies. The energetic ordering of the three highest valence bands is $\Gamma_{9c}^+ > \Gamma_{7v}^+ > \Gamma_{7v}^-$. While the spin-orbit splittings of the hexagonal and cubic phase are similar, a huge crystal-field splitting is observed in 2H-Ge. The crystalfield splitting is responsible for the small $\Gamma_{9c}^+ \to \Gamma_{8c}^-$ band gap of only about 0.3 eV. The second conduction-band minimum $\Gamma_{7c}^-$ is higher in energy by about 0.3 eV. The calculated electron and hole effective masses of cubic Ge are in good agreement with values in literature. Consequently, reliable effective masses for electrons and holes in 2H-Ge is predicted.

The dipole-allowed and dipole-forbidden optical transitions between the uppermost valence bands and lowest conduction bands near the G point and their polarization dependence is consistent with the symmetry identification of the bands. It appears that lonsdaleite Ge is a semiconductor with a direct fundamental gap in the infrared which exhibits a non-vanishing but small optical oscillator strength only for ordinary light polarization. The optical transitions to the second lowest conduction band instead are dipole allowed with large oscillator strengths. It is noticed that the distance between the first and second conduction band, as well as the size of the band gap, appear to be sensitive to the structural parameters. Consequently, a careful investigation of the luminescence properties, including their time dependence, and the absorption edge, also considering effects of strain, are suggested to further clarify the optical and optoelectronic properties of the promising new material lonsdaleite Ge.

The invention claimed is:

1. A light-emitting component comprising a light-emitting section comprising a hexagonal crystal structure $Si_{1-x}Ge_x$ compound material, the hexagonal crystal structure $Si_{1-x}Ge_x$ compound material having a direct band gap for emitting light, wherein the hexagonal crystal structure $Si_{1-x}Ge_x$ compound material is structured to emit light with a B-coefficient for radiative emission of $0.7 \times 10^{-10}$ cm³/s$<B_{rad}<11 \times 10^{-10}$ cm³/s at 300K.

2. The light-emitting component according to claim 1, wherein the hexagonal crystal structure $Si_{1-x}Ge_x$ compound material is structured to emit light with a B-coefficient for radiative emission of $0.7 \times 10^{-10}$ cm³/s$<B_{rad}<8.3 \times 10^{-10}$ cm³/s at 300 K.

3. The light-emitting component according to claim 1, wherein the hexagonal crystal structure $Si_{1-x}Ge_x$ compound material is structured to emit light between 1.8 µm for x=0.65 and 3.5 µm for x=1.0.

4. The light-emitting component according to claim 1, wherein the hexagonal crystal structure $Si_{1-x}Ge_x$ compound material comprises strained quantum well structures of a different composition of the hexagonal $Si_{1-x}Ge_x$ compound material structured to emit light between 1.5 µm and 7.0 µm.

5. The light-emitting component according to claim 1, wherein the hexagonal crystal structure $Si_{1-x}Ge_x$ compound material exhibits direct band gap emission with a sub-nanosecond recombination lifetime.

6. The light-emitting component according to claim 1, wherein the hexagonal crystal structure $Si_{1-x}Ge_x$ compound material exhibits a linear dependence of the photoluminescence intensity versus the excitation power.

7. The light-emitting component according to claim 1, wherein x of the hexagonal crystal structure $Si_xGe_{1-x}$ compound material is defined with $0.2<x<1.0$, or with $0.6<x<1.0$, or with $0.2<x<0.99$, or with $0.2<x<0.9$, or with $0.6<x<0.9$, or with $0.6<x<0.99$.

8. The light-emitting component according to claim 1, comprising a monolithic structure including a Cub-Si substrate provided with the hexagonal crystal structure $Si_{1-x}Ge_x$ compound material as the light-emitting section.

9. A light-absorbing component comprising a light-absorbing section including a hexagonal crystal structure $Si_{1-x}Ge_x$ compound material having a direct band gap for absorbing light.

10. The light-absorbing component according to claim 9, wherein x of the hexagonal crystal structure $Si_xGe_{1-x}$ compound material is defined with $0.2<x<1.0$, or with $0.6<x<1.0$, or with $0.2<x<0.99$, or with $0.2<x<0.9$, or with $0.6<x<0.9$, or with $0.6<x<0.99$.

11. The light-absorbing component according to claim 9, comprising a monolithic structure including a Cub-Si substrate provided with the hexagonal crystal structure $Si_{1-x}Ge_x$ compound material as the light-absorbing section.

* * * * *